United States Patent
Oh et al.

(10) Patent No.: US 11,581,492 B2
(45) Date of Patent: Feb. 14, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Chanseok Oh, Seoul (KR); Seokhwan Hwang, Suwon-si (KR); Junha Park, Gwacheon-si (KR); Hankyu Pak, Suwon-si (KR); Mun-Ki Sim, Seoul (KR); Hyoyoung Lee, Suwon-si (KR); Minjung Jung, Hongcheon-gun (KR)

(73) Assignee: Samsung Display Co., Ltd., Yongin-si (KR)

( * ) Notice: Subject to any disclaimer, the term of this patent is extended or adjusted under 35 U.S.C. 154(b) by 189 days.

(21) Appl. No.: 16/998,842

(22) Filed: Aug. 20, 2020

(65) Prior Publication Data

US 2021/0143336 A1     May 13, 2021

(30) Foreign Application Priority Data

Nov. 7, 2019 (KR) ........................ 10-2019-0141766

(51) Int. Cl.
*H01L 51/00* (2006.01)
*C07F 5/02* (2006.01)
(Continued)

(52) U.S. Cl.
CPC .......... *H01L 51/0061* (2013.01); *C07F 5/027* (2013.01); *C09K 11/06* (2013.01);
(Continued)

(58) Field of Classification Search
None
See application file for complete search history.

(56) References Cited

U.S. PATENT DOCUMENTS

| 2015/0236274 A1 | 8/2015 | Hatakeyama et al. |
| 2018/0069182 A1 | 3/2018 | Hatakeyama et al. |

(Continued)

FOREIGN PATENT DOCUMENTS

| EP | 3 564 249 A1 | 11/2019 |
| JP | 2018-43984 A | 3/2018 |

(Continued)

OTHER PUBLICATIONS

Pershin, Anton et al., "Highly emissive excitons with reduced exchange energy in thermally activated delayed fluorescent molecules", *Nature Communications*, vol. 10, 2019, Article No. 597, pp. 1-5.

(Continued)

*Primary Examiner* — Clinton A Brooks
(74) *Attorney, Agent, or Firm* — Lewis Roca Rothgerber Christie LLP

(57) ABSTRACT

An organic electroluminescence device of an embodiment includes a first electrode, a second electrode, and an emission layer disposed between the first electrode and the
(Continued)

second electrode, and the emission layer includes a polycyclic compound represented by Formula 1. The organic electroluminescence device may exhibit high luminous efficiency and/or service life characteristics:

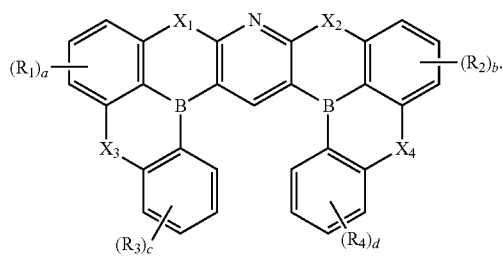

[Formula 1]

20 Claims, 2 Drawing Sheets

(51) Int. Cl.
C09K 11/06 (2006.01)
H01L 51/50 (2006.01)

(52) U.S. Cl.
CPC ............. C09K 2211/1007 (2013.01); C09K 2211/1018 (2013.01); H01L 51/0071 (2013.01); H01L 51/5016 (2013.01)

(56) References Cited

U.S. PATENT DOCUMENTS

2018/0094000 A1  4/2018  Hatakeyama et al.
2019/0058124 A1  2/2019  Hatakeyama et al.
2019/0115538 A1  4/2019  Lim et al.

FOREIGN PATENT DOCUMENTS

| JP | 2020-147563 A | 9/2020 |
| KR | 10-2016-0119683 A | 10/2016 |
| KR | 10-2017-0130435 A | 11/2017 |
| KR | 10-1955647 B1 | 3/2019 |
| KR | 10-1955648 B1 | 3/2019 |
| KR | 10-2019-0042791 A | 4/2019 |
| WO | WO 2018/212169 A1 | 11/2018 |

OTHER PUBLICATIONS

EPO Extended European Search Report for EP Application No. 20205962.2, dated Apr. 14, 2021, 6 pages.

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0141766, filed on Nov. 7, 2019, the entire content of which is hereby incorporated by reference.

BACKGROUND

1. Field

One or more aspects of embodiments of the present disclosure relate to an organic electroluminescence device and a polycyclic compound used for the same, and for example, to a polycyclic compound used as a luminous material and an organic electroluminescence device including the same.

2. Description of the Related Art

Organic electroluminescence displays are actively being developed as image display devices. Unlike liquid crystal display devices and/or the like, organic electroluminescence displays are so-called self-luminescent display devices, in which holes and electrons respectively injected from a first electrode and a second electrode recombine in an emission layer, and a luminescent material including an organic compound in the emission layer emits light to implement display.

In the application of an organic electroluminescence device to a display device, there is a demand for an organic electroluminescence device having a low driving voltage, high luminous efficiency, and/or a long life (lifespan), and there is a demand for development of materials, for an organic electroluminescence device, capable of stably attaining such characteristics.

In recent years, in order to implement a highly efficient organic electroluminescence device, materials utilizing triplet state energy phosphorescence emission, delayed fluorescence triplet-triplet annihilation (TTA) (in which singlet excitons are generated by collision of triplet excitons), and/or thermally activated delayed fluorescence (TADF) are being developed.

SUMMARY

One or more aspects of embodiments of the present disclosure are directed toward an organic electroluminescence device exhibiting excellent luminous efficiency characteristics.

One or more aspects of embodiments of the present disclosure are directed toward a polycyclic compound as a material for an organic electroluminescence device having good service life (lifespan) characteristics and/or high efficiency characteristics.

One or more example embodiments of the present disclosure provide a polycyclic compound represented by Formula 1:

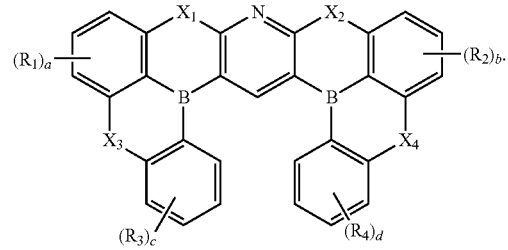

[Formula 1]

In Formula 1, $X_1$ to $X_4$ may each independently be O, S, or $NR_a$, a and b may each independently be an integer of 0 to 3, and c and d may each independently be an integer of 0 to 4. $R_1$ to $R_4$ and $R_a$ may each independently be a hydrogen atom, a deuterium atom, a halogen atom, a cyano group, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be combined with an adjacent group to form a ring.

$R_1$ to $R_4$ may each independently be a substituted or unsubstituted alkyl group having 1 to 10 carbon atoms, a substituted or unsubstituted arylamine group having 6 to 30 carbon atoms, or a substituted or unsubstituted heteroaryl group having 2 to 20 ring-forming carbon atoms.

$R_a$ may be a substituted or unsubstituted phenyl group.

a to d may each independently be 0 or 1.

Adjacent groups selected from $R_1$ to $R_4$ and $R_a$ may be bonded to each other to form a heterocycle having 2 to 10 ring-forming carbon atoms.

In some embodiments, the polycyclic compound may include a fused indole group (moiety) formed from $X_3$ and $R_3$ (which are adjacent), and/or formed from $X_4$ and $R_4$ (which are adjacent).

The polycyclic compound represented by Formula 1 may be represented by one of Formula 1-1 to Formula 1-5:

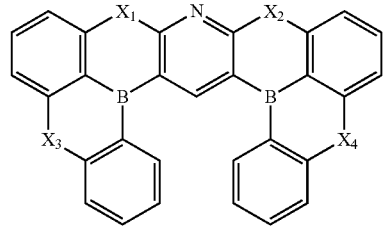

[Formula 1-1]

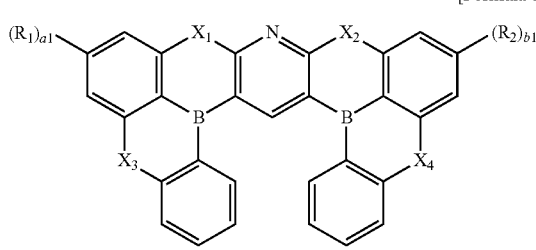

[Formula 1-2]

[Formula 1-3]

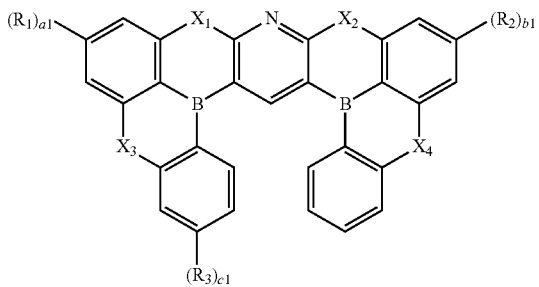

[Formula 1-4]

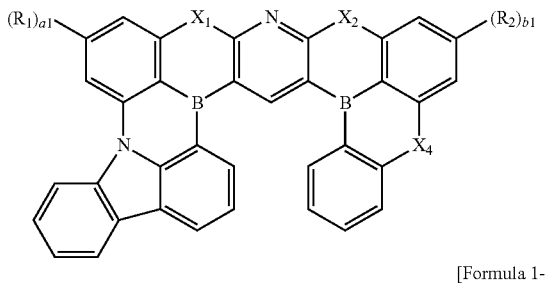

[Formula 1-5]

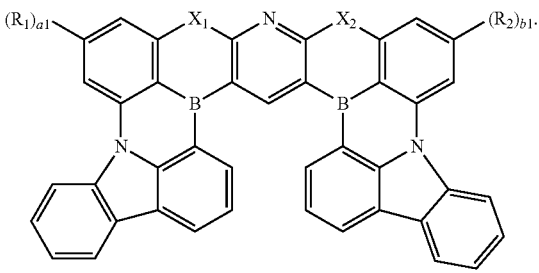

In Formula 1-2 to Formula 1-5, a1, b1, and c1 may each independently be 0 or 1, and in Formula 1-1 to Formula 1-5, $X_1$ to $X_4$, $R_1$, $R_2$, and $R_3$ may each independently be the same as defined in connection with Formula 1.

The polycyclic compound represented by Formula 1 may be a blue dopant.

The polycyclic compound represented by Formula 1 may be a thermally activated delayed fluorescence emission material.

One or more example embodiments of the present disclosure provide an organic electroluminescence device comprising: a first electrode; a second electrode on the first electrode; and an emission layer between the first electrode and the second electrode and including the polycyclic compound of an embodiment.

The first electrode and the second electrode may each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, or an oxide thereof.

The emission layer may include a host and a dopant, and the dopant may include the polycyclic compound.

The emission layer may be to emit delayed fluorescence.

The emission layer may be to emit light having a center wavelength of 420 nm to 470 nm.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain principles of the present disclosure. In the drawings.

DETAILED DESCRIPTION

Figure 1:
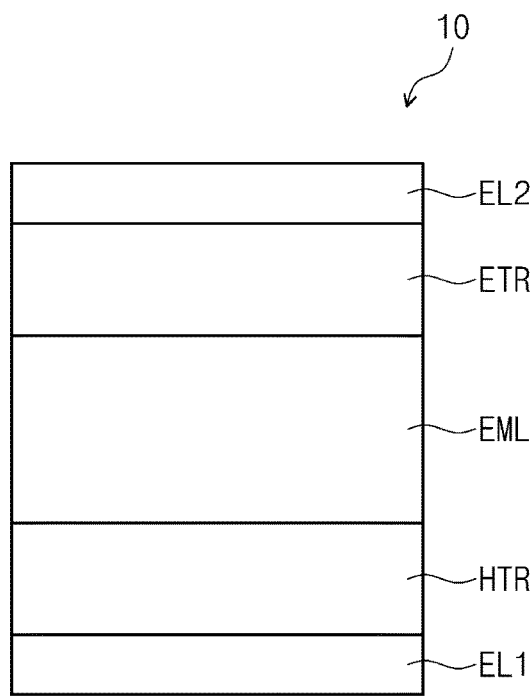
FIG. 1 is a schematic cross-sectional view illustrating an organic electroluminescence device according to an embodiment of the present disclosure.

The present disclosure may have various modifications and may be embodied in different forms, and example embodiments will be explained in more detail with reference to the accompanying drawings. The present disclosure may, however, be embodied in different forms and should not be construed as being limited to the embodiments set forth herein. Rather, all modifications, equivalents, and substituents which are included in the spirit and technical scope of the present disclosure should be included in the present disclosure.

It will be understood that when an element or layer is referred to as being "on," "connected to," or "coupled to" another element or layer, it can be directly on, connected or coupled to the other element or layer or intervening elements or layers may be present.

Like numbers refer to like elements throughout, and duplicative descriptions thereof may not be provided. Also, in the drawings, thicknesses, ratios, and dimensions of elements may be exaggerated for an effective description of technical contents.

As used herein, expressions such as "at least one of," "one of," and "selected from," when preceding a list of elements, modify the entire list of elements and do not modify the individual elements of the list. The term "and/or" includes any and all combinations of one or more of the associated listed items. Further, the use of "may" when describing embodiments of the present disclosure refers to "one or more embodiments of the present disclosure".

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and/or the like are used to describe the relationship of the configurations shown in the drawings. The terms are used as relative concepts, and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, unless expressly defined herein, and should not be interpreted in an ideal or overly formal sense.

It should be understood that the terms "includes," "including," "comprises," "comprising," and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are each a schematic cross-sectional view illustrating an organic electroluminescence device according to an embodiment of the present disclosure. Referring to FIGS. 1 to 4, in an organic electroluminescence device 10 according to an embodiment of the present disclosure, a first electrode EL1 and a second electrode EL2 are disposed facing each other, and an emission layer EML may be disposed between the first electrode EL1 and the second electrode EL2.

In some embodiments, the organic electroluminescence device 10 of an embodiment may further include a plurality of functional layers between the first electrode EL1 and the second electrode EL2 in addition to the emission layer EML. The plurality of functional layers may include a hole transport region HTR, and/or an electron transport region ETR. For example, the organic electroluminescence device 10 according to an embodiment may include the first electrode EL1, the hole transport region HTR, the emission layer EML, the electron transport region ETR, and the second electrode EL2 sequentially stacked. In some embodiments, the organic electroluminescence device 10 of an embodiment may include a capping layer CPL disposed on the second electrode EL2.

The organic electroluminescence device 10 of an embodiment may include a polycyclic compound according to an embodiment (described below) in the emission layer EML disposed between the first electrode EL1 and the second electrode EL2. However, embodiments are not limited thereto, and the organic electroluminescence device 10 of an embodiment may include the compound not only in the emission layer EML, but also in the hole transport region HTR and/or electron transport region ETR, which are among the plurality of functional layers disposed between the first electrode EL1 and the second electrode EL2.

Figure 2:
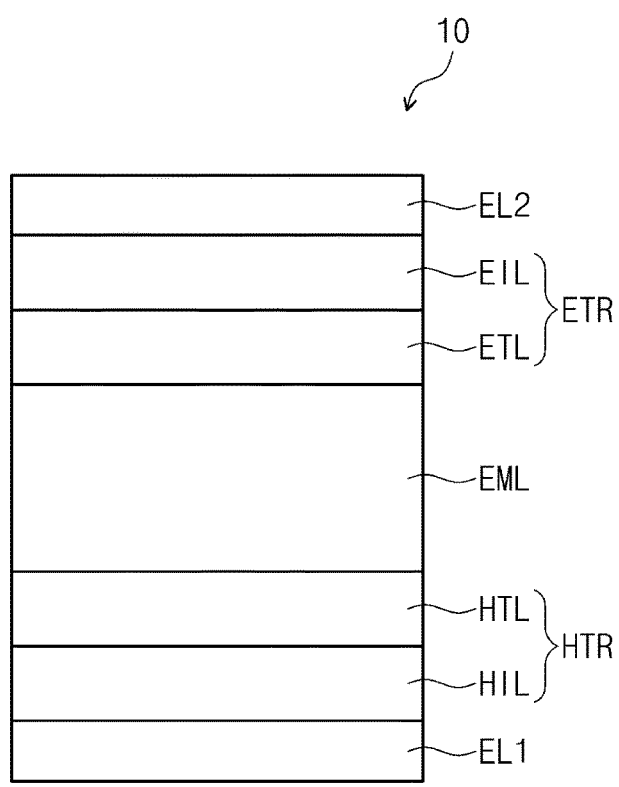
FIG. 2 is a schematic cross-sectional view illustrating an organic electroluminescence device according to an embodiment of the present disclosure.
Figure 3:
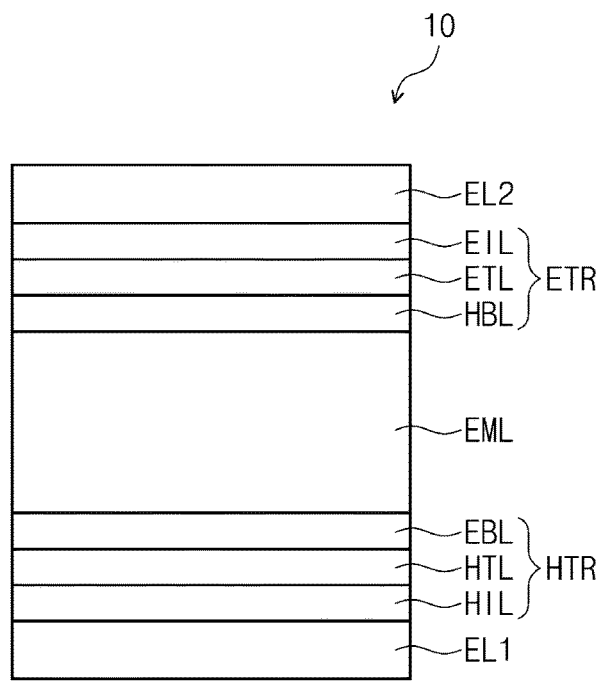
FIG. 3 is a schematic cross-sectional view illustrating an organic electroluminescence device according to an embodiment of the present disclosure.
Figure 4:
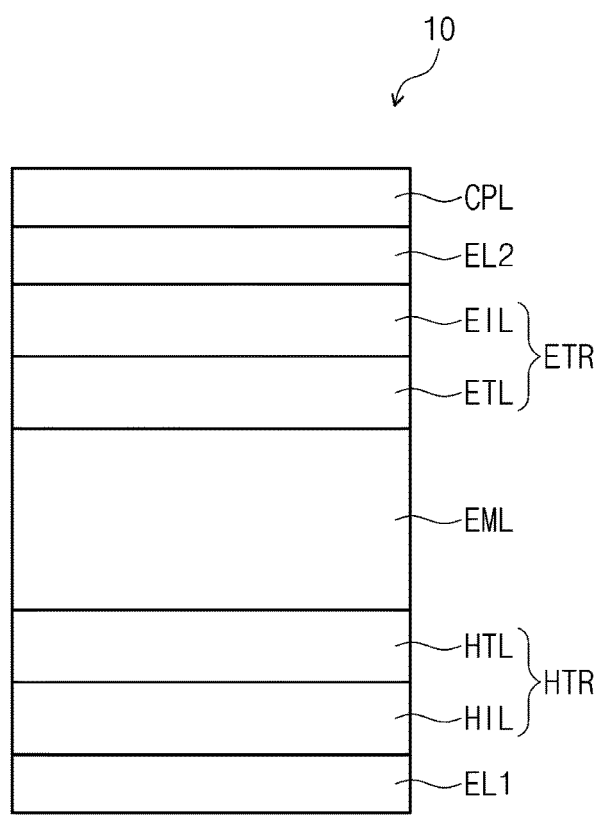
FIG. 4 is a schematic cross-sectional view illustrating an organic electroluminescence device according to an embodiment of the present disclosure.

Compared to FIG. 1, FIG. 2 illustrates a cross-sectional view of an organic electroluminescence device 10 of an embodiment, in which the hole transport region HTR includes a hole injection layer HIL and a hole transport layer HTL, and the electron transport region ETR includes an electron injection layer EIL and an electron transport layer ETL. Compared to FIG. 1, FIG. 3 illustrates a cross-sectional view of an organic electroluminescence device 10 of an embodiment, in which the hole transport region HTR includes the hole injection layer HIL, the hole transport layer HTL, and an electron blocking layer EBL, and the electron transport region ETR includes the electron injection layer EIL, the electron transport layer ETL, and a hole blocking layer HBL. Compared to FIG. 2, FIG. 4 illustrates a cross-sectional view of an organic electroluminescence device 10 of an embodiment including a capping layer CPL disposed on the second electrode EL2.

The first electrode EL1 may have conductivity (e.g., be conductive). The first electrode EL1 may be formed of a metal alloy and/or a conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include or be formed of a transparent metal oxide, (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or any mixture thereof (e.g., a mixture of Ag and Mg). In some embodiments, the first electrode EL1 may have a multilayer structure including a reflective layer or transflective layer and a transparent conductive layer formed of ITO, IZO, ZnO, ITZO, etc. For example, the first electrode EL1 may have a three-layer structure of ITO/Ag/ITO, but embodiments of the present disclosure are not limited thereto. The thickness of the first electrode EU may be about 1,000 Å to about 10,000 Å, for example, about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer EBL. The thickness of the hole transport region HTR may be, for example, about 50 Å to about 15,000 Å.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material and/or a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments are not limited thereto.

The hole transport region HTR may be formed using any suitable method (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-tris(3-methylphenyl phenylamino)triphenylamine (m-MTDATA), 4,4',4"-tris(N,N-diphenylamino)triphenylamine (TDATA), 4,4',4"-tris[N,-(2-naphthyl)-N-phenylamino]-triphenylamine] (2-TNATA), poly(3,4-ethylene dioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), N,N'-di(naphthalen-1-yl)-N,N'-diphenyl-[1,1'-biphenyl]-4,4'-diamine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include, for example, carbazole derivatives (such as N-phenyl carbazole and/or polyvinyl carbazole), fluorene derivatives, N,N'-bis(3-methylphenyl)-N,N'-diphenyl-[1,1'-biphenyl]-4,4'-diamine (TPD), triphenylamine derivatives (such as 4,4',4''-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-Bis(N-carbazolyl)benzene (mCP), 9-(4-tert-Butylphenyl)-3,6-bis(triphenylsilyl)-9H-carbazole (CzSi), etc.

The thickness of the hole transport region HTR may be about 50 Å to about 15,000 Å, for example, about 100 Å to about 5,000 Å. The thickness of the hole injection layer HIL may be, for example, about 30 Å to about 1,000 Å, and the thickness of the hole transport layer HTL may be about 30 Å to about 1,000 Å. For example, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include, in addition to the above-described materials, a charge generating material to increase conductivity. The charge generating material may be dispersed substantially uniformly or non-uniformly in the hole transport region HTR. The charge generating material may be, for example, a p-dopant. The p-dopant may be or include a quinone derivative, a metal oxide, and/or a cyano group-containing compound, but is not limited thereto.

Non-limiting examples of the p-dopant include, but are not limited to, quinone derivatives (such as tetracyanoquinodimethane (TCNQ) and/or 2,3,5,6-tetrafluoro-tetracyanoquinodimethane (F4-TCNQ)), and metal oxides (such as tungsten oxides and/or molybdenum oxides).

As described above, the hole transport region HTR may further include at least one of a hole buffer layer or an electron blocking layer EBL in addition to the hole injection layer HIL and the hole transport layer HTL. The hole buffer layer, may compensate for a wavelength resonance distance of the light emitted from an emission layer EML, and may increase luminous efficiency. Materials included in the hole transport layer HTL may also be included in the hole buffer layer. The electron blocking layer EBL may prevent or reduce electrons from being injected from the electron transport region ETR to the hole transport region HTR.

The emission layer EML is disposed on the hole transport region HTR. The thickness of the emission layer EML may be, for example, about 100 Å to about 1000 Å or about 100 Å to about 300 Å. The emission layer EML may include (e.g., consisting of) a single layer formed of a single material, a single layer formed of a plurality of different materials, or a multilayer structure including a plurality of layers formed of a plurality of different materials.

The emission layer EML in the organic electroluminescence device 10 of an embodiment may include the polycyclic compound of an embodiment.

In the description, the term "substituted or unsubstituted" may refer to a state of being unsubstituted, or being substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. Each of the substituents may be further substituted or unsubstituted. For example, a biphenyl group may be interpreted as a named aryl group, or as a phenyl group substituted with a phenyl group.

In the description, the term "bonded to an adjacent group to form a ring" may refer to a state of being bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle and an aromatic heterocycle. The rings formed by being bonded to an adjacent group may each independently be monocyclic or polycyclic. In addition, the rings formed by being bonded to each other may be further connected to another ring to form a spiro structure.

In the description, the term "an adjacent group" may refer to a substituent on the same atom or point, a substituent on an atom that is directly connected to the base atom or point, or a substituent sterically positioned (e.g., within intramolecular bonding distance) to the corresponding substituent. For example, two methyl groups in 1,2-dimethylbenzene may be interpreted as mutually "adjacent groups", and two ethyl groups in 1,1-diethylcyclopentane may be interpreted as mutually "adjacent groups".

In the description, non-limiting examples of the halogen atom include a fluorine atom, a chlorine atom, a bromine atom, and an iodine atom.

In the description, the term "alkyl group" may refer to a linear, branched or cyclic alkyl group. The number of carbon atoms in the alkyl group may be 1 to 50, 1 to 30, 1 to 20, 1 to 10, or 1 to 6. Non-limiting examples of the alkyl group include a methyl group, ethyl group, n-propyl group, iso-propyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-heneicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the term "hydrocarbon ring" may refer to an aliphatic hydrocarbon ring or an aromatic hydrocarbon ring having 5 to 60, 5 to 30, or 5 to 20 ring-forming carbon atoms. The hydrocarbon ring group may be any functional group or substituent derived from an aliphatic hydrocarbon ring, or any functional group or substituent derived from an aromatic hydrocarbon ring. The number of ring-forming carbon atoms in the hydrocarbon ring group may be 5 to 60, 5 to 30, or 5 to 20.

In the description, the term "aryl group" may refer to any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Non-limiting examples of the aryl group include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc.

In the description, the term "heteroaryl group" may refer to any functional group or substituent derived from a ring containing at least one of boron (B), oxygen (O), nitrogen (N), phosphorus (P), silicon (Si), or sulfur (S) as a heteroatom. The heterocyclic group may be an aliphatic heterocyclic group or an aromatic heterocyclic group. The aromatic heterocyclic group may be a heteroaryl group. The aliphatic heterocycle and the aromatic heterocycle may each independently be monocyclic or polycyclic.

In the description, the heterocyclic group may include at least one of B, O, N, P, Si or S as a heteroatom. When the heterocyclic group contains two or more heteroatoms, the two or more heteroatoms may be the same as or different from each other. The heterocycle may be a monocyclic heterocycle or a polycyclic heterocycle, and in some embodiments may be a heteroaryl. The number of ring-forming carbon atoms in in the heterocyclic group may be 2 to 30, 2 to 20, or 2 to 10.

In the description, the aliphatic heterocyclic group may include at least one of B, O, N, P, Si, or S as a hetero atom. The number of ring-forming carbon atoms in the aliphatic heterocyclic group may be 2 to 30, 2 to 20, or 2 to 10. Non-limiting examples of the aliphatic heterocyclic group include an oxirane group, a thiirane group, a pyrrolidine group, a piperidine group, a tetrahydrofuran group, a tetrahydrothiophene group, a thiane group, a tetrahydropyran group, a 1,4-dioxane group, etc.

In the description, the heteroaryl group may include at least one of B, O, N, P, Si, or S as a heteroatom. When the heteroaryl group contains two or more hetero atoms, the two or more hetero atoms may be the same as or different from each other.

The heteroaryl group may be a monocyclic heterocyclic group or a polycyclic heterocyclic group. The number of ring-forming carbon atoms in the heteroaryl group may be 2 to 30, 2 to 20, or 2 to 10. Non-limiting examples of the heteroaryl group include thiophenyl, furanyl, pyrrolyl, imidazolyl, thiazolyl, oxazolyl, oxadiazolyl, triazolyl, pyridinyl, bipyridinyl, pyrimidinyl, triazinyl, acridyl, pyridazinyl, pyrazinyl, quinolinyl, quinazolinyl, quinoxalinyl, phenoxazinyl, phthalazinyl, pyrido pyrimidinyl, pyrido pyrazinyl, pyrazino pyrazinyl, isoquinolinyl, indolyl, carbazolyl, N-arylcarbazolyl, N-heteroarylcarbazolyl, N-alkylcarbazolyl, benzoxazolyl, benzim idazolyl, benzothiazolyl, benzocarbazolyl, benzothiophenyl, dibenzothiophenyl, thienothiophenyl, benzofuranyl, phenanthrolinyl, isoxazolyl, thiadiazolyl, phenothiazinyl, dibenzosilolyl, dibenzofuranyl, etc.

In the description, the number of carbon atoms in the amine group is not particularly limited, but may be 1 to 30. The amine group may be an alkyl amine group or an aryl amine group. Non-limiting examples of the amine group include a methylamine group, dimethylamine group, phenylamine group, diphenylamine group, naphthylamine group, 9-methyl-anthracenylamine group, triphenylamine group, etc. For example, the alkyl group in the alkyl amine group may be the same as the examples of the alkyl group described above, and the aryl group in the aryl amine group may be the same as the examples of the aryl group described above.

In the description, "-*" refers to a point of connection (e.g., a bond).

The emission layer EML in the organic electroluminescence device 10 of an embodiment may include the polycyclic compound represented by Formula 1:

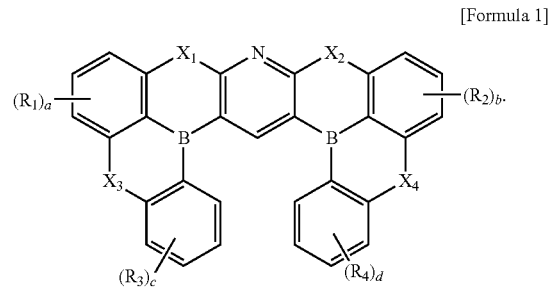

[Formula 1]

In Formula 1, $X_1$ to $X_4$ may each independently be O, S, or $NR_a$. In the polycyclic compound of an embodiment, $X_1$ to $X_4$ may each independently be all the same, or at least one thereof may be different from the others.

In Formula 1, $R_1$ to $R_4$ and $R_a$ may each independently be a hydrogen atom, a deuterium atom, a halogen atom, a cyano group, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring.

In Formula 1, a and b may each independently be an integer of 0 to 3, and c and d may each independently be an integer of 0 to 4. In Formula 1, when a to d are each independently an integer of 2 or more, a plurality of $R_1$'s to $R_4$'s may be the same as each other, or at least one thereof may be different from the others.

The polycyclic compound of an embodiment represented by Formula 1 may have a planar structure containing a pyridine group or ring. For example, the polycyclic compound of an embodiment includes a plurality of hexagonal rings bonded to each other, and may have a fused ring structure in which the rings on both (e.g., opposite) sides of a central pyridine ring are connected to each other (e.g., form a fused structure, in which each ring shares at least one side (two atoms) with a neighboring ring).

Further, the polycyclic compound of an embodiment may include a boron (B) atom in each of the rings adjacent to the pyridine ring. The polycyclic compound includes an nitrogen (N) atom as a ring-forming atom of the pyridine ring, B as a ring-forming atom of the rings connected to the each side of the pyridine ring, and each of $X_1$ to $X_4$ atoms as ring-forming atoms, and thus multiple resonance structures in one polycyclic compound molecule may be activated. Accordingly, when the polycyclic compound of an embodiment is used as an emission layer material of the organic electroluminescence device, the polycyclic compound may contribute to good service life (life span) characteristics and/or the increase of efficiency of the device.

In the polycyclic compound of an embodiment, $R_1$ to $R_4$ may each independently be a substituted or unsubstituted alkyl group having 1 to 10 carbon atoms, a substituted or unsubstituted arylamine group, or a substituted or unsubstituted heteroaryl group having 2 to 20 carbon atoms. For example, $R_1$ to $R_4$ may each independently be a t-butyl group, a diphenylamine group, or a substituted or unsubstituted carbazole group. However, embodiments are not limited thereto.

In the polycyclic compound of an embodiment represented by Formula 1, a to d may each independently be 0 or 1. When a to d is 0, the polycyclic compound of an embodiment may be unsubstituted. In addition, in an embodiment, at least one among a to d may be 1, and the rest may be 0.

In Formula 1, adjacent groups selected from among $R_1$ to $R_4$ and $R_a$ are bonded to each other to form a heterocycle having 2 to 10 ring-forming carbon atoms. For example, adjacent groups selected from $R_1$ to $R_4$ and $R_a$ are bonded to each other to form a ring, and are fused to rings represented by Formula 1 to form a fused ring.

In the polycyclic compound of an embodiment represented by Formula 1, $X_3$ and $R_3$ (which are adjacent) may be bonded to each other to form a ring. In the polycyclic compound of an embodiment, $X_4$ and $R_4$ (which are adjacent) may be bonded to each other to form a ring. In some embodiments, the polycyclic compound of an embodiment may include both of a ring formed by $X_3$ and $R_3$, and a ring formed by $X_4$ and $R_4$. Each ring may be or include an indole group. The ring that $X_3$ and $R_3$ are bonded to form, or the ring that $X_4$ and $R_4$ are bonded to form may be fused to the other rings represented by Formula 1.

In the polycyclic compound represented by Formula 1, when at least one among $X_1$ to $X_4$ is represented by $NR_a$, $R_a$ may be a substituted or unsubstituted phenyl group.

In an embodiment, Formula 1 may be represented by one of Formula 1-1 to Formula 1-5:

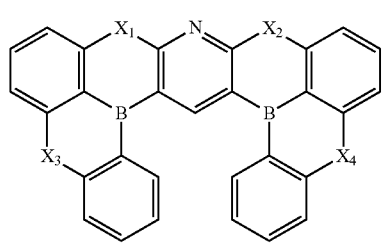

[Formula 1-1]

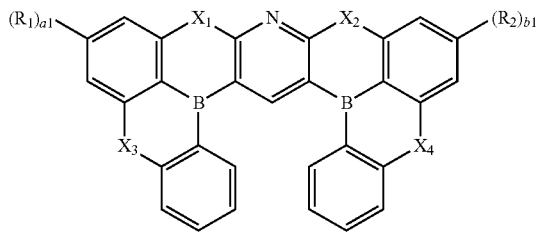

[Formula 1-2]

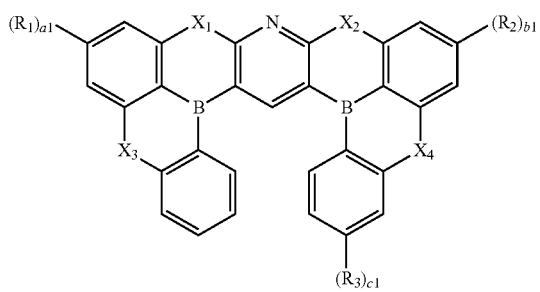

[Formula 1-3]

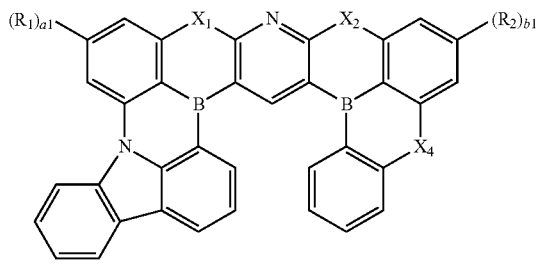

[Formula 1-4]

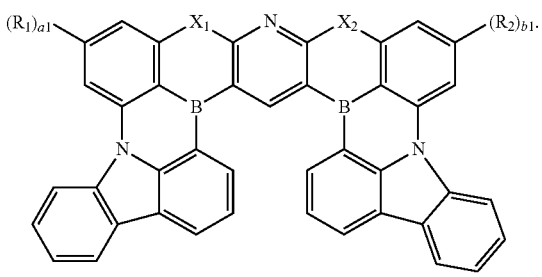

[Formula 1-5]

In Formula 1-2 to Formula 1-5, a1, b1, and c1 may each independently be 0 or 1. In addition, in Formula 1-1 to Formula 1-5, $X_1$ to $X_4$, $R_1$, and $R_2$ may each independently be the same as described in connection with Formula 1.

In Formula 1-2 to Formula 1-5, when a1, b1, or c1 is 1, $R_1$ to $R_3$ may each independently be represented by one among S-1 to S-3. However, embodiments are not limited thereto:

S-1

S-2
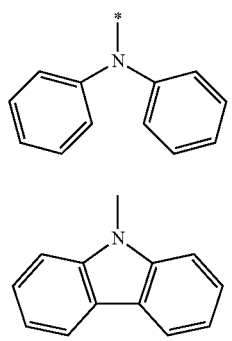
S-3
The polycyclic compound of an embodiment may be at least one among the compounds represented by Compound Group 1. The electroluminescence device 10 of an embodiment may include at least one polycyclic compound among the compounds represented by Compound Group 1 in the emission layer EML.
[Compound Group 1]
1
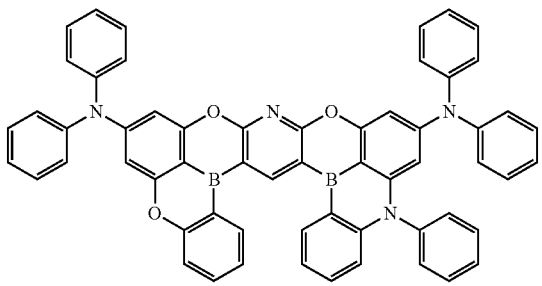
2
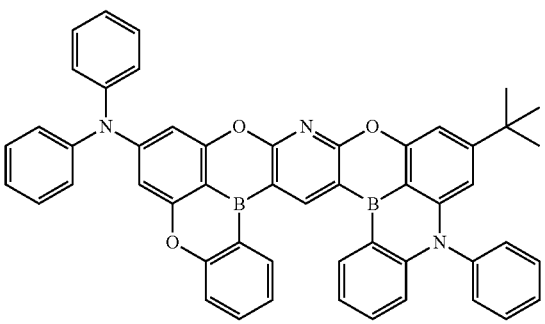
3
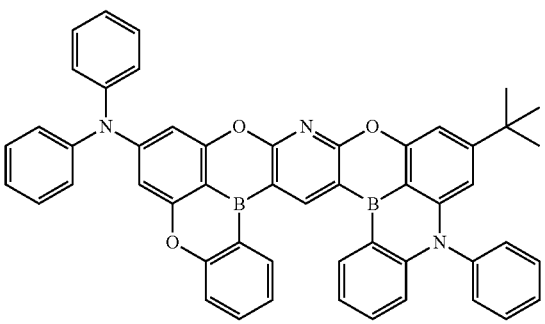
4
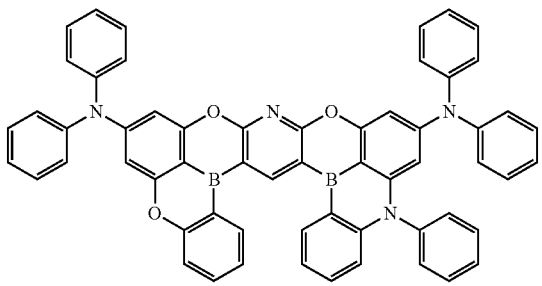
5
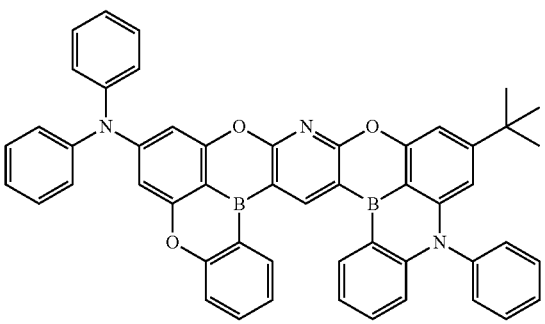
6
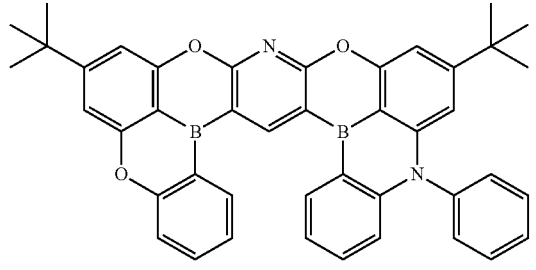
7
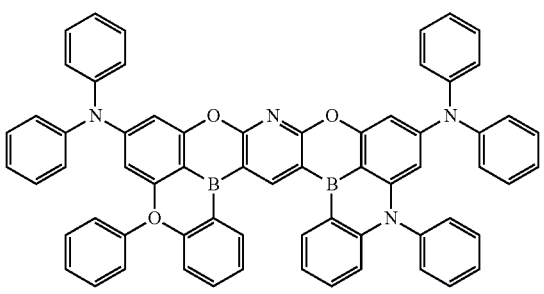
8
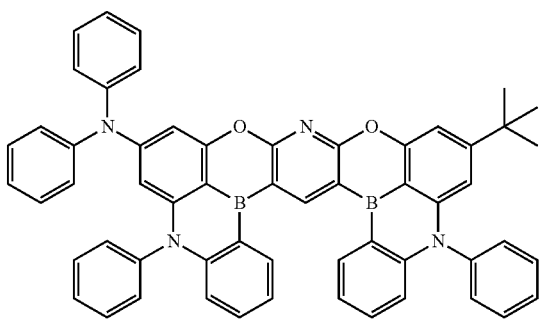

9
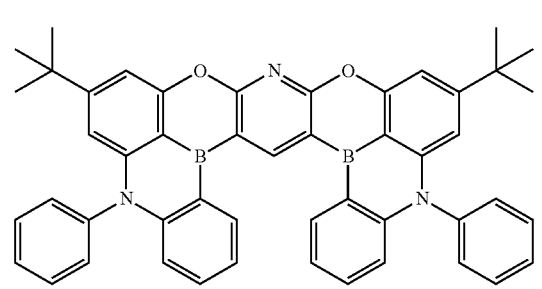
10
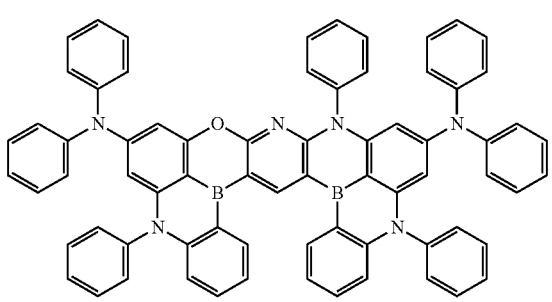
11
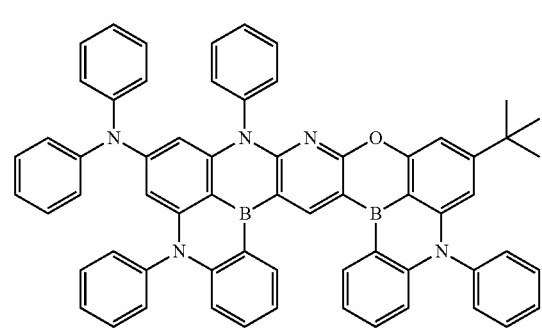
12
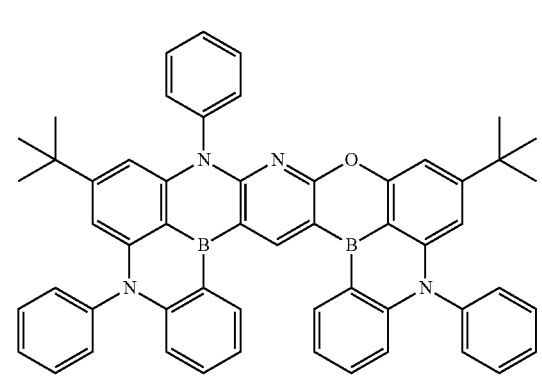
13
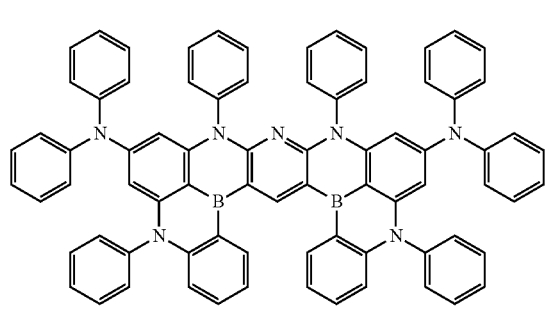
14
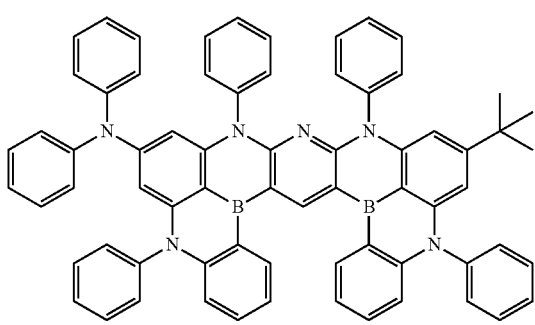
15
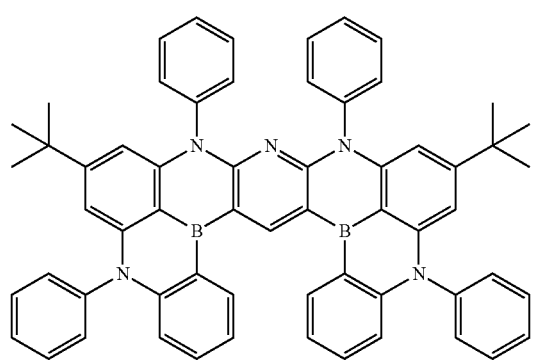
16
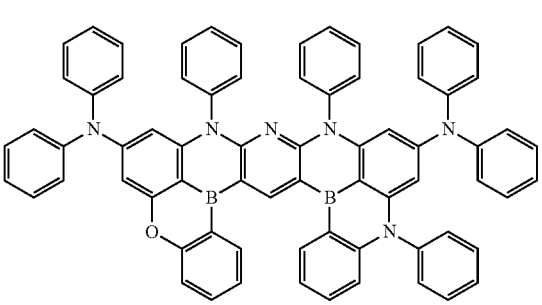
17
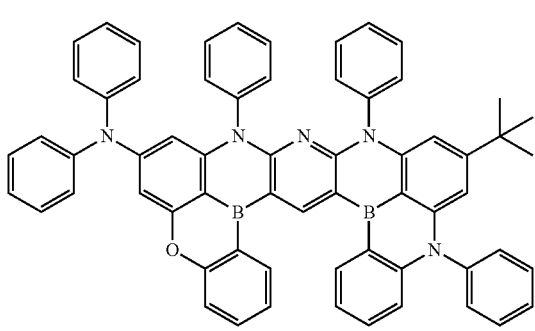

18
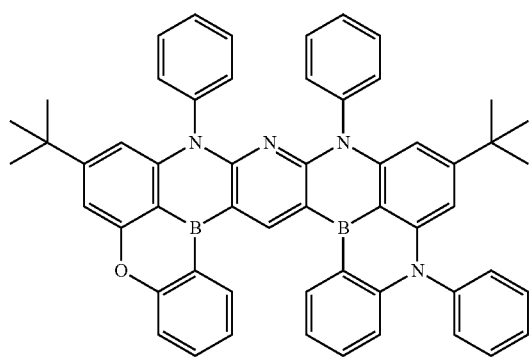
19
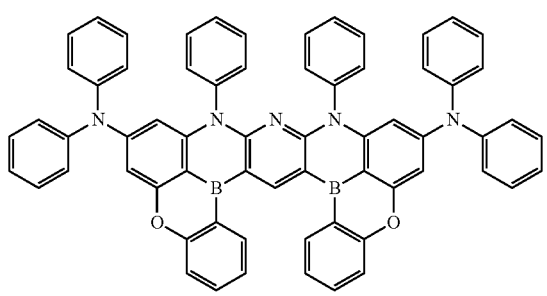
20
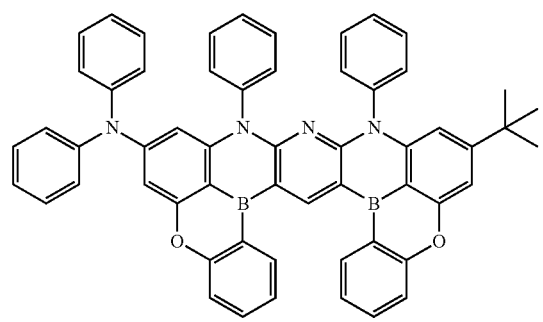
21
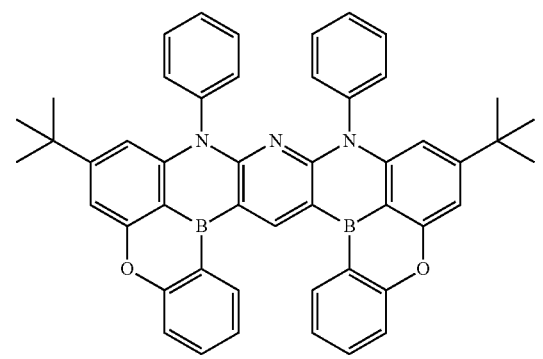
22
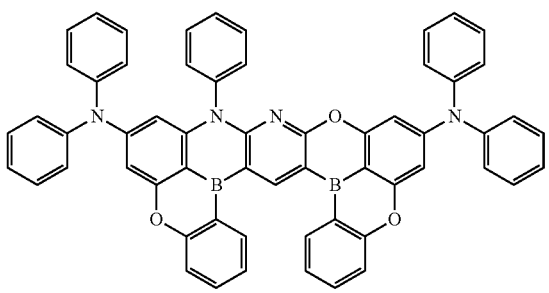
23
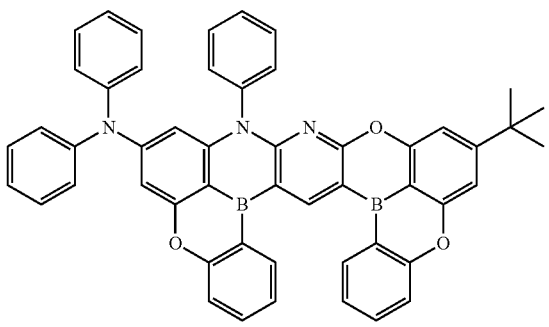
24
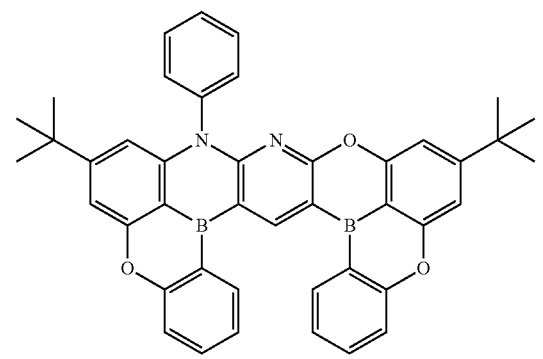
25
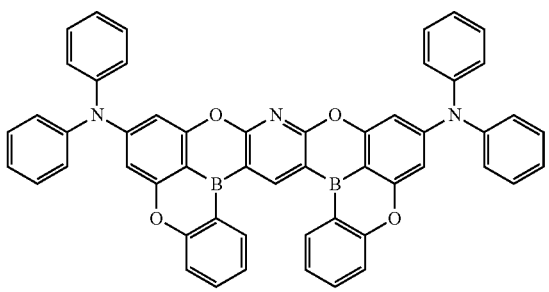

-continued
26
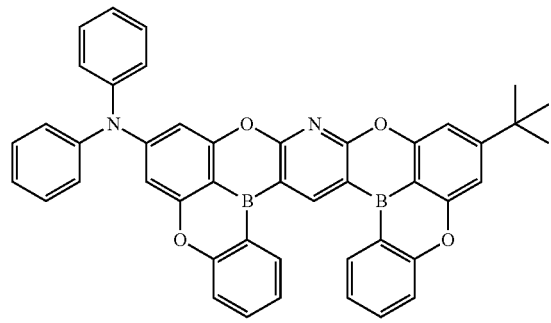
27
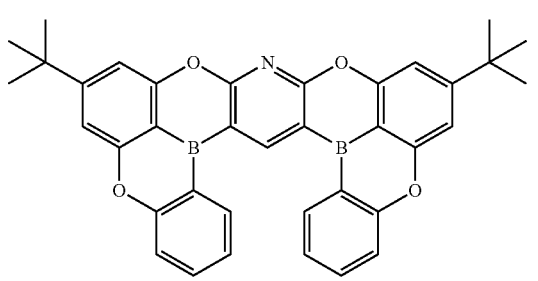
28
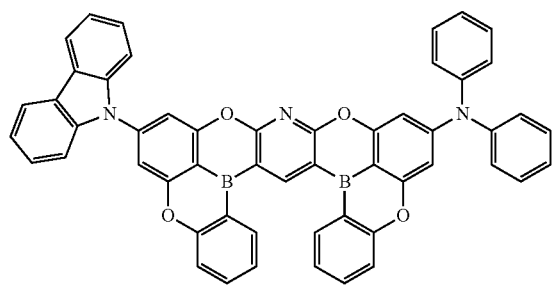
29
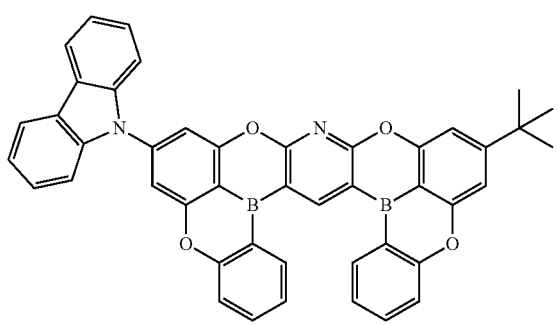
30
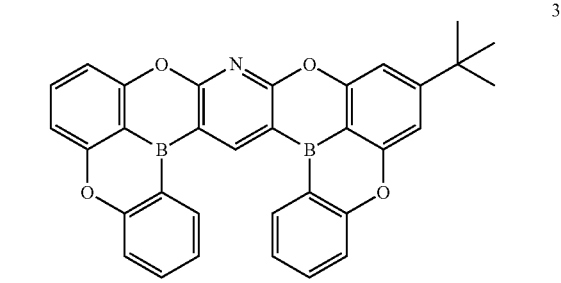
-continued
31
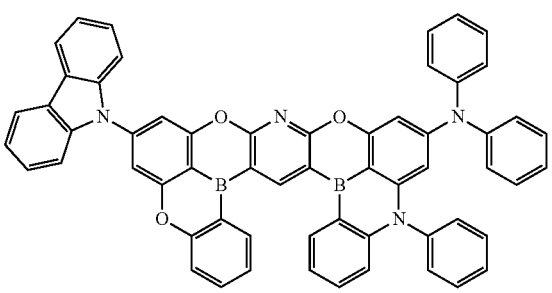
32
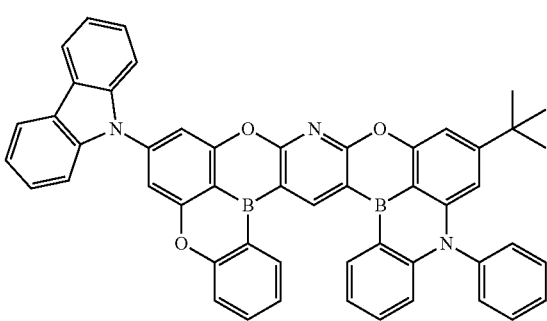
33
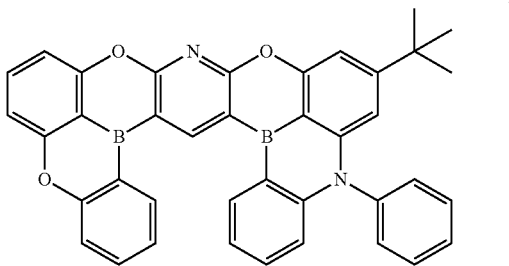
34
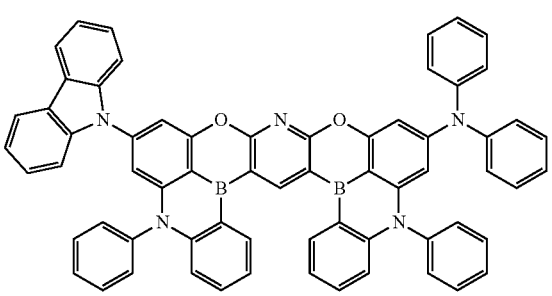
35
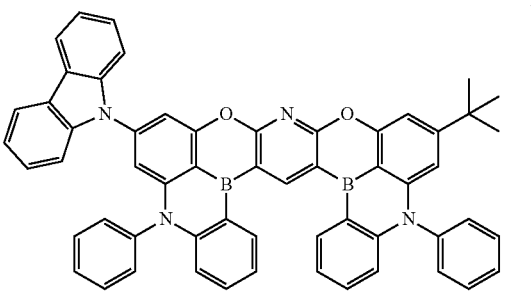

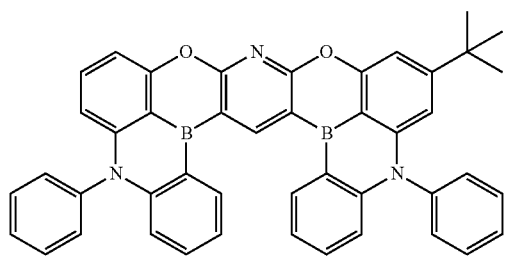
36
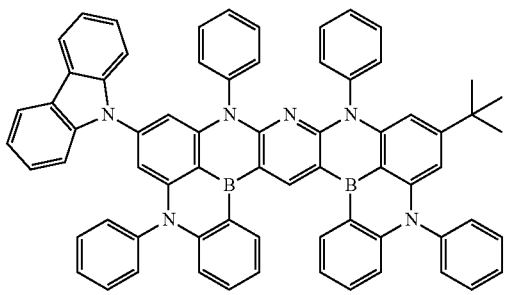
41
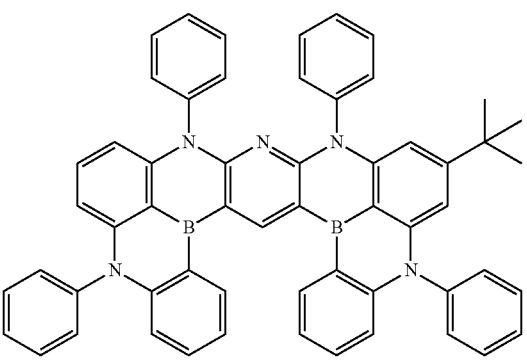
42
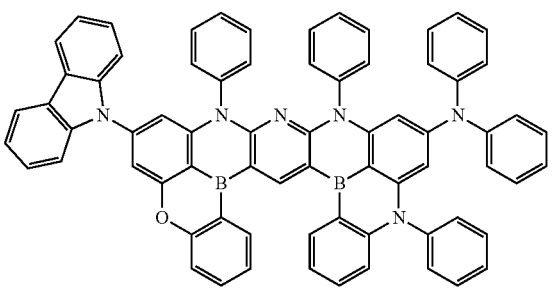
43
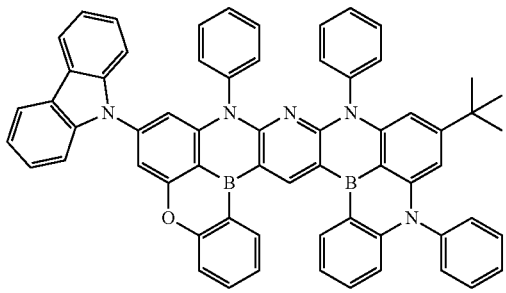
44
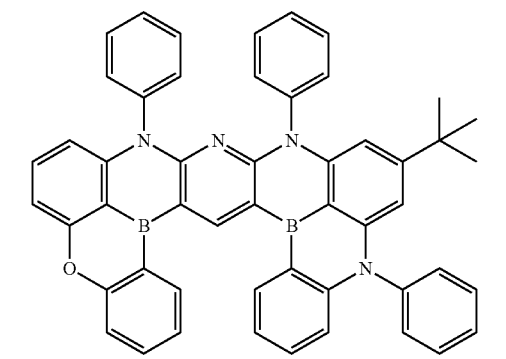
45

46
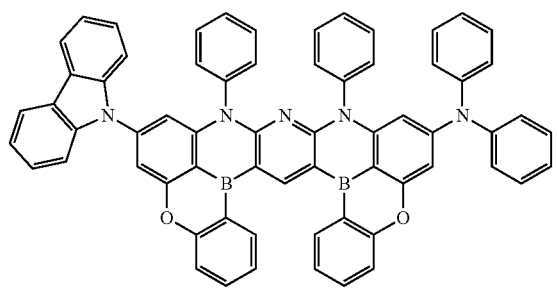
47
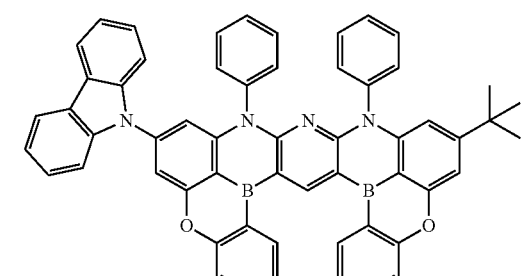
48
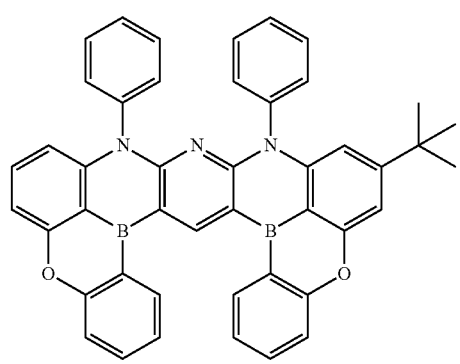
49
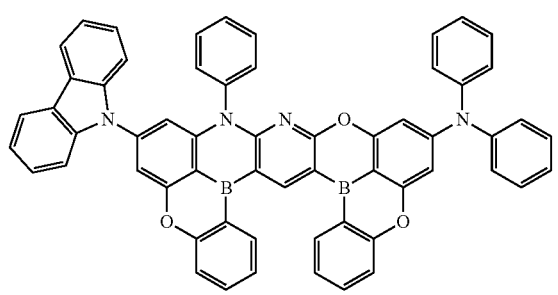
50
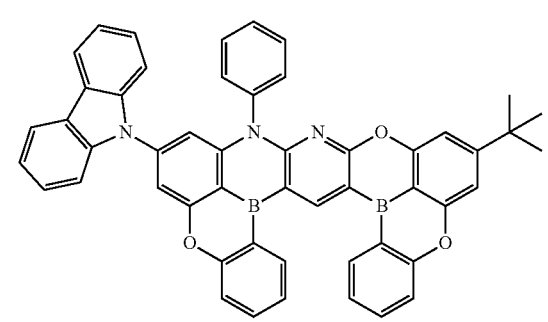
51
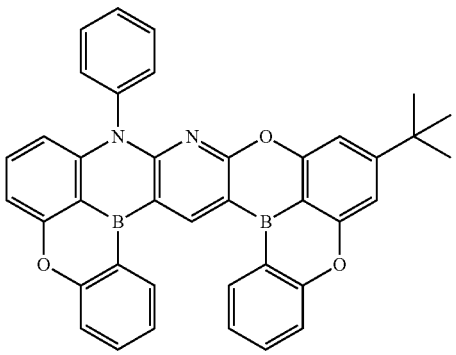
52
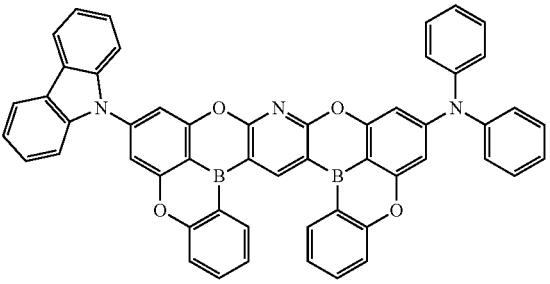
53
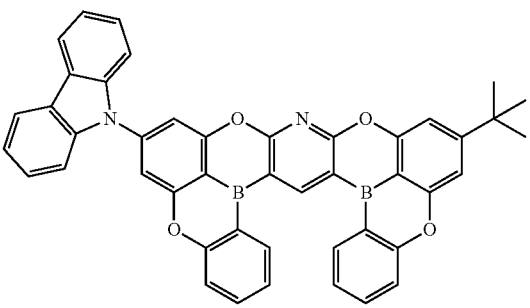
54
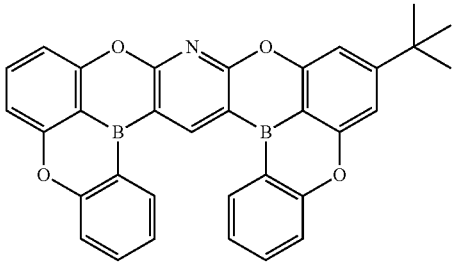

55
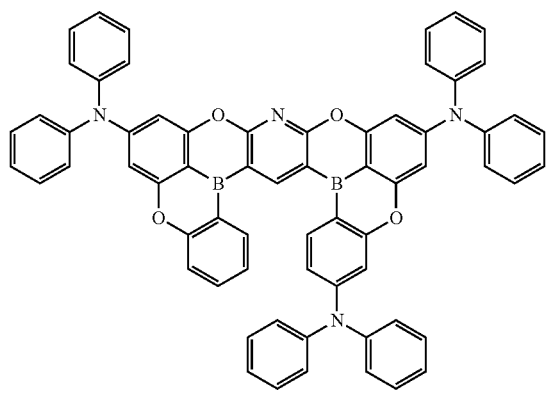
56
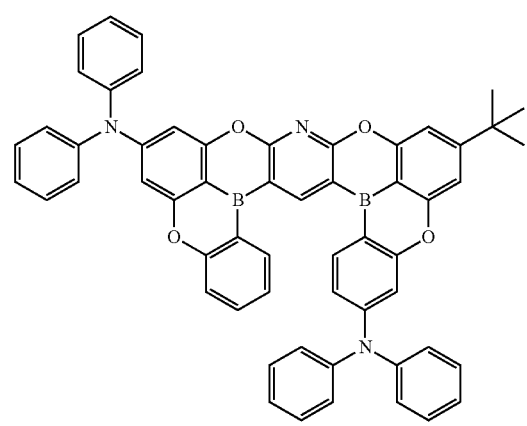
57
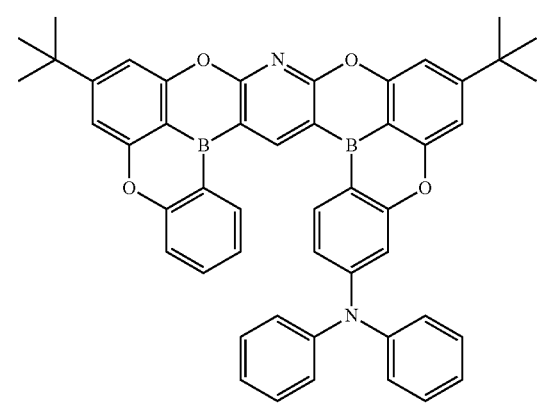
58
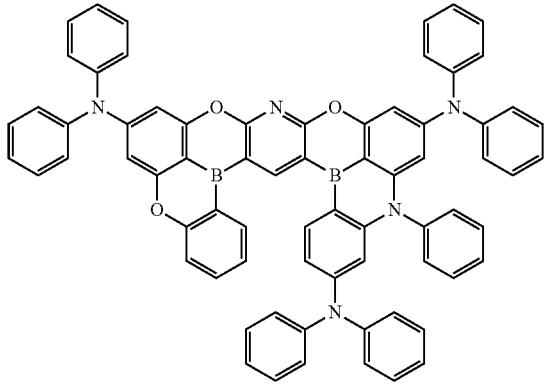
59
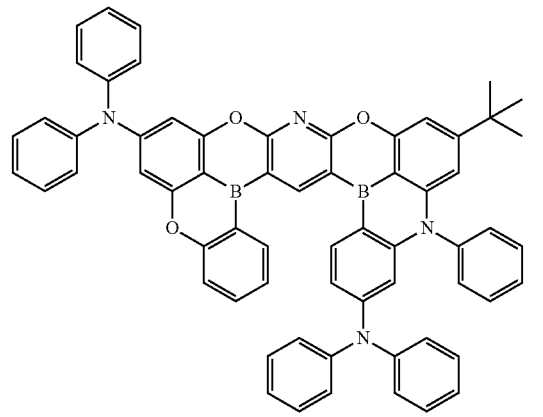
60
61
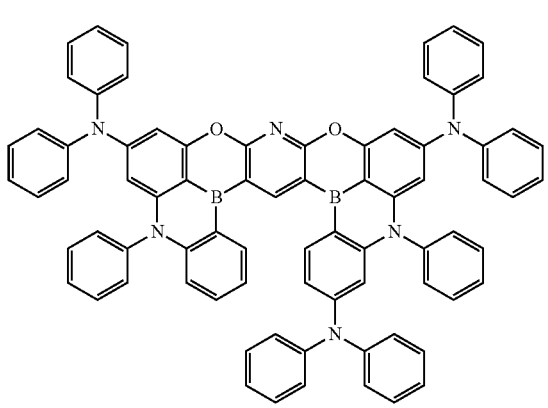

62
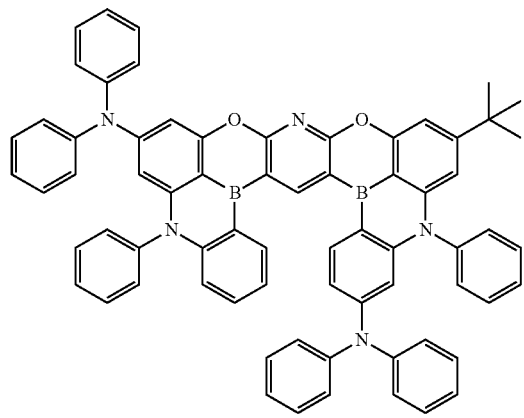
63
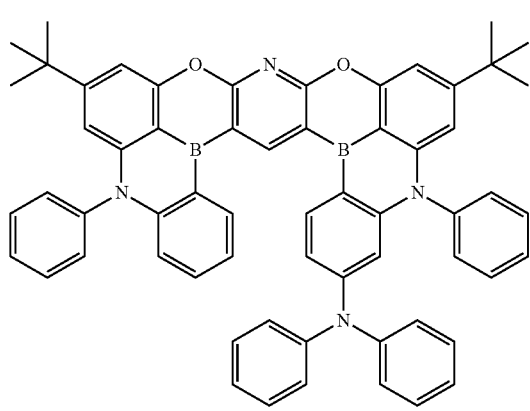
64
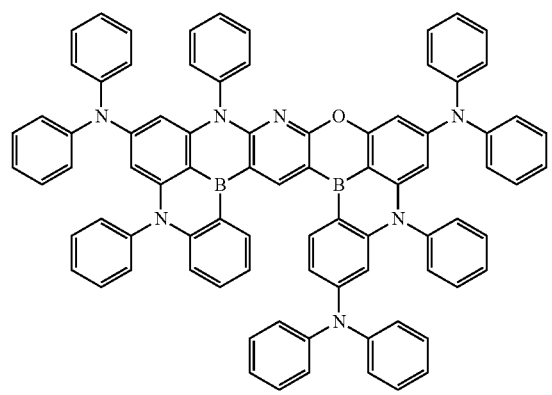
65
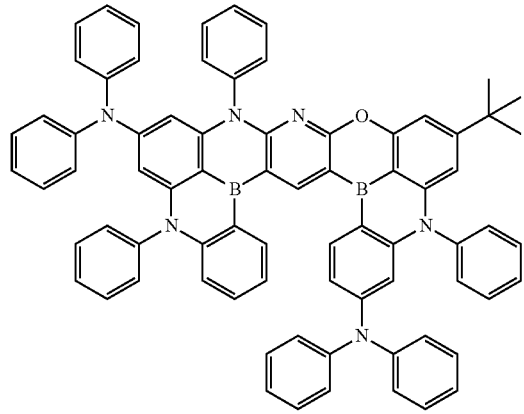
66
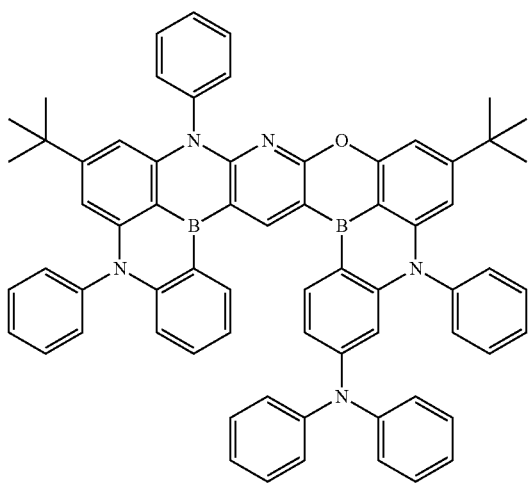
67
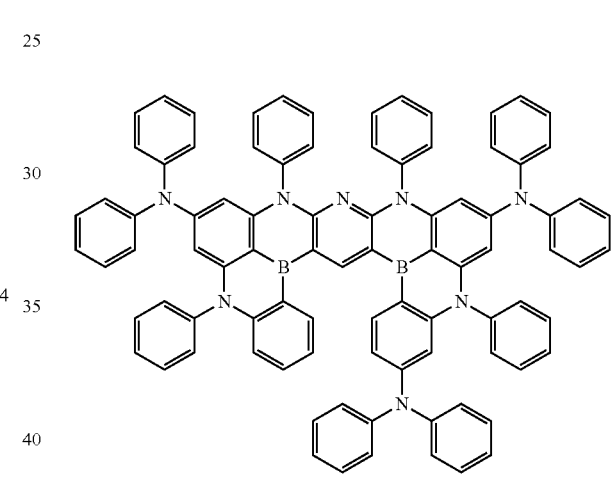
68
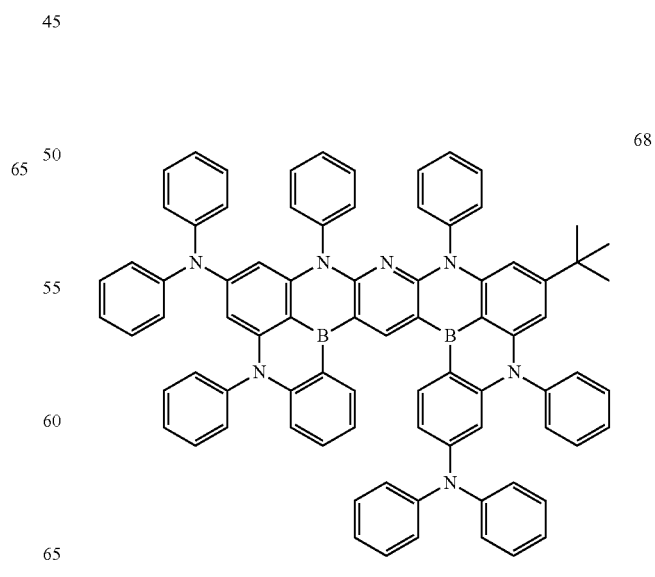

-continued
69
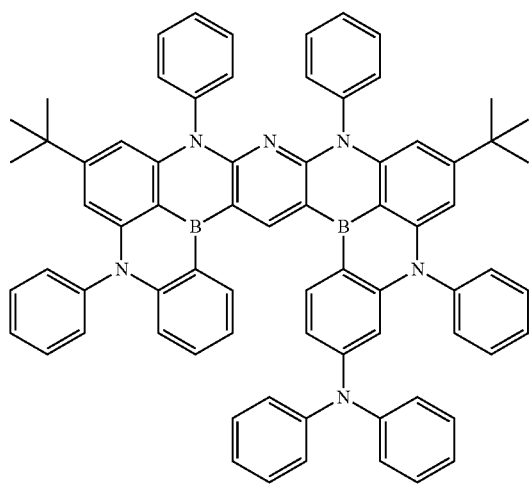
70
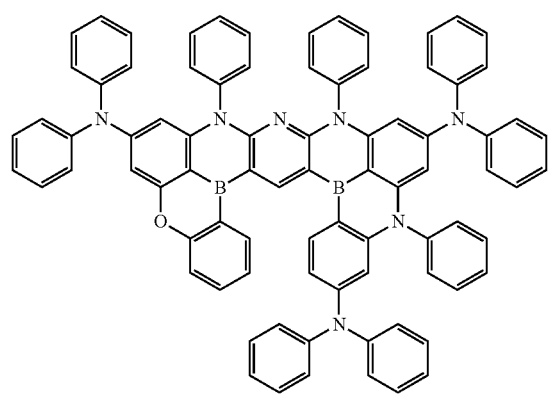
71
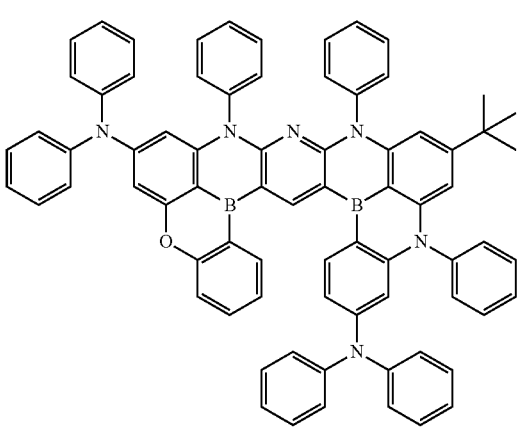
-continued
72
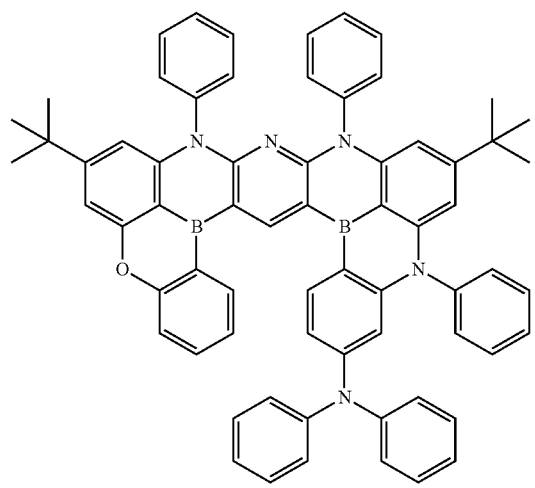
73
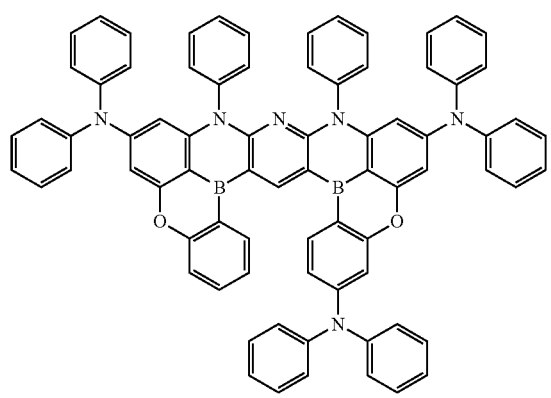
74
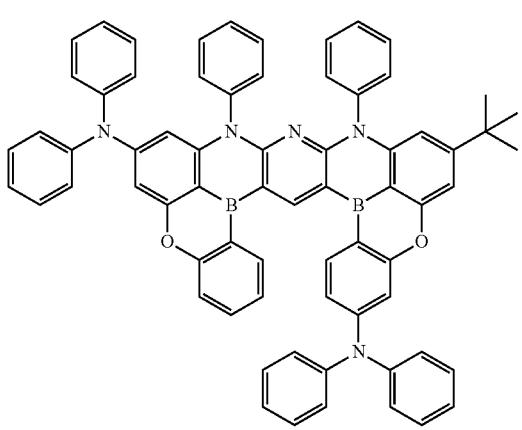

-continued
75
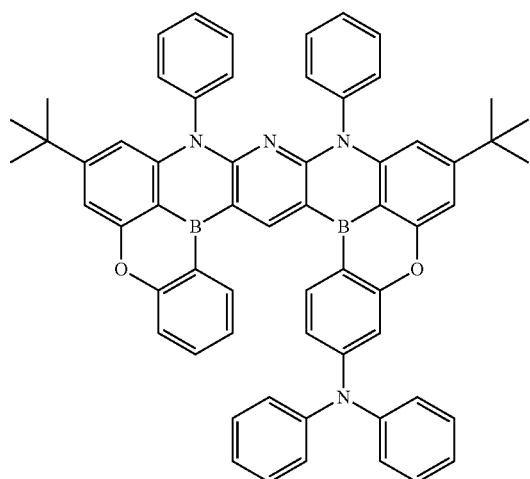
76
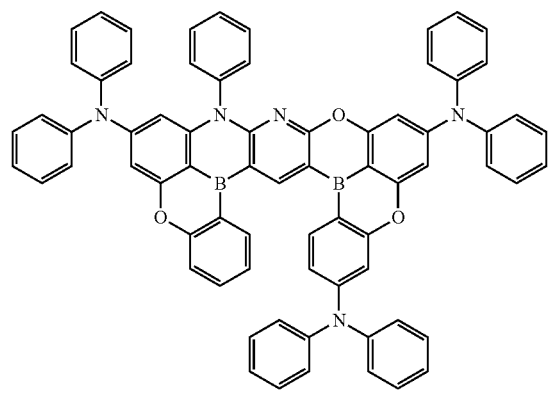
77
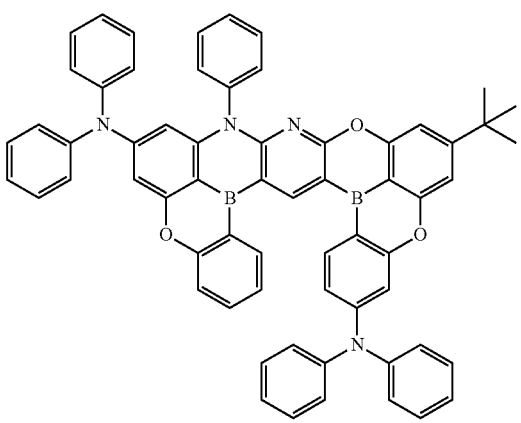
-continued
78
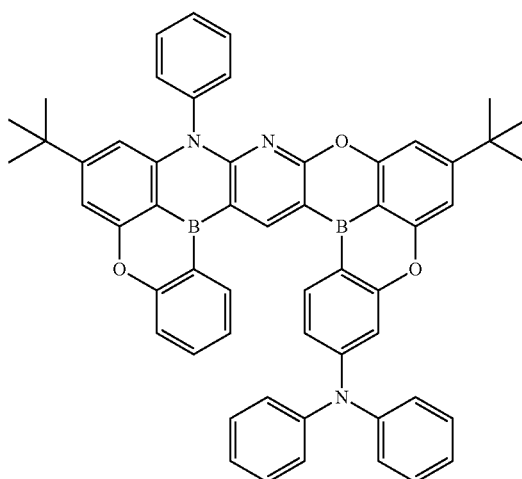
79
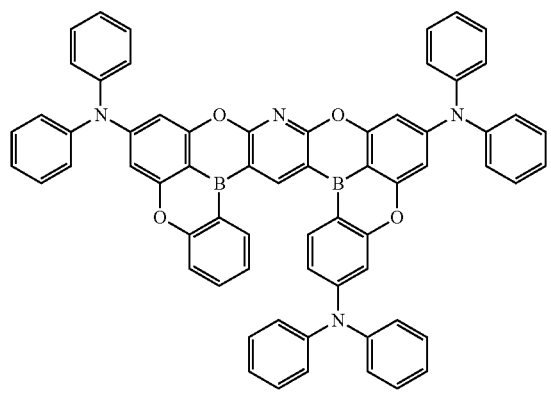
80
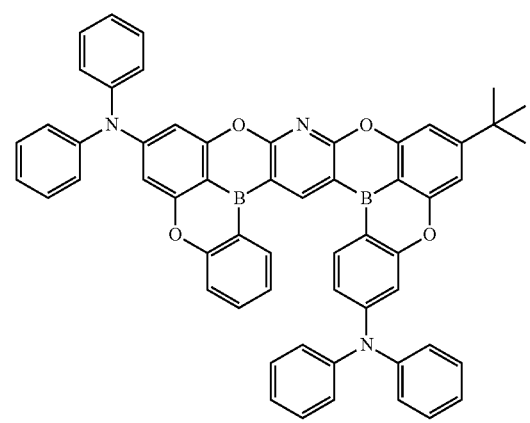

-continued
81
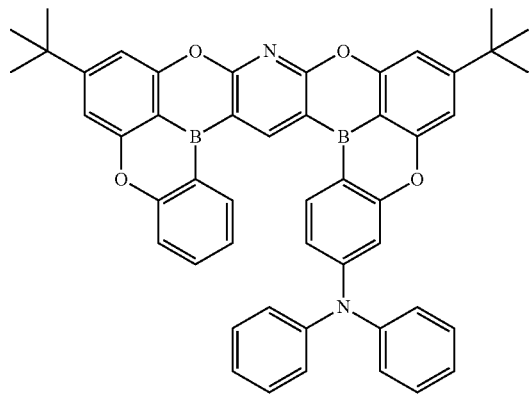
82
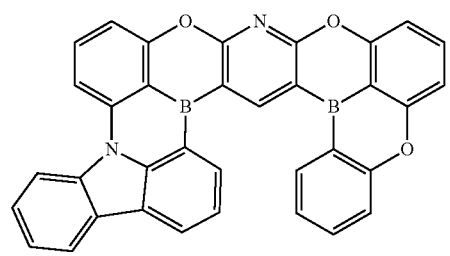
83
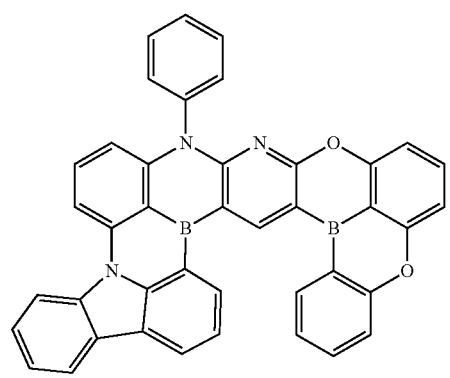
84
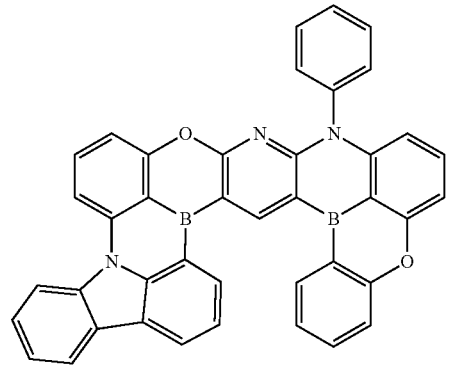
-continued
85
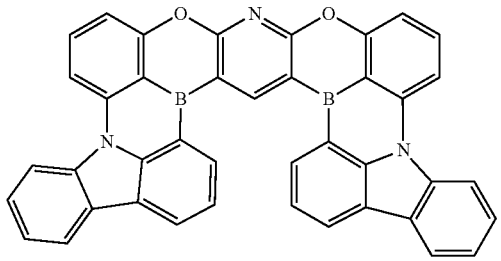
86
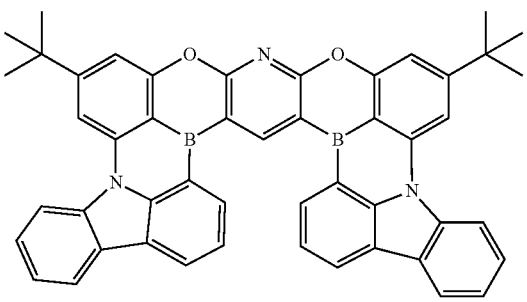
87
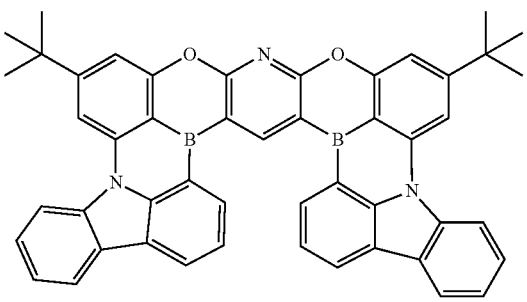
88
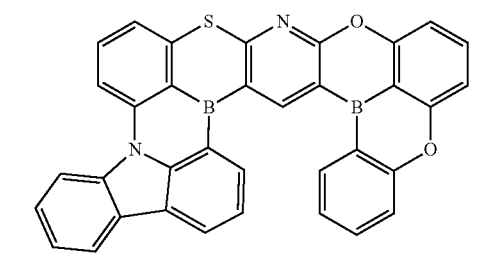
89
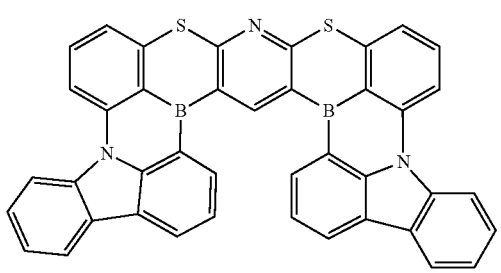

-continued

90
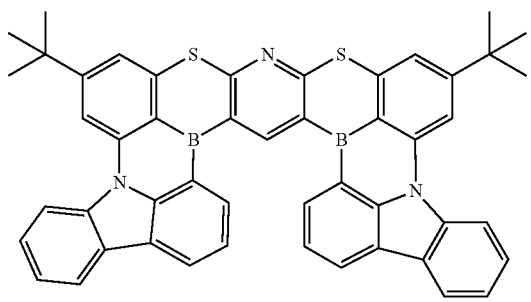

91
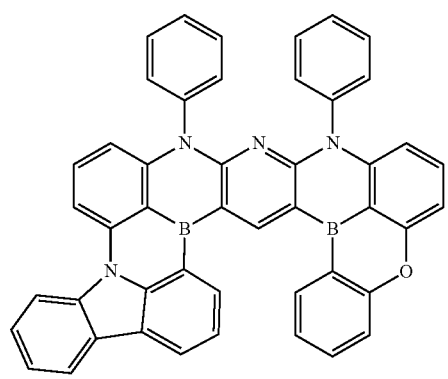

92
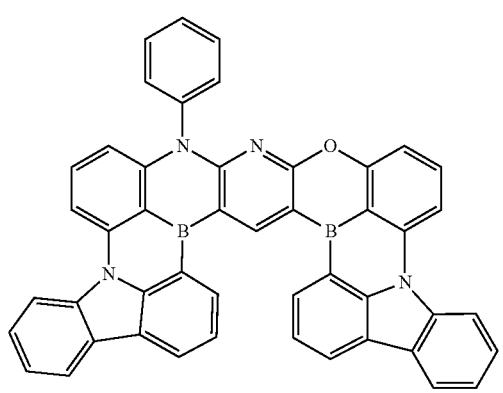

93
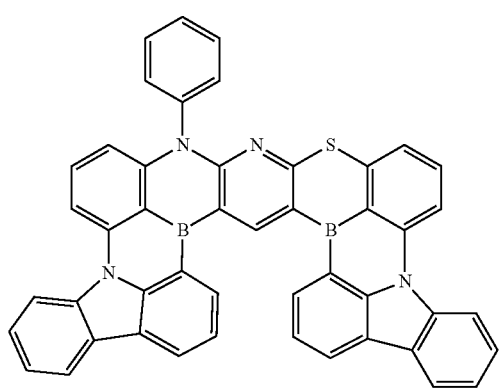

-continued

94
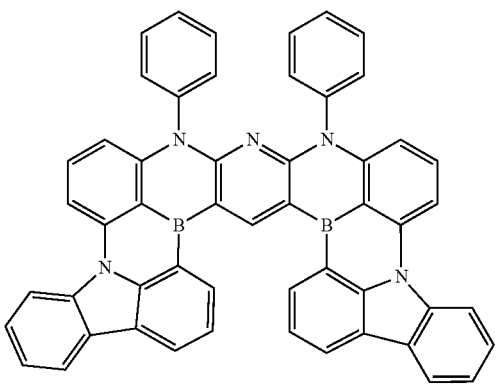

95
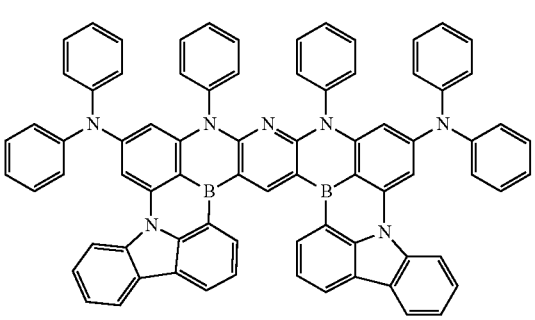

96
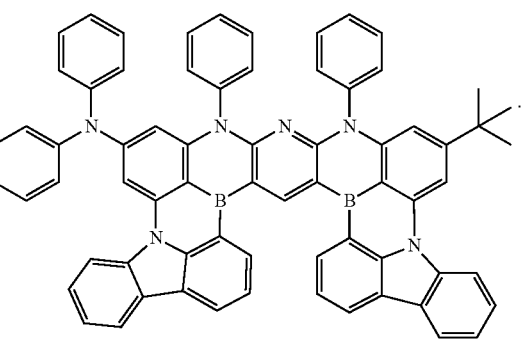

The polycyclic compound of an embodiment may be a luminescent material having a luminescence center wavelength in the 420 nm to 470 nm wavelength region. The polycyclic compound of an embodiment represented by Formula 1 may be a blue dopant.

The emission layer EML in the organic electroluminescence device 10 of an embodiment may include a host and a dopant, and may include the above-described polycyclic compound of an embodiment as a dopant. For example, the emission layer EML in the organic electroluminescence device 10 of an embodiment may include a host for emitting delayed fluorescence and a dopant for emitting delayed fluorescence, and may include the above-described polycyclic compound of an embodiment as a dopant for emitting a delayed fluorescence. For example, the emission layer EML may include at least one among the polycyclic compounds described above as a thermally activated delayed fluorescence (TADF) dopant.

For example, the emission layer EML of the organic electroluminescence device 10 of an embodiment including the polycyclic compound according to an embodiment as a material of the emission layer EML may be to emit delayed fluorescence. For example, the emission layer EML may be to emit a thermally activated delayed fluorescence.

However, embodiments are not limited thereto, and the polycyclic compound of an embodiment may be used as a host material in the organic electroluminescence device 10 of an embodiment.

The polycyclic compound of an embodiment has a planar compound structure attained by fusing a plurality of rings, and for example including a pyridine at the center of the fused rings. The polycyclic compound of an embodiment may have a rigid molecular structure and thereby exhibit highly reliable compound characteristics because the polycyclic rings are fixed by the central pyridine ring. In addition, the polycyclic compound of an embodiment includes multiple electron withdrawing group (EWG) atoms and electron donating group (EDG) atoms as ring-forming atoms, and thus multiple resonance structures may be available within the molecule, resulting in a high f (oscillation strength) value. Accordingly, when the polycyclic compound of an embodiment is used as an emission layer material, it may have an accelerated light emission rate, and may contribute to an improved life span of the organic electroluminescence device. In addition, the polycyclic compound of an embodiment may have a low ΔEst value, and may be used as a thermally activated delayed fluorescence emitting material to further contribute to an improved luminous efficiency of the organic electroluminescence device.

The emission layer EML in the organic electroluminescence device 10 of an embodiment may include any suitable host material and the above-described polycyclic compound of an embodiment. For example, in an embodiment, the emission layer EML may include, as a host material, tris(8-hydroxyquinolinato)aluminum (Alq$_3$), 4,4'-bis(N-carbazolyl)-1,1'-biphenyl (CBP), poly(N-vinylcarbazole (PVK), 9,10-di(naphthalene-2-yl)anthracene (ADN), 4,4',4"-tris (carbazol-9-yl)-triphenylamine (TCTA), 1,3,5-tris(1-phenyl-1H-benzo[d]imidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-Methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzo[b,d]furan (PPF), 3,3'-bis(N-carbazolyl)-1,1'-biphenyl (mCBP), 1,3-bis(N-carbazolyl)benzene (mCP), etc. However, embodiments are not limited thereto, and other delayed fluorescence emission host materials in the art, other than the listed host materials, may be included.

The organic electroluminescence device 10 of an embodiment may include an anthracene derivative represented by Formula A in the emission layer EML:

[Formula A]

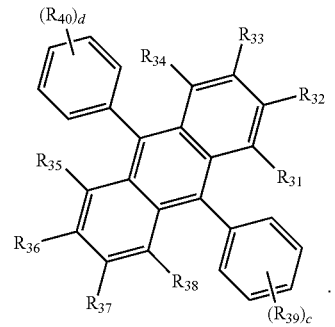

In Formula A, $R_{31}$ to $R_{40}$ may each independently be a hydrogen atom, a deuterium atom, a halogen atom, a substituted or unsubstituted silyl group, a substituted or unsubstituted alkyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, and/or may be bonded to an adjacent group to form a ring. In some embodiments, $R_{31}$ to $R_{40}$ may be bonded to an adjacent group to form a saturated hydrocarbon ring or an unsaturated hydrocarbon ring.

In Formula A, c and d may each independently be an integer of 0 to 5.

Formula A may be represented by any one among Compound 3-1 to Compound 3-16:

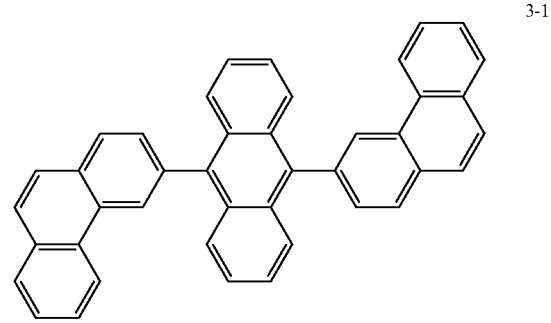

3-1

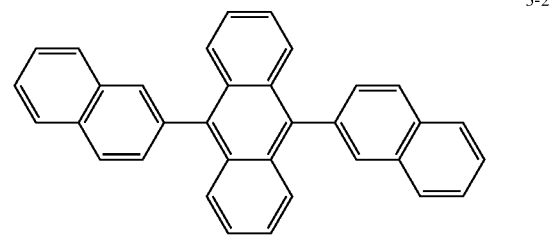

3-2

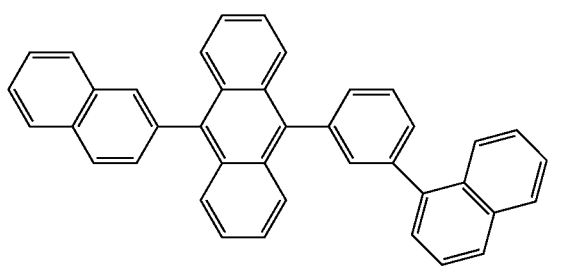

3-3

3-4
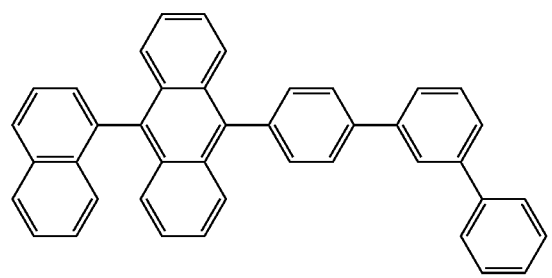
3-5
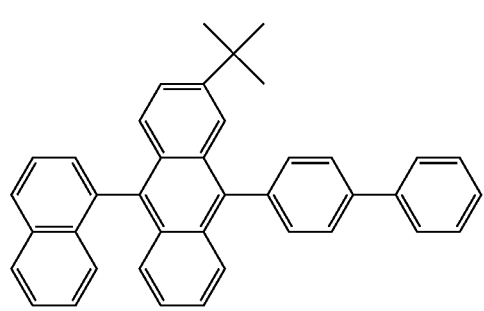
3-6
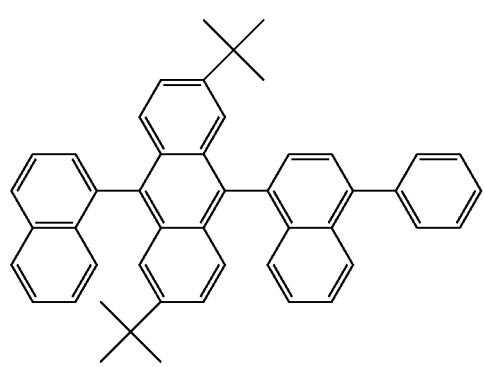
3-7
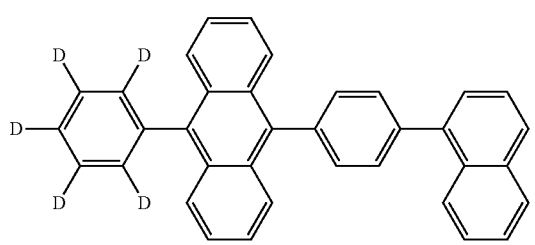
3-8
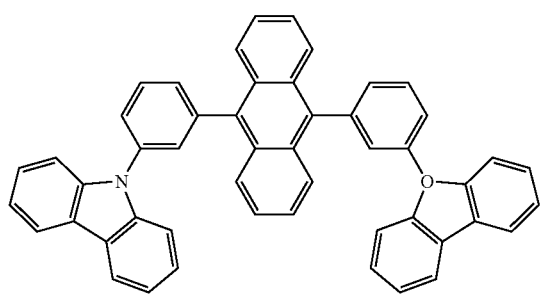
3-9
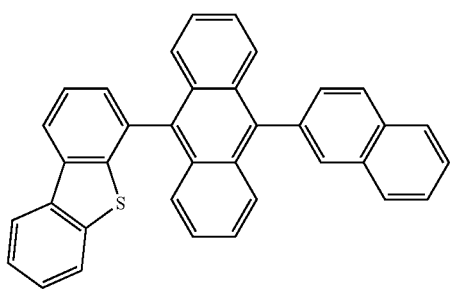
3-10
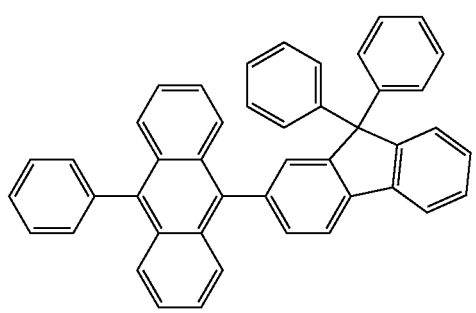
3-11
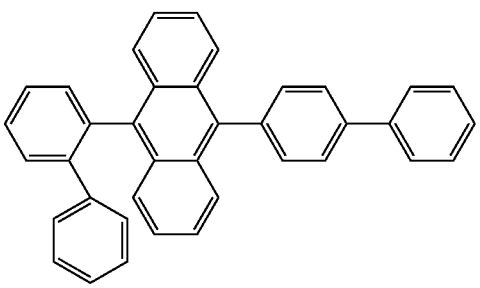
3-12
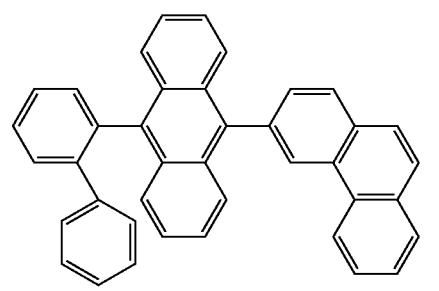
3-13
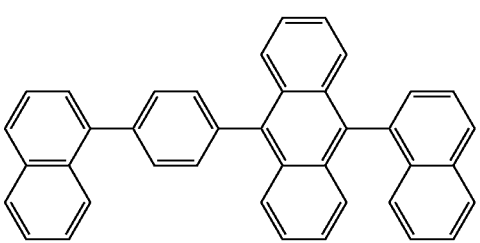

-continued 3-14
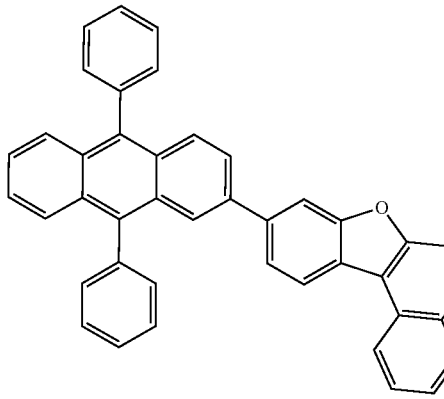

3-15
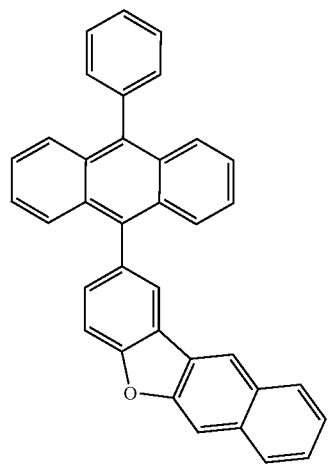

3-16
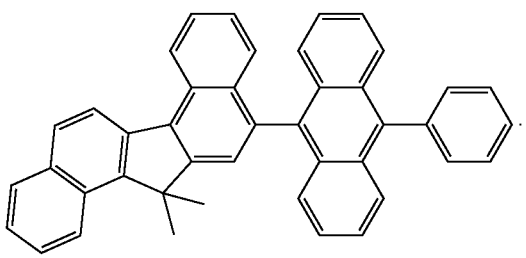

In some embodiments, the organic electroluminescence device 10 of an embodiment may further include any suitable dopant material in addition to the polycyclic compound of an embodiment in the emission layer EML. The known dopant material may include styryl derivatives (e.g., 1,4-bis[2-(3-N-ethylcarbazolyl)vinyl]benzene (BCzVB), 4-(di-p-tolylamino)-4'-[(di-p-tolylamino)styryl]stilbene (DPAVB), and N-(4-((E)-2-(6-((E)-4-(diphenylam ino)styryl)naphthalen-2-yl)vinyl)phenyl)-N-phenylbenz enamine (N-BDAVBi), perylene and derivatives thereof (e.g., 2,5,8,11-tetra-t-butylperylene (TBP)), pyrene and derivatives thereof (e.g., 1-dipyrene, 1,4-dipyrenylbenzene, 1,4-bis(N,N-diphenylamino)pyrene), etc.

In some embodiments, the organic electroluminescence device 10 of an embodiment may include a plurality of emission layers. The plurality of emission layers may be sequentially stacked and provided, for example, the organic electroluminescence device 10 including the plurality of emission layers may be to emit white light. The organic electroluminescence device including the plurality of emission layers may be an organic electroluminescence device having a tandem structure. When the organic electroluminescence device 10 includes a plurality of emission layers, at least one emission layer EML may include the polycyclic compound according to an embodiment as described above.

In the organic electroluminescence device 10 of an embodiment shown in FIGS. 1 to 4, the electron transport region ETR is provided on the emission layer EML. The electron transport region ETR may include, but is not limited to, at least one of the hole blocking layer HBL, the electron transport layer ETL, or the electron injection layer EIL.

The electron transport region ETR may have a multilayer structure having a single layer formed of a single material, a single layer formed of materials different from each other, or a plurality of layers formed of materials different from each other.

For example, the electron transport region ETR may have a single layer structure of an electron injection layer EIL or an electron transport layer ETL, or a single layer structure formed of electron injection materials or electron transport materials. In some embodiments, the electron transport region ETR may have a single layer structure formed of a plurality of different materials, or may have a structure in which an electron transport layer ETL/electron injection layer EIL and a hole blocking layer HBL/electron transport layer ETL/electron injection layer EIL are stacked in order from the emission layer EML, but is not limited thereto. The thickness of the electron transport region ETR may be, for example, about 1000 Å to about 1,500 Å.

The electron transport region ETR may be formed using any suitable method (such as a vacuum deposition method, a spin coating method, a cast method, a Langmuir-Blodgett (LB) method, an inkjet printing method, a laser printing method, a laser induced thermal imaging (LITI) method, etc.).

When the electron transport region ETR includes the electron transport layer ETL, the electron transport region ETR may include an anthracene-based compound. However, embodiments of the present disclosure are not limited thereto, and the electron transport region may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-Tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), diphenyl[4-(triphenylsilyl)phenyl]phosphine oxide (TSPO1), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate (Bebq$_2$), 9,10-di(naphthalene-2-yl)anthracene (ADN), 1,3-Bis[3,5-di(pyridin-3-yl)phenyl]benzene (BmPyPhB), or a mixture thereof. The thickness of the electron transport layers ETL may be about 100 Å to about 1,000 Å, for example, about 150 Å to about 500 Å. When the thickness of the electron transport layer ETL satisfies the above-described range, satisfactory electron transport characteristics may be obtained without a substantial increase in driving voltage.

When the electron transport region ETR includes the electron injection layer EIL, the electron transport region ETR may include or be formed of a metal halide (such as LiF, NaCl, CsF, RbCI, and/or RbI, a lanthanum metal (such as ytterbium (Yb), a metal oxide (such as $Li_2O$ and/or BaO), and/or lithium quinolate (LiQ), but is not limited thereto. The electron injection layer EIL may also be formed of a mixture of an electron injection material and an organo metal salt. The organo metal salt may be a material having an energy band gap of about 4 eV or more. In some embodiments, the organo metal salt may include, for example, metal acetates, metal benzoates, metal acetoacetates, metal acetylacetonates and/or metal stearates. The electron injection layers EIL may have a thickness of about 1 Å to about 100 Å, or about 3 Å to about 90 Å. When the thickness of the electron injection layers EIL satisfies the above-described range, satisfactory electron injection characteristics may be achieved without a substantial increase in driving voltage.

As described above, the electron transport region ETR may include the hole blocking layer HBL. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is provided on the electron transport region HTR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may include or be formed of a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/AI, Mo, Ti, a compound thereof, or any mixture thereof (for example, a mixture of Ag and Mg). In some embodiments, the second electrode EL2 may have a multilayer structure including a reflective layer or a transflective layer formed of the above-described materials, and a transparent conductive layer formed of ITO, IZO, ZnO, ITZO, etc.

In some embodiments, the second electrode EL2 may be connected with an auxiliary electrode. When the second electrode EL2 is connected with the auxiliary electrode, the resistance of the second electrode EL2 may decrease.

Referring to FIG. 4, the organic electroluminescence device 10 according to an embodiment may further include a capping layer CPL on the second electrode EL2. The capping layer CPL may include, for example, α-NPD, NPB, TPD, m-MTDATA, $Alq_3$, CuPc, N4,N4,N4',N4'-tetra (biphenyl-4-yl) biphenyl-4,4'-diamine (TPD15), 4,4',4"-tris (carbazol-9-yl)triphenylamine (TCTA), N, N'-bis(naphthalen-1-yl), etc.

The organic electroluminescence device 10 according to an embodiment of the present disclosure may include the above-described polycyclic compound of an embodiment in the emission layer EML disposed between the first electrode EU and the second electrode EL2 to thereby exhibit improved luminous efficiency. The polycyclic compound according to an embodiment may be a thermally activated delayed fluorescence dopant, and the emission layer EML may include the polycyclic compound of an embodiment to emit a thermally activated delayed fluorescence, thereby exhibiting good luminous efficiency characteristics. For example, the polycyclic compound according to an embodiment may be used as a dopant material of the emission layer EML, and achieve the organic electroluminescence device having excellent luminous efficiency in a blue emitting region.

In some embodiments, the above-described polycyclic compound of an embodiment may be included as a material for the organic electroluminescence device 10 in an organic layer in addition to the emission layer EML. For example, the organic electroluminescence device 10 of an embodiment of the present disclosure may also include the above-described polycyclic compound in at least one functional layer disposed between the first electrode EL1 and the second electrode EL2, or in the capping layer CPL disposed on the second electrode EL2.

The above-described polycyclic compound of an embodiment includes a pyridine ring, and has a fixed planar structure by linking a plurality of rings via the pyridine ring. When the polycyclic compound of an embodiment including a pyridine with acceptor properties at the core is used as an emission layer material, the polycyclic compound may contribute to high efficiency of the organic electroluminescence device. Furthermore, the organic electroluminescence device of an embodiment including the polycyclic compound of an embodiment in the emission layer may exhibit high efficiency characteristics in a blue wavelength region.

Hereinafter, the polycyclic compound according to an embodiment of this present disclosure and an organic electroluminescence device of an embodiment will be described in more detail with reference to Examples and Comparative Examples. The Examples shown below are illustrated only for the understanding of this present disclosure, and the scope of the present disclosure is not limited thereto.

EXAMPLES

1. Synthesis of Polycyclic Compound of One Example

First, a synthesis method for the polycyclic compound according to the present embodiment will be described by illustrating a synthetic method of compounds 7, 10, 13, 15, and 16. The below-described synthesis method is one example, and the synthesis method for the polycyclic compound according to an embodiment of the present disclosure is not limited to Examples below.

(1) Synthesis of Compound 7

Compound 7 according to an example may be synthesized by, for example, the steps shown in Reaction Formula 1:

[Reaction Formula 1]
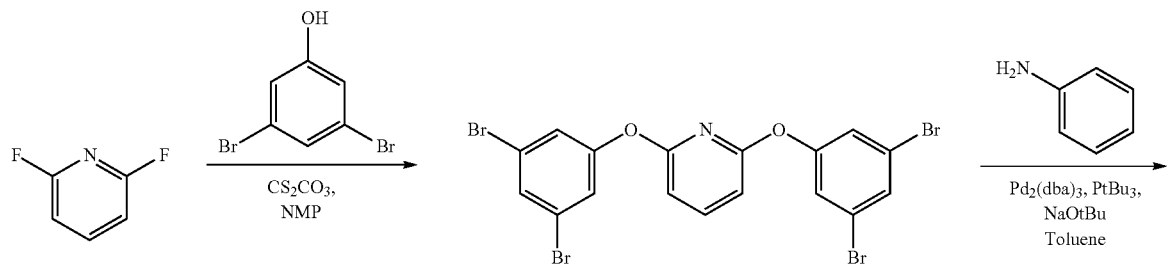
7-1
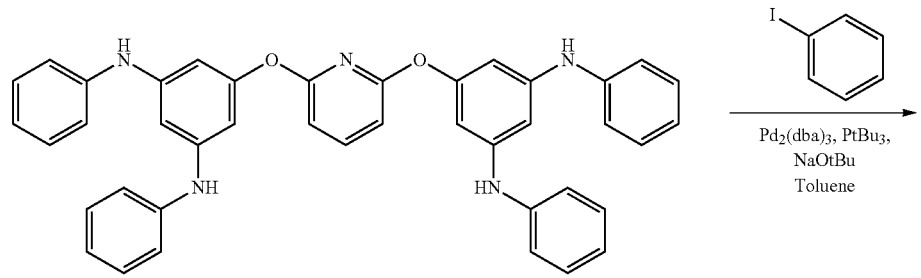
7-2
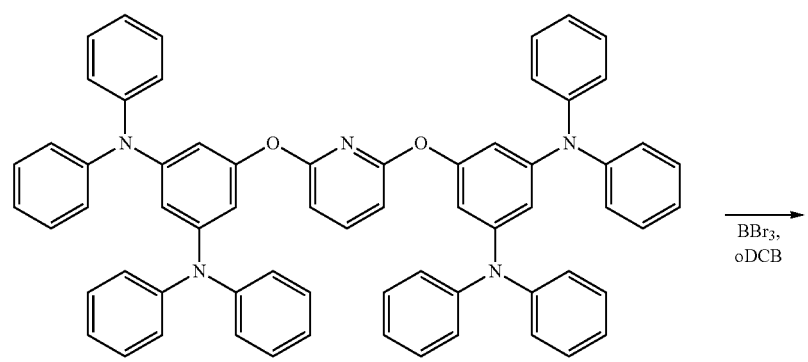
7-3
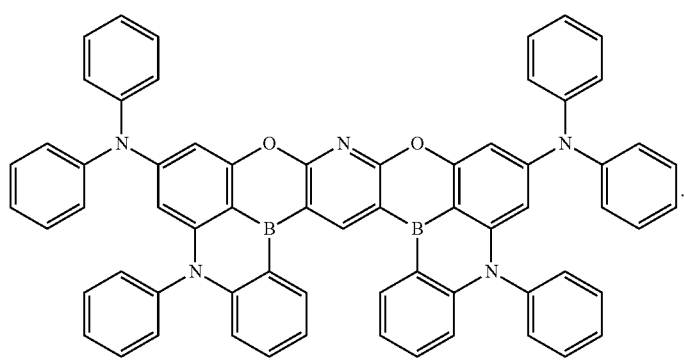
7

Synthesis of Intermediate 7-1

2,6-difluoropyridine (1 eq), 3,5-dibromophenol (3 eq), and cesium carbonate (3 eq) were dissolved in N-methylpyrrolidone (NMP) and then stirred in a nitrogen atmosphere at 190° C. for 12 hours. After cooling, the resultant mixture was dried at reduced pressure and NMP was removed. Then, the resulting product was washed three times with ethyl acetate and water, and an organic layer was obtained. The obtained organic layer was dried with $MgSO_4$, and then dried at reduced pressure. The resulting product was purified by column chromatography to obtain Intermediate 7-1 (yield: 60%).

Synthesis of Intermediate 7-2

Intermediate 7-1 (1 eq), aniline (3 eq), tris(dibenzylidene acetone) dipalladium(0) (0.1 eq), tri-tert-butylphosphine (0.2 eq), and sodium tert-butoxide (4 eq) were dissolved in toluene and then stirred in a nitrogen atmosphere at 110° C. for 12 hours. After cooling, the resulting product was washed three times with ethyl acetate and water, and an organic layer was obtained. The obtained organic layer was dried with $MgSO_4$, and then dried at reduced pressure. The resulting product was purified and recrystallized (dichloromethane: n-hexane) by column chromatography to obtain Intermediate 7-2 (yield: 51%).

Synthesis of Intermediate 7-3

Intermediate 7-2 (1 eq), iodobenzene (5 eq), tris(dibenzylidene acetone) dipalladium(0) (0.2 eq), tri-tert-butylphosphine (0.4 eq), and sodium tert-butoxide (4 eq) were dissolved in toluene and then stirred in a nitrogen atmosphere at 110° C. for 12 hours. After cooling, the resulting product was washed three times with ethyl acetate and water, and an organic layer was obtained. The obtained organic layer was dried with $MgSO_4$, and then dried at reduced pressure. The resulting product was purified by column chromatography to obtain Intermediate 7-3 (yield: 72%).

Synthesis of Compound 7

Intermediate 7-3 (1 eq) was dissolved in ortho-dichlorobenzene, and the containing flask was cooled to 0° C. in a nitrogen atmosphere, and then $BBr_3$ (4 eq) was slowly injected thereto. After dropping was completed, the temperature was elevated to 190° C., and the mixture was stirred for 24 hours. The reaction was cooled to 0° C., triethylamine was slowly dropped into the flask until heating stopped to quench the reaction, and then hexane was added to the flask and extracted. The extracted solids were obtained by filtration. The obtained solids were filtered with a silica filter, and then purified through recrystallization in dichloromethane and n-hexane to obtain Compound 7. Then, the resulting product was finally purified by sublimation purification (post sublimation yield: 5%).

(2) Synthesis of Compound 10

Compound 10 according to an example may be synthesized by, for example, the steps shown in Reaction Formula 2:

[Reaction Formula 2]

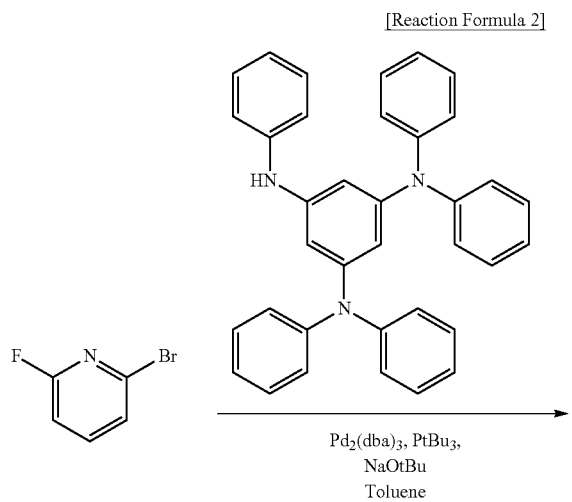

Pd$_2$(dba)$_3$, PtBu$_3$,
NaOtBu
Toluene

-continued
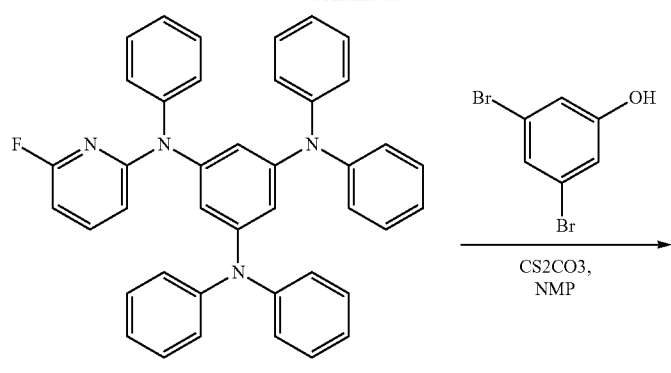
10-1
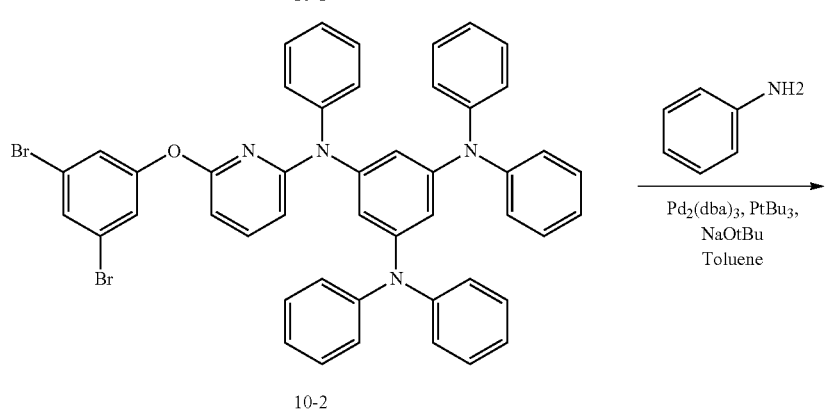
10-2
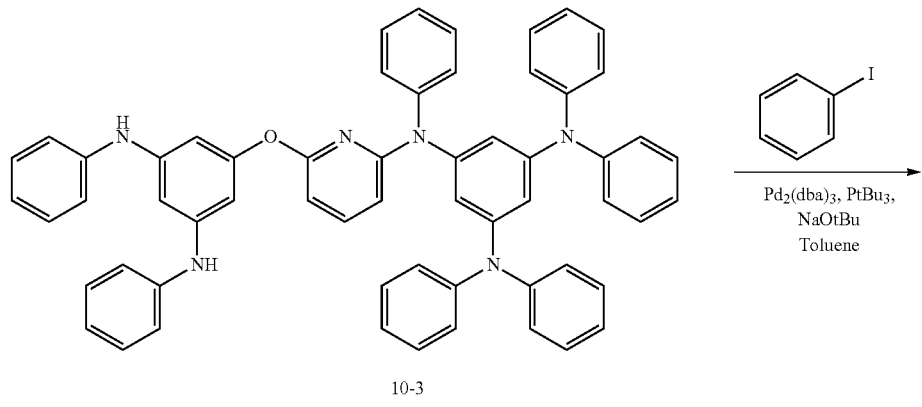
10-3
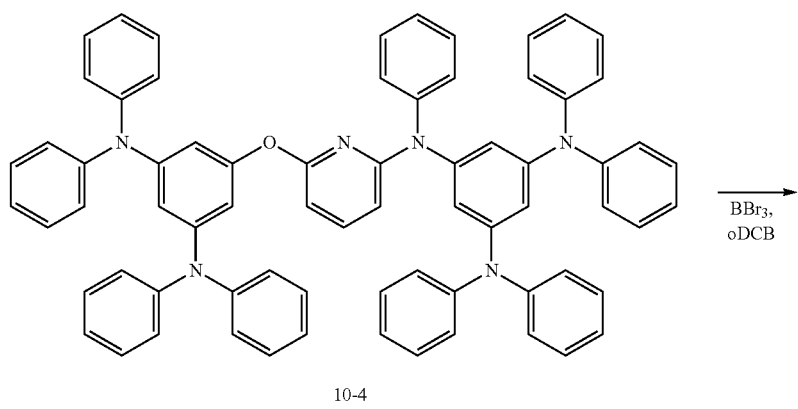
10-4

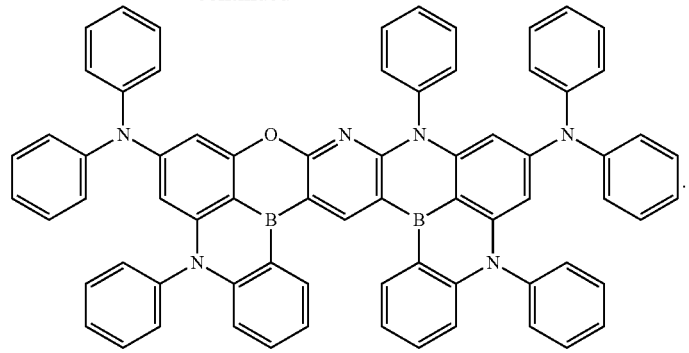

10

Synthesis of Intermediate 10-1

2-bromo-6-fluoropyridine (1 eq), N1,N1,N3,N3,N5-pentaphenylbenzene-1,3,5-triamine (1 eq), tris(dibenzylidene acetone) dipalladium(0) (0.1 eq), tri-tert-butylphosphine (0.2 eq), and sodium tert-butoxide (3 eq) were dissolved in toluene and then stirred in a nitrogen atmosphere at 110° C. for 12 hours. After cooling, the resulting product was washed three times with dichloromethane and water, and then an organic layer was obtained. The obtained organic layer was dried with MgSO$_4$, and then dried at reduced pressure. The resulting product was purified by column chromatography to obtain Intermediate 10-1 (yield: 81%).

Synthesis of Intermediate 10-2

Intermediate 10-1 (1 eq), 3,5-dibromophenol (2 eq), and cesium carbonate (2 eq) were dissolved in NMP and then stirred in a nitrogen atmosphere at 190° C. for 12 hours. After cooling, the resultant mixture was dried at reduced pressure and NMP was removed. Then, the resulting product was washed three times with ethyl acetate and water, and then an organic layer was obtained. The obtained organic layer was dried with MgSO$_4$, and then dried at reduced pressure. The resulting product was purified by column chromatography to obtain Intermediate 10-2 (yield: 68%).

Synthesis of Intermediate 10-3

Intermediate 10-2 (1 eq), aniline (3 eq), tris(dibenzylidene acetone) dipalladium(0) (0.1 eq), tri-tert-butylphosphine (0.2 eq), and sodium tert-butoxide (4 eq) were dissolved in toluene and then stirred in a nitrogen atmosphere at 110° C. for 12 hours. After cooling, the resulting product was washed three times with ethyl acetate and water, and an organic layer was obtained. The obtained organic layer was dried with MgSO$_4$, and then dried at reduced pressure. The resulting product was purified and recrystallized (dichloromethane: n-Hexane) by column chromatography to obtain Intermediate 10-3 (yield: 61%).

Synthesis of Intermediate 10-4

Intermediate 10-4 was obtained by performing substantially the same method as the synthetic method of Intermediate 7-3, except that Intermediate 10-3 and iodobenzene (3 eq) were used (yield: 82%).

Synthesis of Compound 10

Compound 10 was obtained by performing substantially the same method as the synthetic method of Compound 7 except that Intermediate 10-4 was used (post sublimation yield: 6%).

(3) Synthesis of Compound 13

Compound 13 according to an example may be synthesized by, for example, the steps shown in Reaction Formula 3:

[Reaction Formula 3]

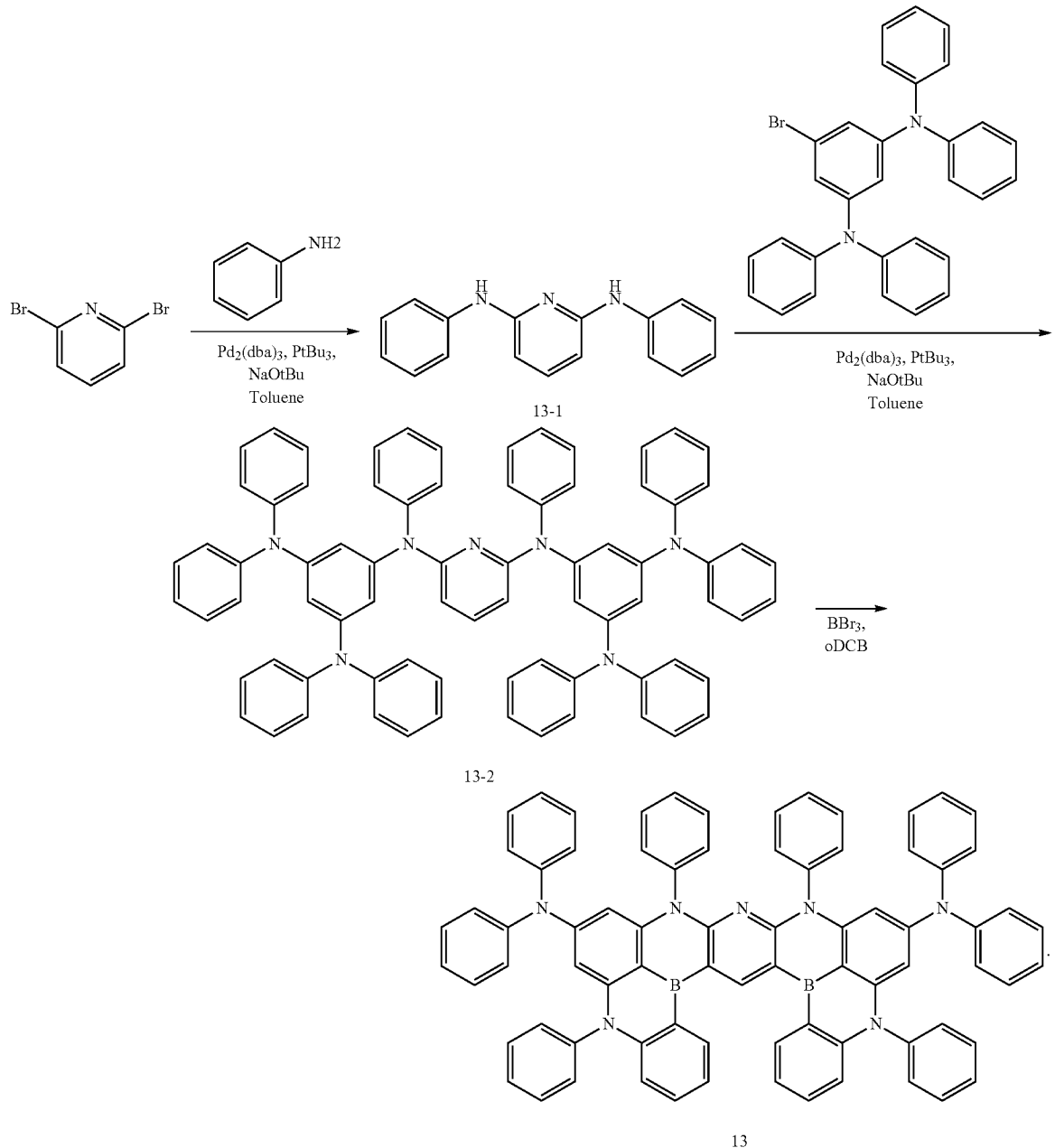

Synthesis of Intermediate 13-1

Intermediate 13-1 was obtained by performing substantially the same method as the synthetic method of Intermediate 7-2 except that 2,6-dibromopyridine (1 eq) and aniline (3 eq) were used (yield: 71%).

Synthesis of Intermediate 13-2

Intermediate 13-2 was obtained by performing substantially the same method as the synthetic method of Intermediate 10-4 except that Intermediate 13-1 (1 eq) and 5-bromo-N1,N1,N3,N3-tetraphenylbenzene-1,3-diamine (2 eq) were used (yield: 63%).

Synthesis of Compound 13

Compound 13 was obtained by performing substantially the same method as the synthetic method of Compound 7 except that Intermediate 13-2 was used (post sublimation yield: 8%).

(4) Synthesis of Compound 15

Compound 15 according to an example may be synthesized by, for example, the steps shown in Reaction Formula 4:

[Reaction Formula 4]

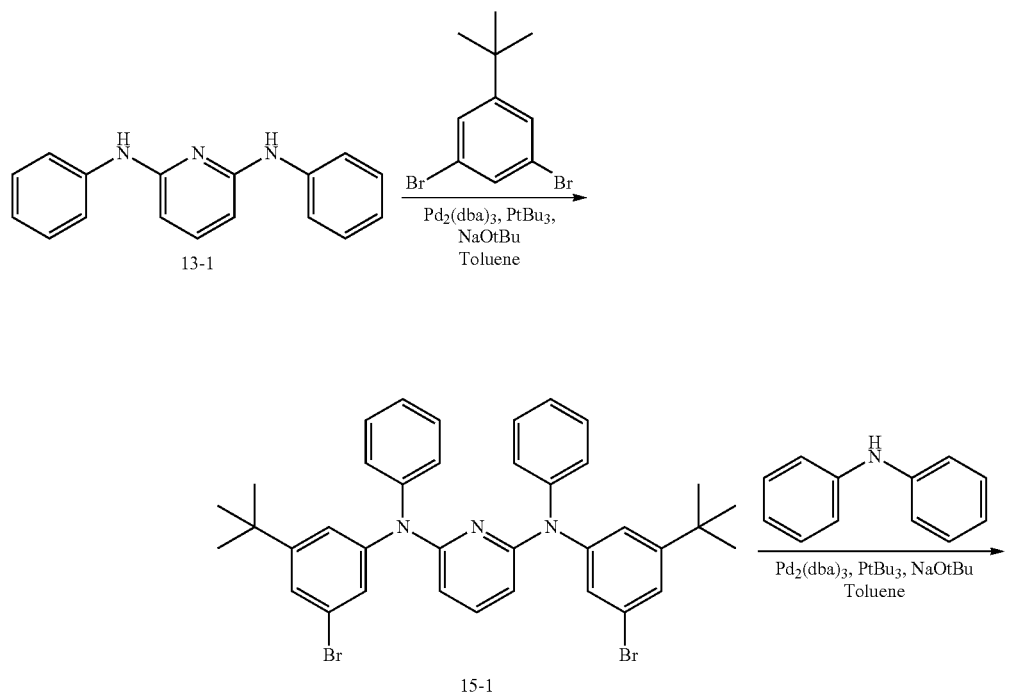

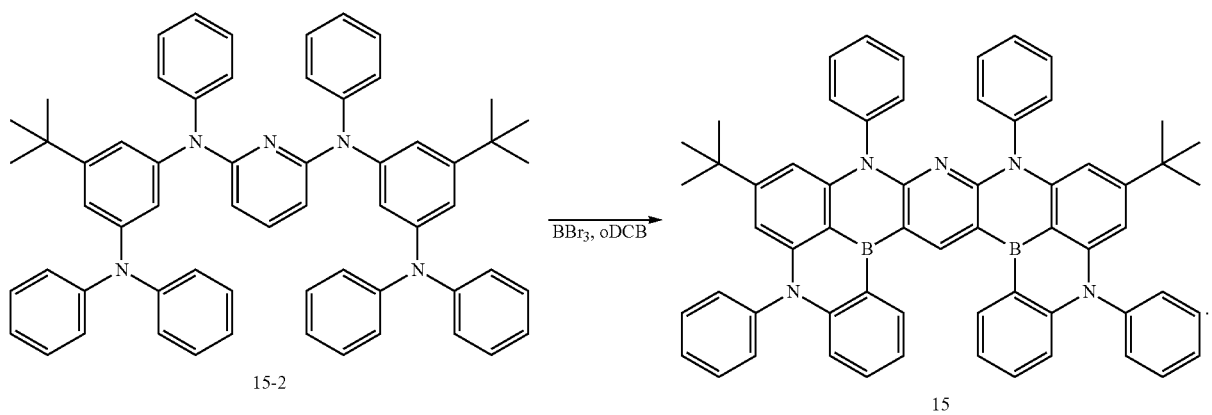

Synthesis of Intermediate 15-1

Intermediate 13-1 (1 eq), 1,3-dibromo-5-(tert-butyl)benzene (2 eq), tris(dibenzylidene acetone) dipalladium(0) (0.1 eq), tri-tert-butylphosphine (0.2 eq), and sodium tert-butoxide (3 eq) were dissolved in toluene and then stirred in a nitrogen atmosphere at 90° C. for 12 hours. After cooling, the resulting product was washed three times with ethyl acetate and water, and an organic layer was obtained. The obtained organic layer was dried with MgSO$_4$, and then dried at reduced pressure. The resulting product was purified by column chromatography to obtain Intermediate 15-1 (yield: 66%).

Synthesis of Intermediate 15-2

Intermediate 15-2 was obtained by performing substantially the same method as the synthetic method of Intermediate 7-2 except that Intermediate 15-1 (1 eq) and 5 diphenylamine (2.5 eq) were used (yield: 74%).

Synthesis of Compound 15

Compound 15 was obtained by performing substantially the same method as the synthetic method of Compound 7 except that Intermediate 15-2 was used (post sublimation yield: 4%).

(5) Synthesis of Compound 16
Compound 16 according to an example may be synthesized by, for example, the steps shown in Reaction Formula 5:
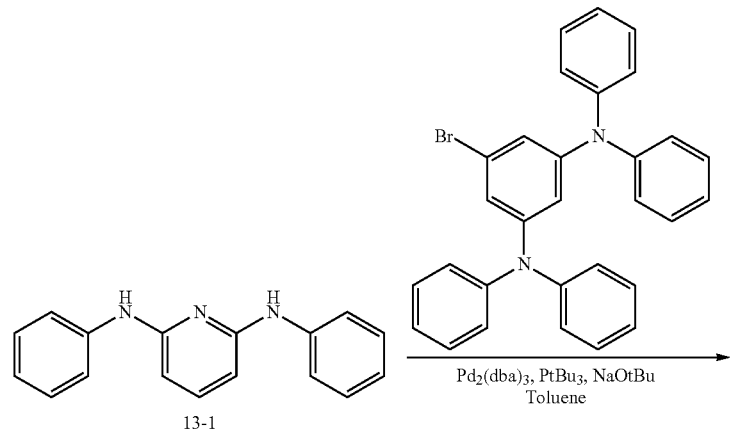
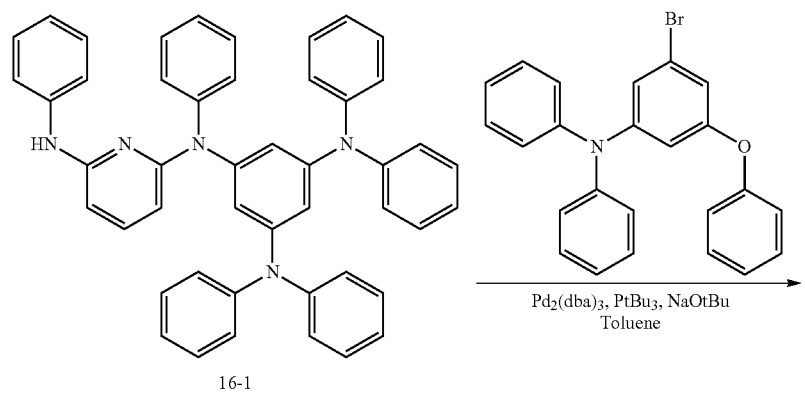
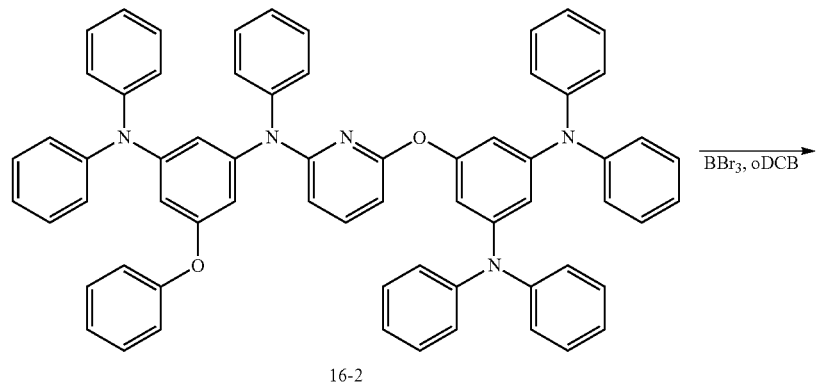

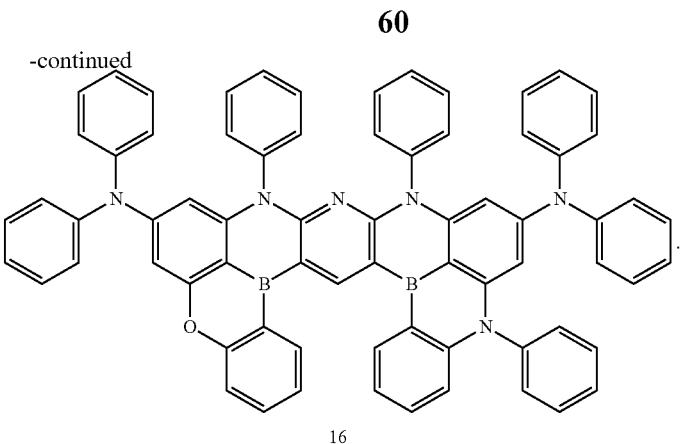

16

Synthesis of Intermediate 16-1

Intermediate 16-1 was obtained by performing substantially the same method as the synthetic method of Intermediate 10-4 except that Intermediate 13-1 (1 eq) and 5-bromo-N1,N1,N3,N3-tetraphenylbenzene-1,3-diamine (1 eq) were used (yield: 60%).

Synthesis of Intermediate 16-2

Intermediate 16-2 was obtained by performing substantially the same method as the synthetic method of Intermediate 10-4 except that Intermediate 16-1 (1 eq) and 3-bromo-5-phenoxy-N,N-diphenylaniline (1 eq) were used (yield: 71%).

Synthesis of Compound 16

Compound 16 was obtained by performing substantially the same method as the synthetic method of Compound 7 except that Intermediate 16-2 was used (post sublimation yield: 2%).

(6) Identification of Synthesized Compound

The molecular weights and NMR analysis results of synthesized compounds are shown in Table 1:

TABLE 1

| Compound | $^1$H NMR (δ) | Calc | Found |
|---|---|---|---|
| 7 | 10.32 (1H, s), 9.43 (2H, d), 7.52 – 7.32 (8H, m), 7.30 – 7.19 (18H, m), 7.15 – 7.02 (8H, m), 6.90 (2H, d), 6.82 (2H, d), 5.81 (2H, d) | 947.71 | 947.70 |
| 10 | 10.43 (1H, s), 9.33 (2H, d), 7.62 – 7.52 (11H, m), 7.51 – 7.19 (21H, m), 7.16 – 6.92 (8H, m), 6.70 (1H, s), 6.62 (1H, s), 5.91 (1H, s) 5.8 (2H, s) | 1022.83 | 1022.82 |
| 13 | 10.52 (1H, s), 9.45 (2H, d), 7.57 – 7.32 (16H, m), 7.30 – 7.12 (16H, m), 7.10 – 6.90 (13H, m), 5.92 (2H, d), 5.82 (1H, s), 5.75 (2H, s) | 1097.94 | 1097.92 |
| 15 | 10.23 (1H, s), 9.48 (2H, d), 7.67 – 7.46 (8H, m), 7.43 – 7.12 (9H, m), 7.11 – 6.87 (8H, m), 6.87 (2H, d), 6.12 (1H, s), 5.93 (2H, s), 1.32 (18H, s) | 875.73 | 875.71 |

TABLE 1-continued

| Compound | $^1$H NMR (δ) | Calc | Found |
|---|---|---|---|
| 16 | 10.51 (1H, s), 9.43 (2H, d), 7.49 – 7.33 (10H, m), 7.31 – 7.16 (14H, m), 7.15 – 7.02 (5H, m), 6.99 – 6.78 (12H, m), 6.02 (1H, s), 5.87 (1H, s), 5.63 (2H, s) | 1022.83 | 1022.83 |

2. Evaluation of Polycyclic Compound $\Delta E_{ST}$ values and luminous wavelength of Example Compounds 7, 10, 13, 15, and 16 Comparative Example Compounds C1 and C2 are shown in Table 2.

The $\Delta E_{ST}$ values in Table 2 were calculated using a non-empirical molecular orbital method. For example, the value was calculated using the B3LYP/6-31G(d) functional and basis set using Gaussian 09 from Gaussian, Inc. (Wallingford, Conn., USA). $\Delta E_{ST}$ refers to the energy difference between a lowest singlet exciton energy level (S1 level) and a lowest triplet exciton energy level (T1 level).

The Comparative Example Compounds are as follows:

C1

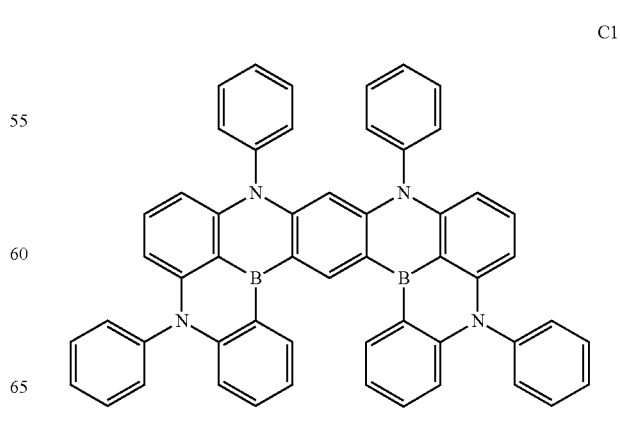

-continued

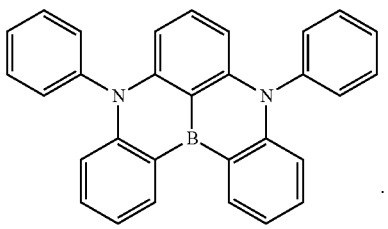

C2

TABLE 2

| Division | Compound | Δ$E_{ST}$ (eV) | Luminous wavelength (nm) |
|---|---|---|---|
| Example 1 | Compound 7 | 0.16 | 448.2 |
| Example 2 | Compound 10 | 0.26 | 404.8 |
| Example 3 | Compound 13 | 0.32 | 445.9 |
| Example 4 | Compound 15 | 0.11 | 396.3 |
| Example 5 | Compound 16 | 0.25 | 408.3 |
| Comparative Example 1 | Comparative Example Compound C1 | 0.36 | 429.0 |
| Comparative Example 2 | Comparative Example Compound C2 | 0.49 | 398.6 |

Referring to the results of Table 2, each of the Examples had smaller $\Delta E_{ST}$ values compared to each of the Comparative Examples. Without being bound by the correctness of any explanation or theory, it is believed that the Example Compounds have relatively small $\Delta E_{ST}$ values and thus may be used as TADF materials.

In addition, it was shown that each of the Example Compounds emit light in the wavelength region of 450 nm or less, and may be used as a blue dopant.

3. (Manufacture and Evaluation of Organic Electroluminescence Device)

An organic electroluminescence device of an embodiment including the polycyclic compound of an embodiment in the emission layer was manufactured as follows.

(Manufacture of Organic Electroluminescence Device)

A glass substrate on which ITO is patterned was washed with pure water and then irradiated with ultraviolet rays for about 30 minutes and treated with ozone. Then, sequentially, NPD was deposited on the glass substrate to a thickness of about 300 Å, TCTA was deposited thereon to a thickness of about 200 Å, and CzSi was deposited thereon to a thickness of about 100 Å to form a hole transport region.

Next, in the forming of an emission layer, a polycyclic compound of an example or a comparative example compound and mCP were co-deposited at a weight ratio of 1:99 to form a layer having a thickness of about 200 Å. For example, each of polycyclic compounds 7, 10, 13, 15, and 16 was mixed with mCP and deposited to form an emission layer in the Examples, and each of Comparative Compounds C1 and C3 was mixed with mCP and deposited to form an emission layer in the Comparative Examples.

Then, a 200 Å-thick layer was formed with TSPO1, a 300 Å-thick layer was formed with TPBi, and a 10 Å-thick layer formed with LiF were sequentially deposited on the emission layer to form an electron transport region. Next, a second electrode having a thickness of about 3,000 Å was formed with aluminum (Al).

In the Examples, the hole transport region, the emission layer, the electron transport region, and the second electrode were each formed using a vacuum deposition apparatus.

The hole transport region and electron transport region materials used in the manufacture of the organic electroluminescence device are shown below:

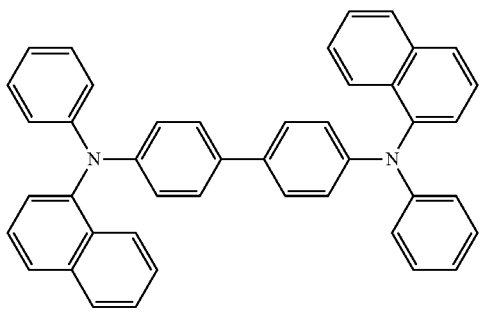

NPD

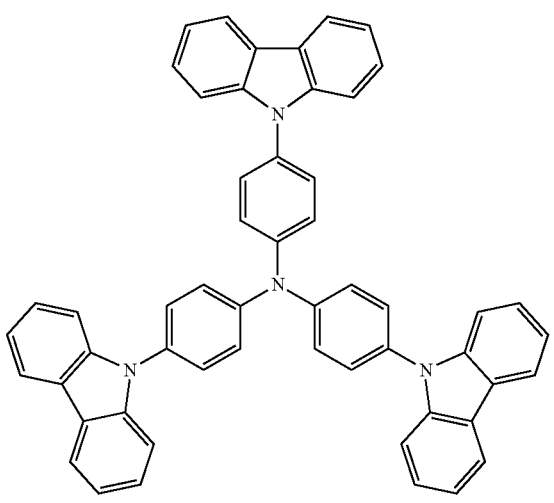

TCTA

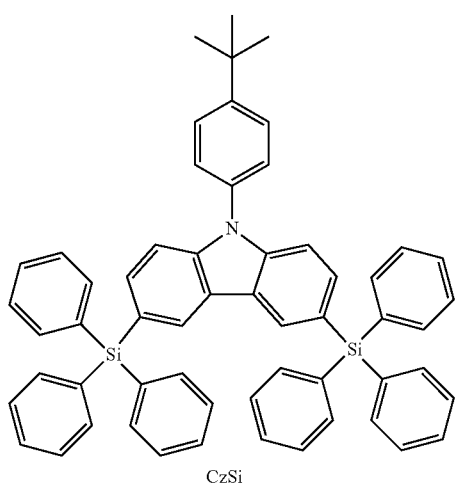

CzSi

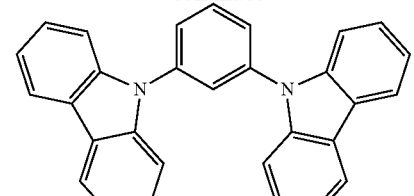

mCP

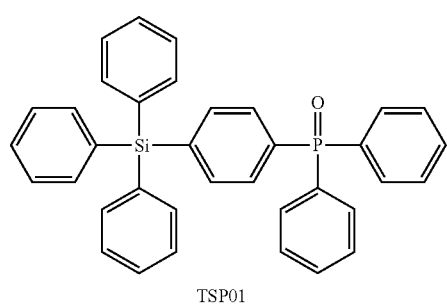

TSP01

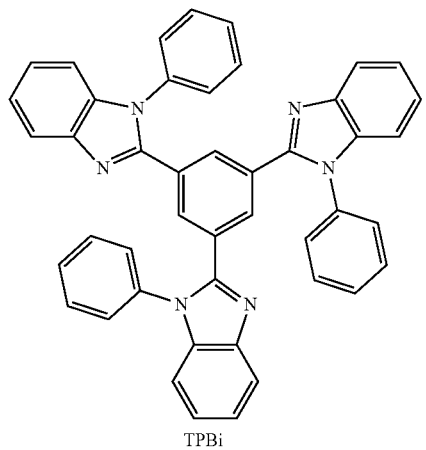

TPBi

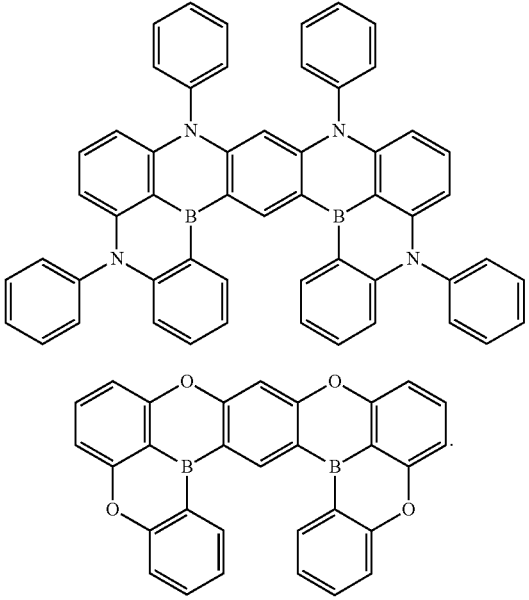

(Evaluation of Property of Organic Electroluminescence Device)

The efficiency and luminous color of each manufactured organic electroluminescence device are listed in Table 3 for comparison. The characteristics of the manufactured organic electroluminescence devices (e.g., drive voltage, current efficiency, and maximum quantum efficiency) were each measured at a current density of 10 mA/cm². The drive voltage and current density of the organic electroluminescence device were measured using a Source Meter Unit (Keithley Instruments, Inc., 2400 series), and the maximum quantum efficiency was measured using an external quantum efficiency measurement apparatus (C9920-2-12, manufactured by Hamamatsu Photonics, Co., Japan). With respect to the evaluation of maximum quantum efficiency, the brightness/current density was measured using a brightness photometer in which the wavelength sensitivity was calibrated, and the maximum quantum efficiency was calculated assuming an angular brightness distribution (Lambertian distribution) assuming an ideal diffuse reflecting surface. The results of the evaluation of properties of the organic electroluminescence device are shown in Table 3.

TABLE 3

| Division | Dopant | Drive voltage (V) | Current efficiency (cd/A) | Maximum external quantum efficiency (%) | Luminous color |
|---|---|---|---|---|---|
| Example 1 | Compound 7 | 4.8 | 23.6 | 22.6 | Blue |
| Example 2 | Compound 10 | 4.9 | 22.8 | 21.8 | Blue |
| Example 3 | Compound 13 | 4.7 | 24.4 | 22.8 | Blue |
| Example 4 | Compound 15 | 5.1 | 20.2 | 18.8 | Blue |
| Example 5 | Compound 16 | 4.9 | 22.4 | 21.3 | Blue |
| Comparative Example 1 | Comparative Example Compound C3 | 6.1 | 17.6 | 15.4 | Blue |
| Comparative Example 2 | Comparative Example Compound C1 | 5.5 | 19.9 | 19.5 | Blue |

Referring to the results of Table 3, each of the Examples exhibited a low drive voltage and high efficiency compared to each of the Comparative Examples. In addition, each of the Examples emitted light in a blue wavelength region, with improved current efficiency and external quantum efficiency compared to Comparative Examples.

The polycyclic compound of an embodiment has a planar structure capable of multiple resonance structures, includes a fixed structure connected with a pyridine ring, and is used as an emission layer material to contribute to high efficiency and long service life characteristics of the organic electroluminescence device. Furthermore, the organic electroluminescence device of an embodiment including the polycyclic compound of an embodiment in the emission layer may exhibit high efficiency characteristics in a blue wavelength region.

The organic electroluminescence device of an embodiment may exhibit improved device characteristics of high efficiency in the blue wavelength region.

The polycyclic compound of an embodiment may have a planar skeleton structure containing a pyridine core, and may be included in the emission layer of the organic electroluminescence device to contribute to high efficiency of the organic electroluminescence device.

Although the present disclosure has been described with reference to a preferred embodiment of the present disclosure, it will be understood that the present disclosure should not be limited to these preferred embodiments but various changes and modifications can be made by those skilled in the art without departing from the spirit and scope of the present disclosure.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Accordingly, the technical scope of the present disclosure is not intended to be limited to the contents set forth in the detailed description of the specification, but is intended to be defined by the appended claims and equivalents thereof.

What is claimed is:

1. An organic electroluminescence device comprising:
a first electrode;
a second electrode on the first electrode; and
an emission layer between the first electrode and the second electrode and comprising a polycyclic compound represented by Formula 1,
the first electrode and the second electrode each independently comprising at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more thereof, a mixture of two or more thereof, and an oxide thereof:

[Formula 1]

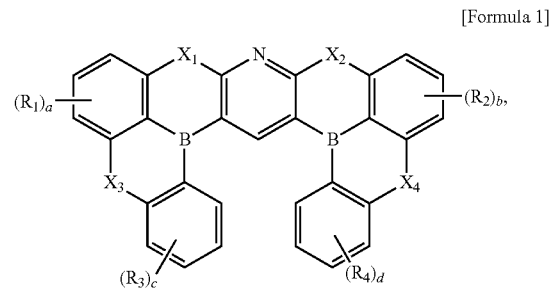

wherein in Formula 1, $X_1$ to $X_4$ are each independently O, S, or $NR_a$, a and b are each independently an integer of 0 to 3, and c and d are each independently an integer of 0 to 4, and $R_1$ to $R_4$, and $R_a$ are each independently a hydrogen atom, a deuterium atom, a halogen atom, a cyano group, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are optionally combined with an adjacent group to form a ring.

2. The organic electroluminescence device of claim 1, wherein the emission layer comprises a host and a dopant, and the dopant comprises the polycyclic compound.

3. The organic electroluminescence device of claim 1, wherein the emission layer is to emit delayed fluorescence.

4. The organic electroluminescence device of claim 1, wherein the emission layer is to emit light having a center wavelength of 420 nm to 470 nm.

5. The organic electroluminescence device of claim 1, wherein $R_1$ to $R_4$ are each independently a substituted or unsubstituted alkyl group having 1 to 10 carbon atoms, a substituted or unsubstituted arylamine group having 6 to 30 carbon atoms, or a substituted or unsubstituted heteroaryl group having 2 to 20 ring-forming carbon atoms.

6. The organic electroluminescence device of claim 1, wherein $R_a$ is a substituted or unsubstituted phenyl group.

7. The organic electroluminescence device of claim 1, wherein a to d are each independently 0 or 1.

8. The organic electroluminescence device of claim 1, wherein adjacent groups selected from $R_1$ to $R_4$ and $R_a$ are bonded to each other to form a heterocycle having 2 to 10 ring-forming carbon atoms.

9. The organic electroluminescence device of claim 1, wherein $X_3$ and $R_3$, and/or $X_4$ and $R_4$ are bonded to each other to form a ring containing an indole group.

10. The organic electroluminescence device of claim 1, wherein the emission layer comprises at least one among the polycyclic compounds represented in Compound Group 1:
[Compound Group 1]
1
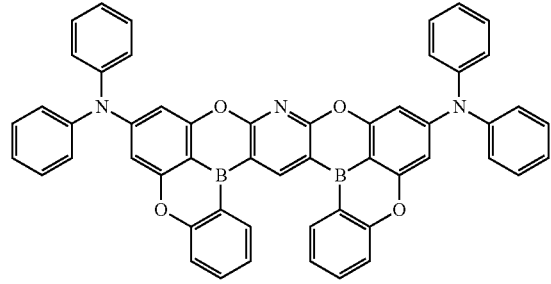
2
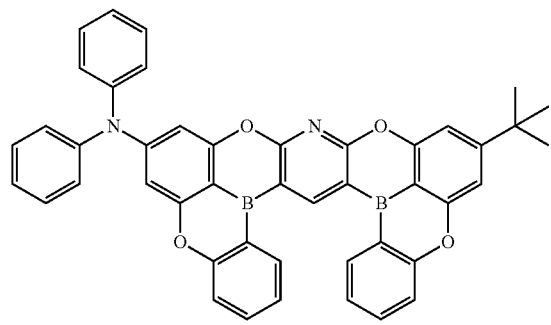
3
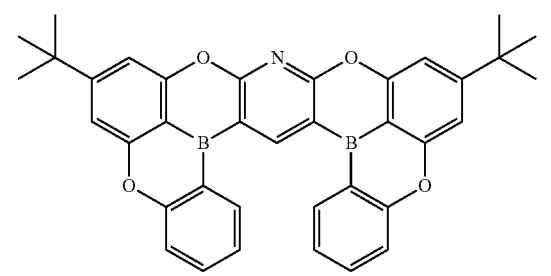
4
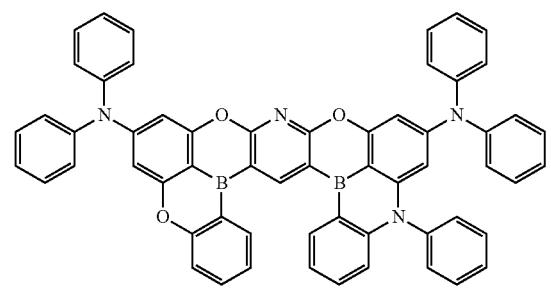
-continued
5
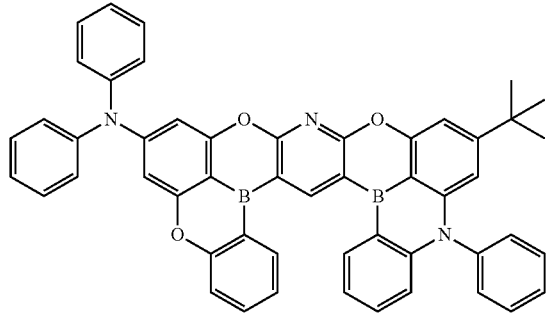
6
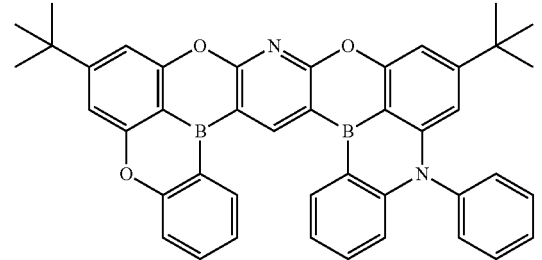
7
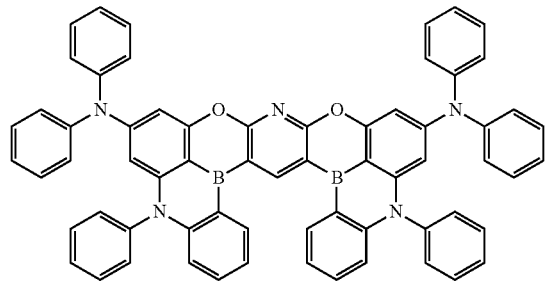
8
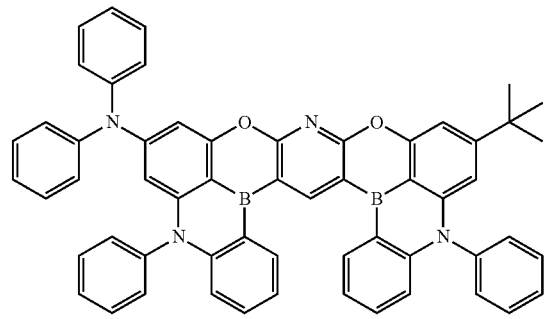
9
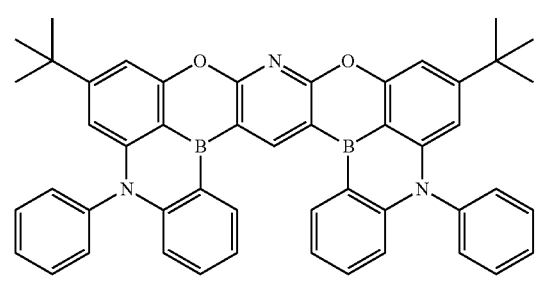

10
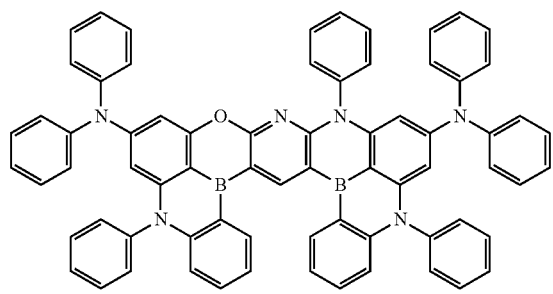
14
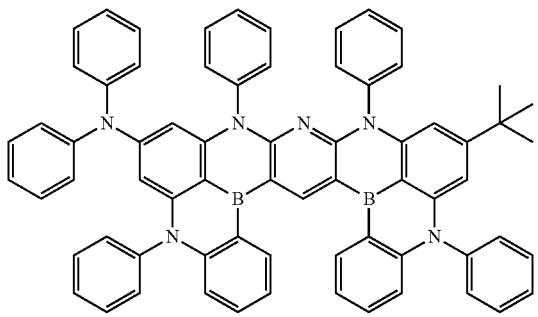
11
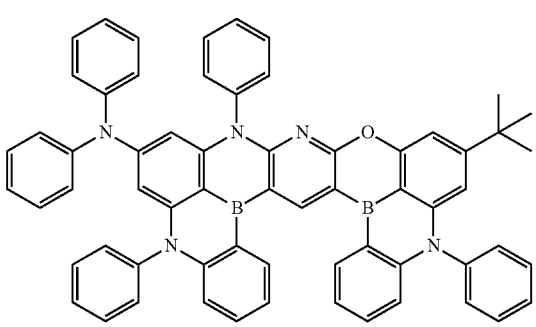
15
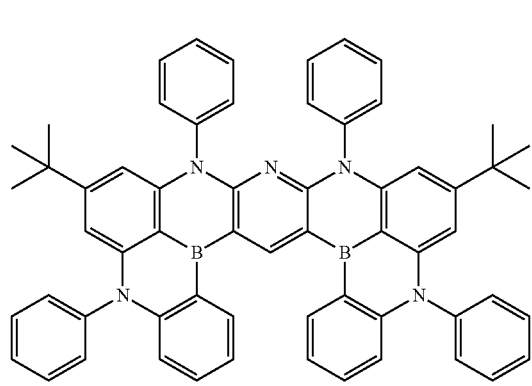
12
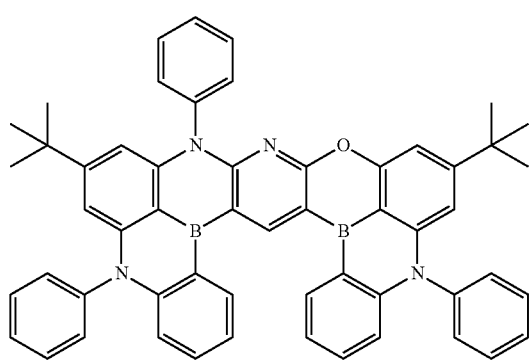
16
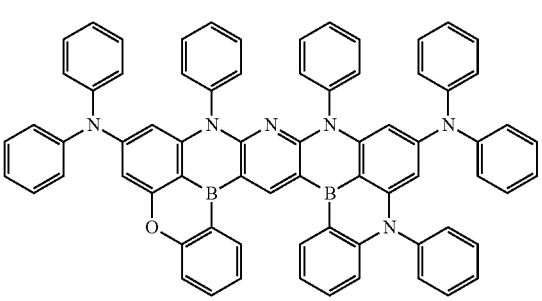
13
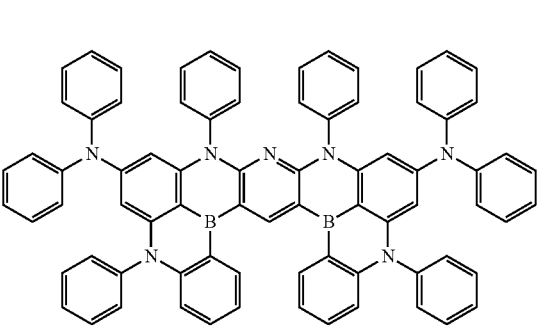
17
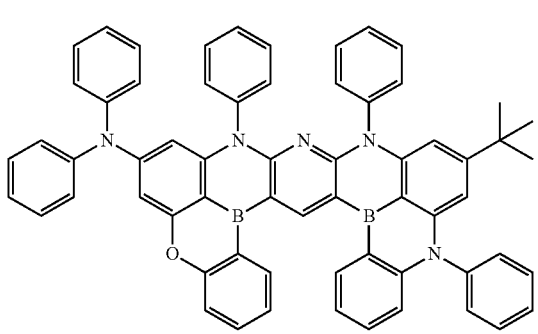

-continued
18
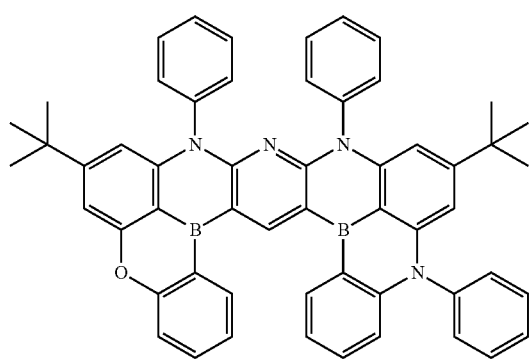
19
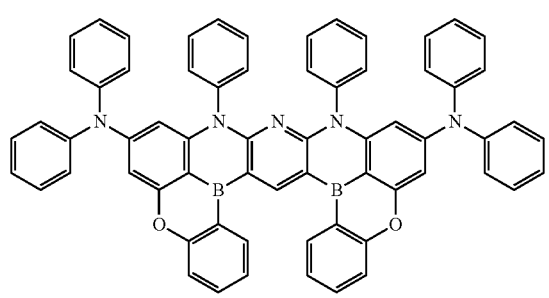
20
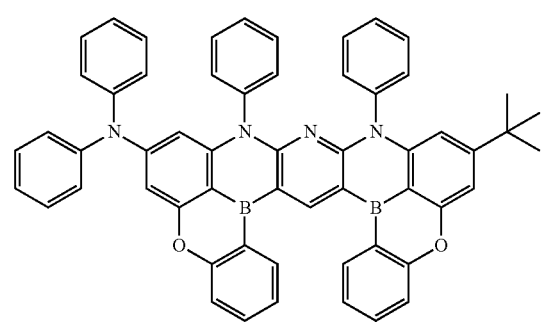
21
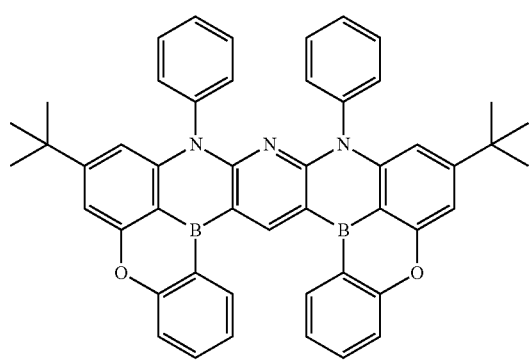
-continued
22
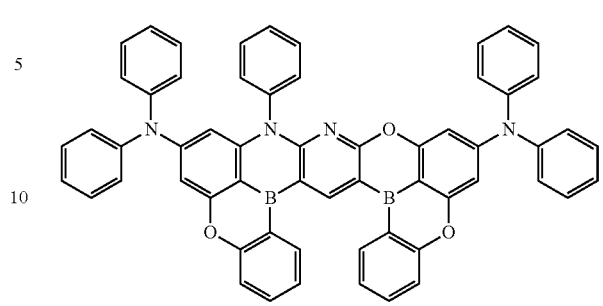
23
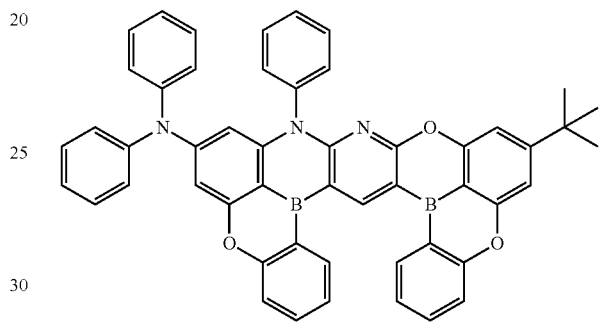
24
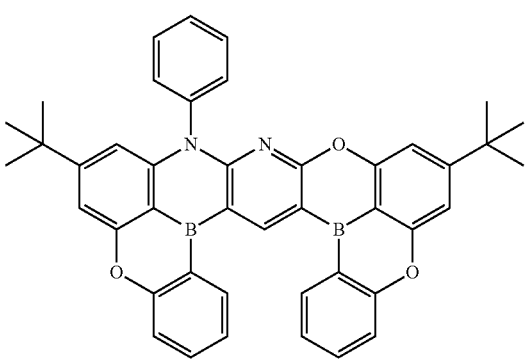
25
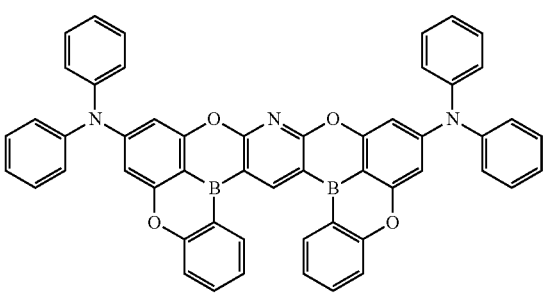

26
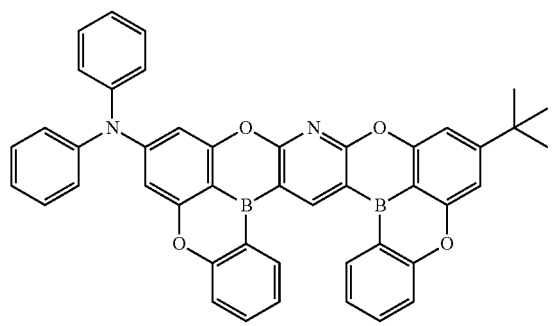
27
31
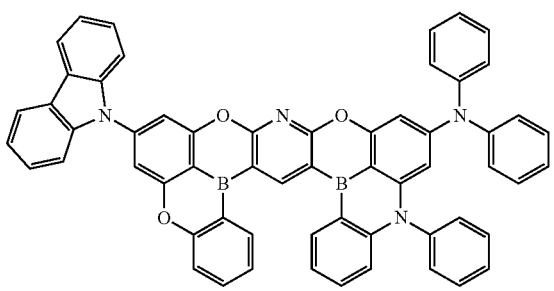
32
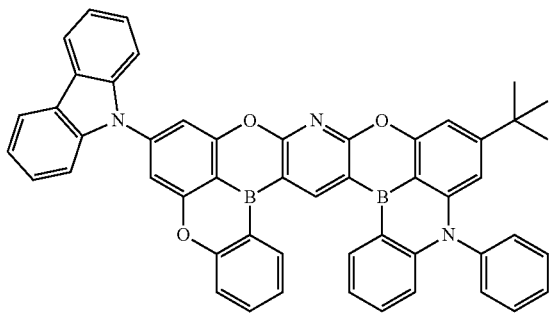
28
33
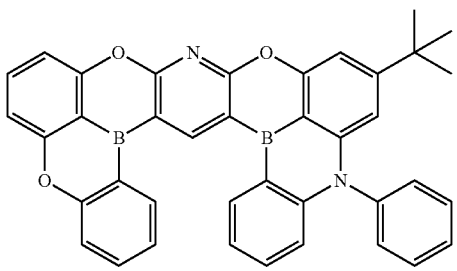
29
34
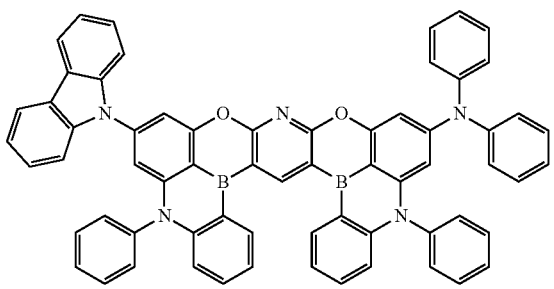
30
35
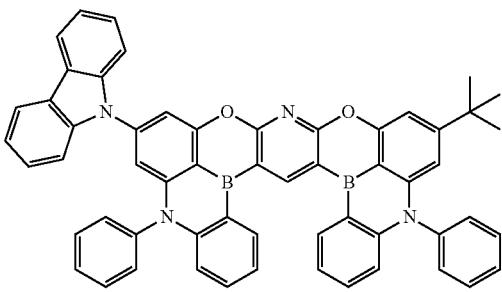

46
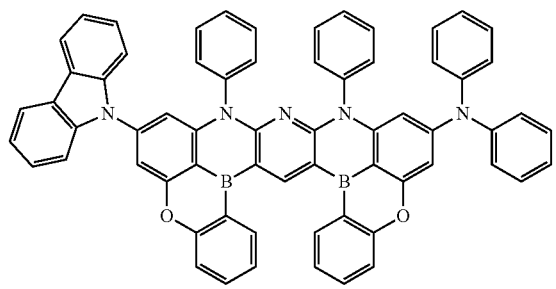
47
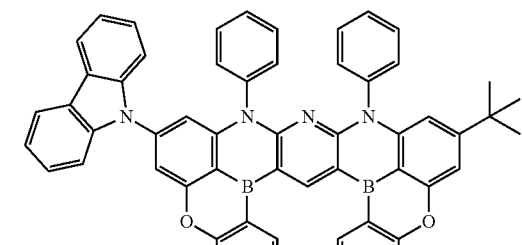
48
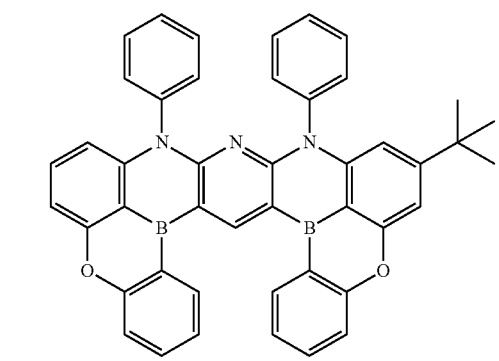
49
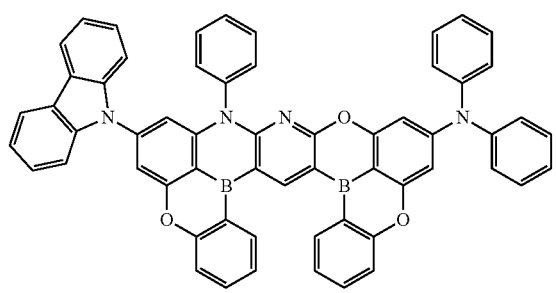
50
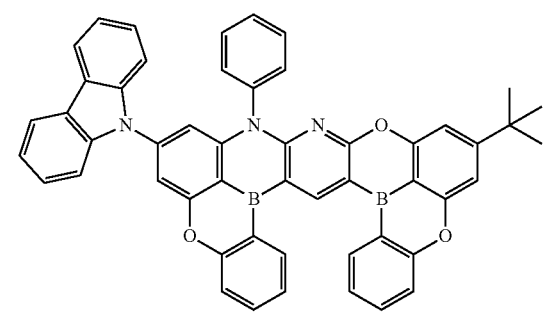
51
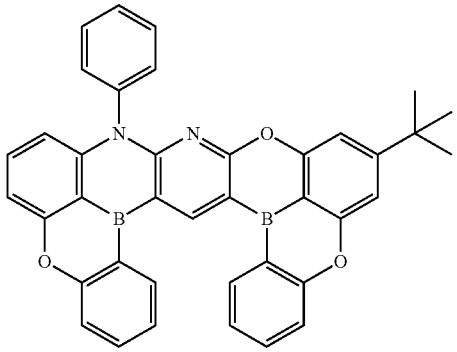
52
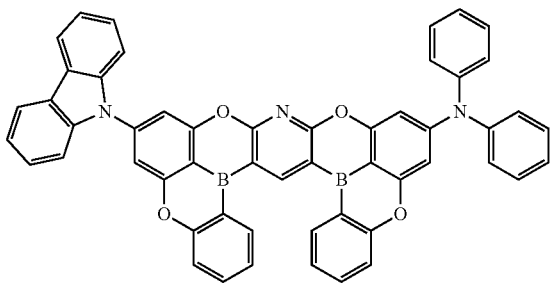
53
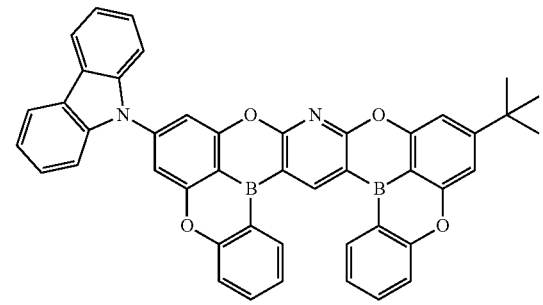
54
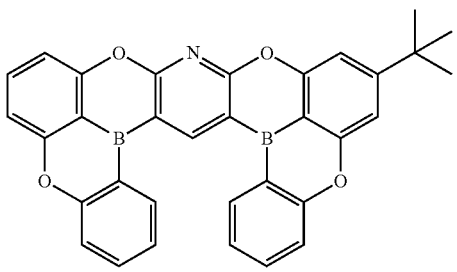

55
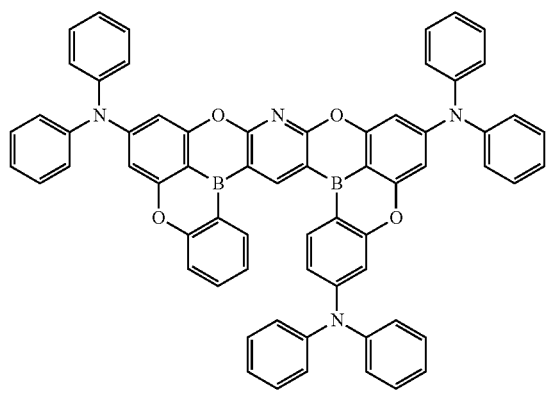
56
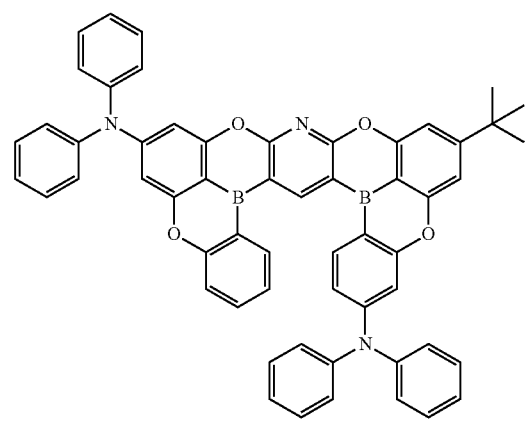
57
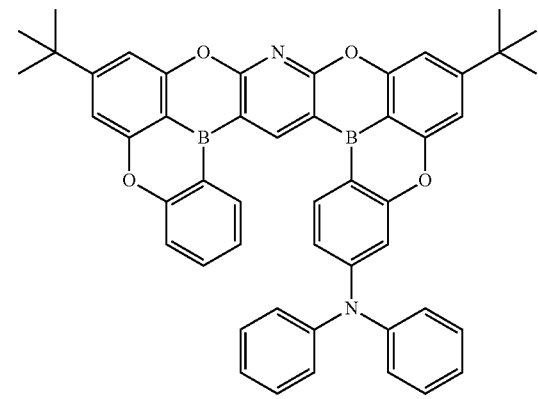
58
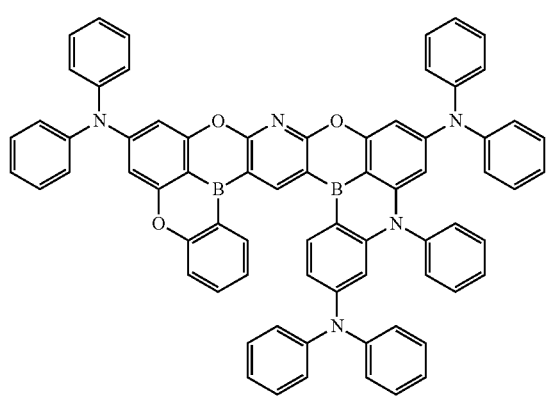
59
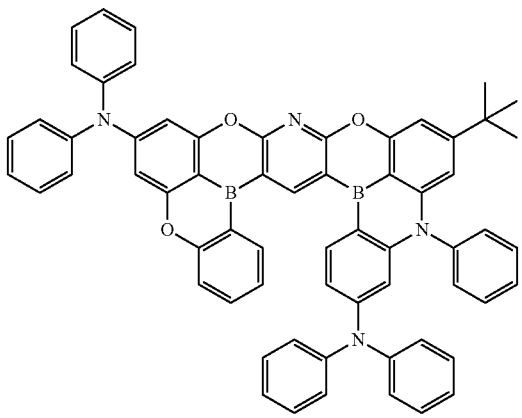
60
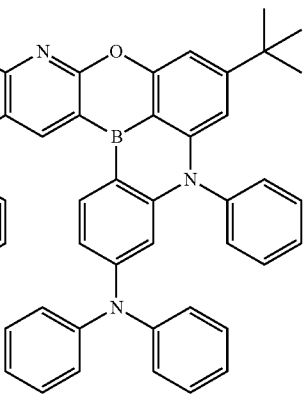
61
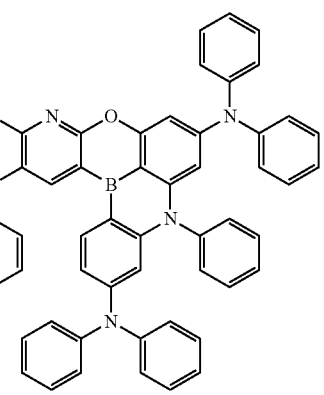
62
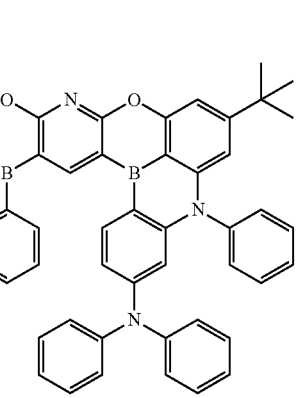

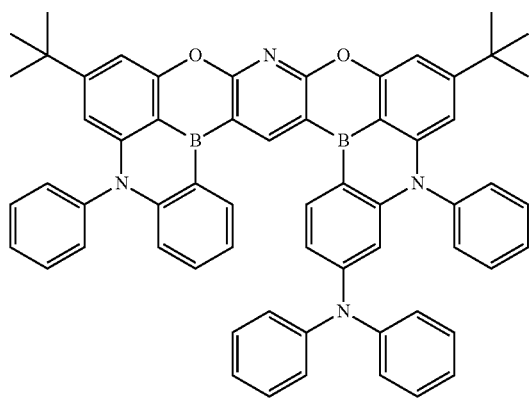
63
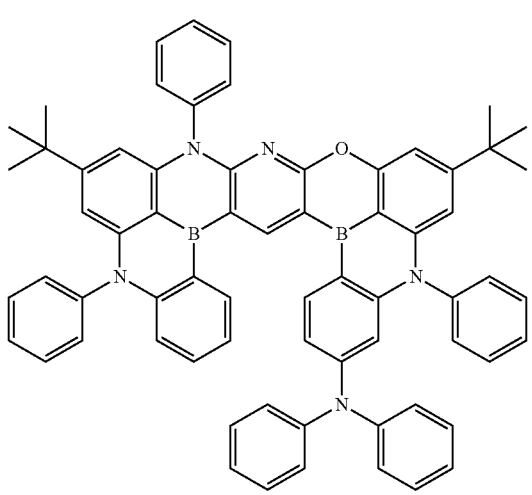
66
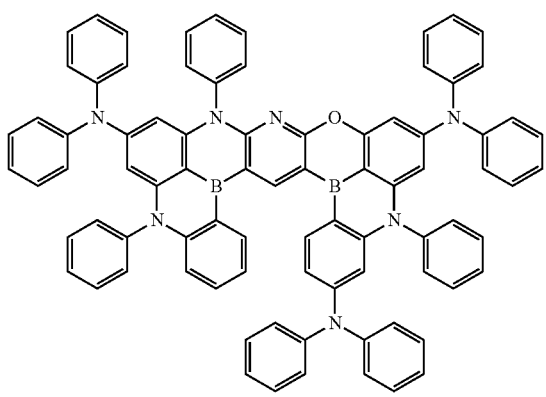
64
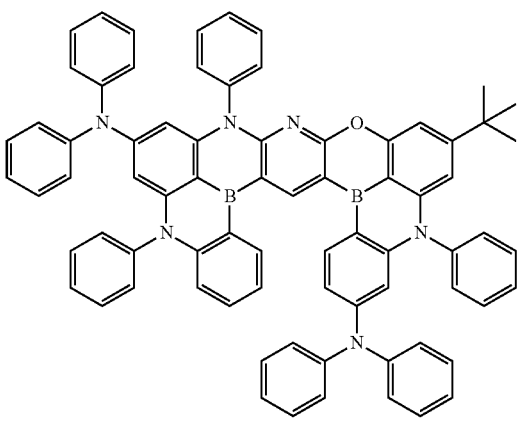
65
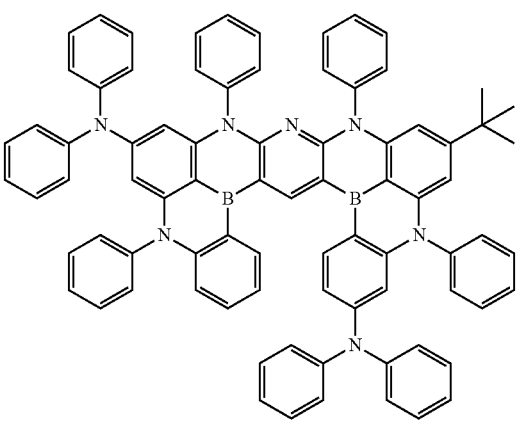
67
68

69
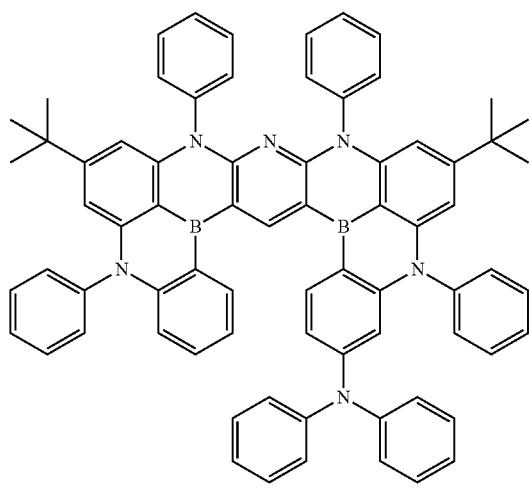
72
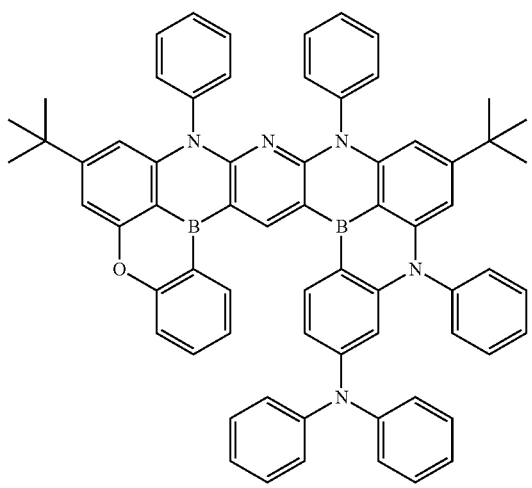
70
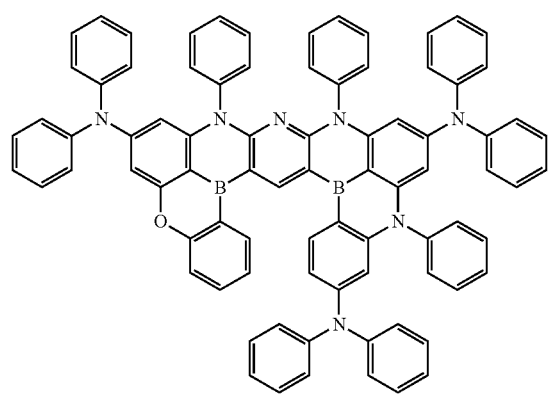
73
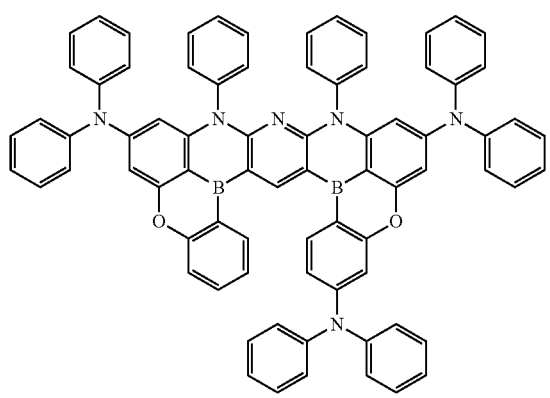
71
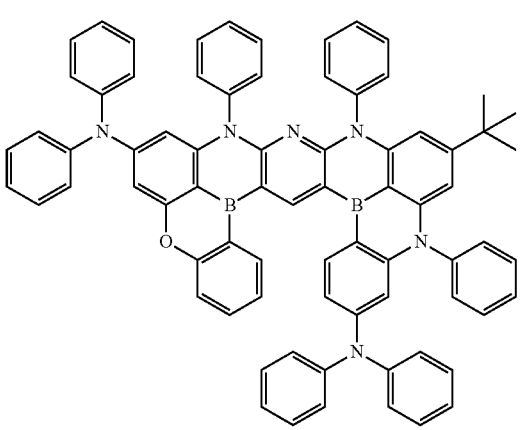
74
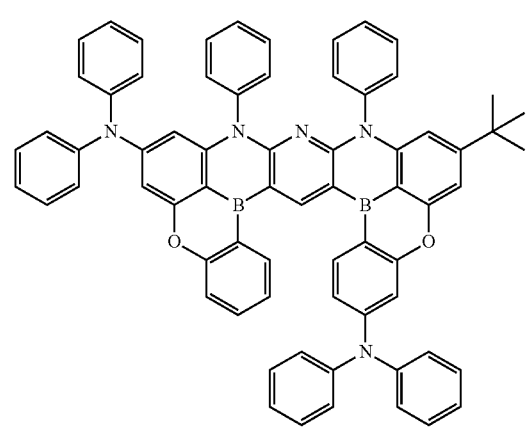

-continued
75
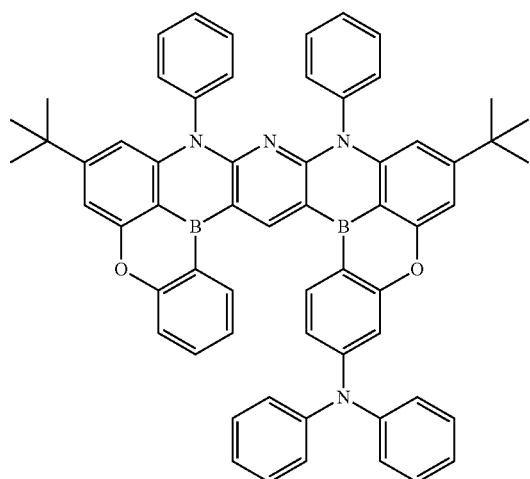
76
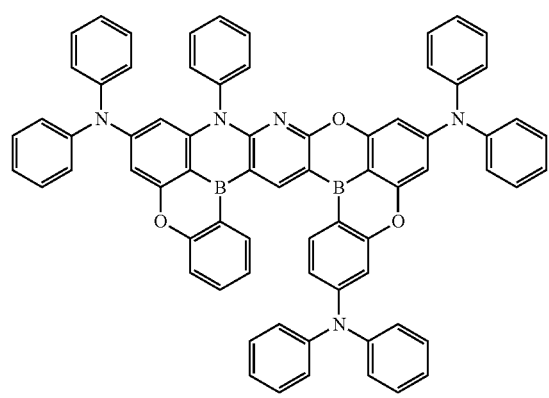
77
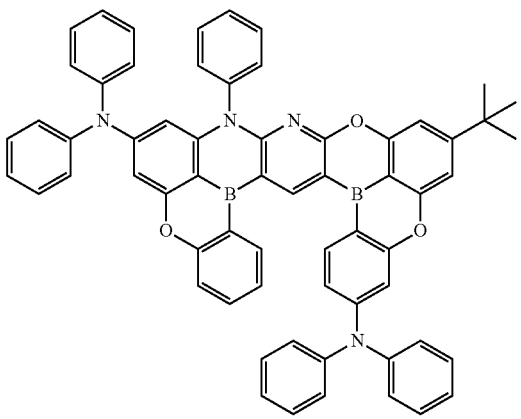
-continued
78
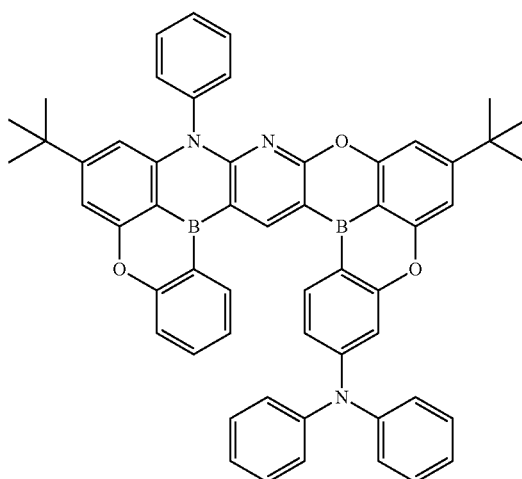
79
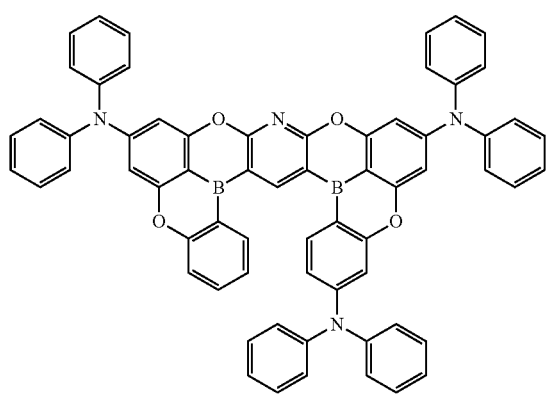
80
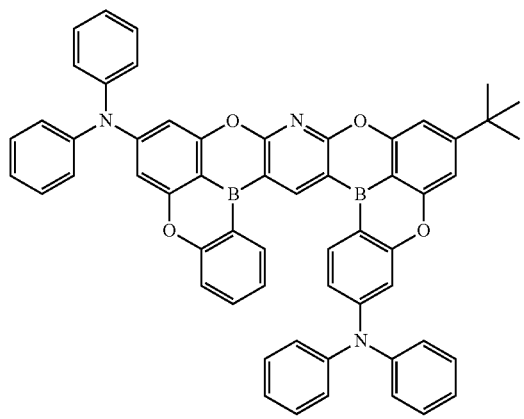

-continued
81
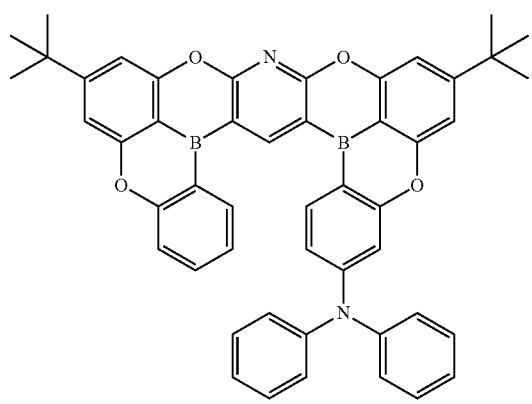
82
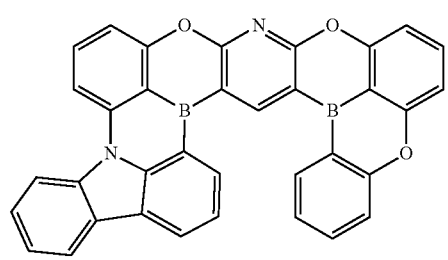
83
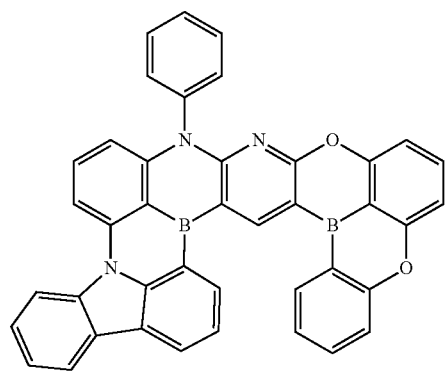
84
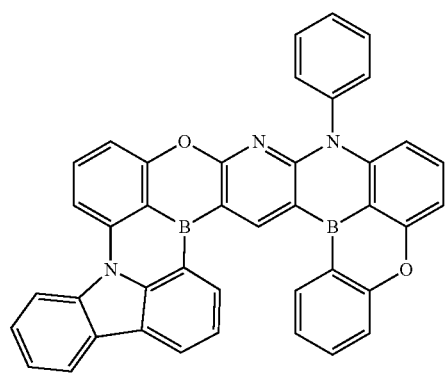
-continued
85
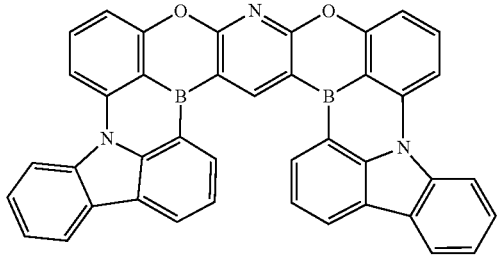
86
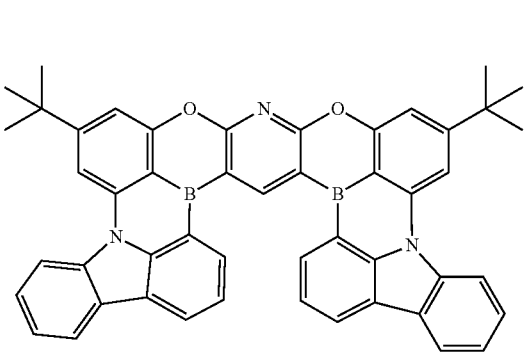
87
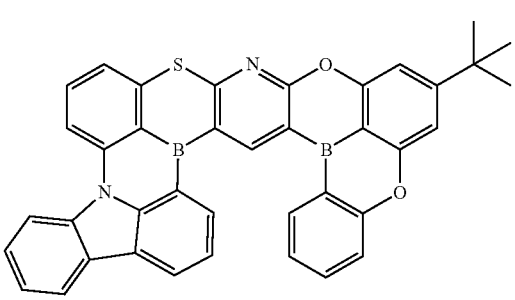
88
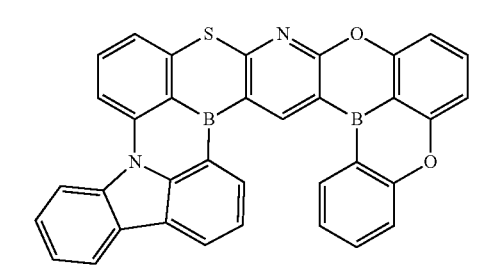
89
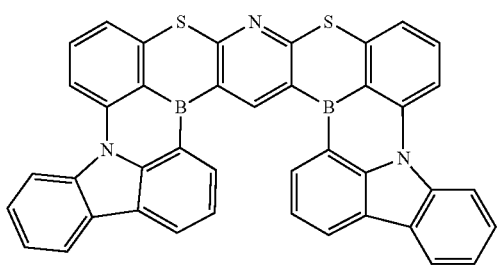

90

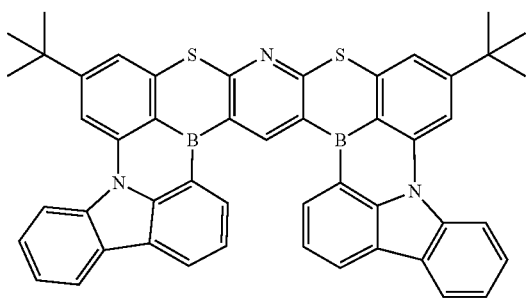

91

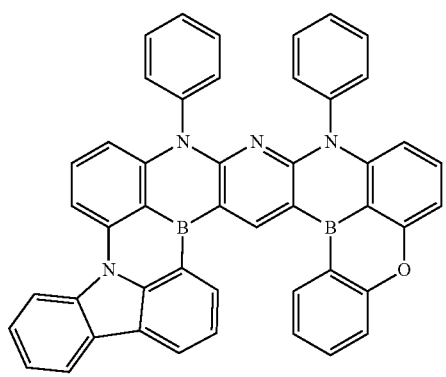

92

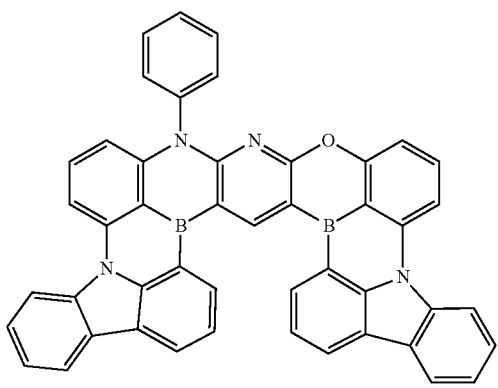

93

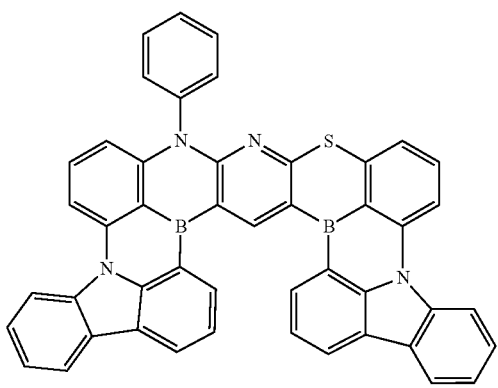

94

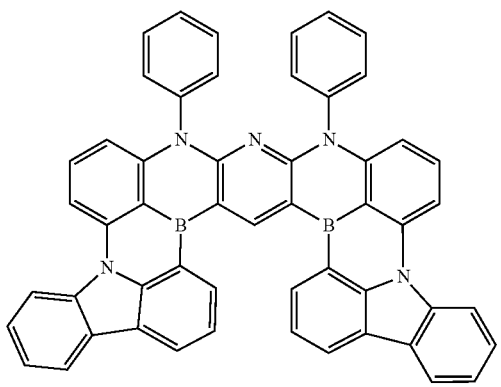

95

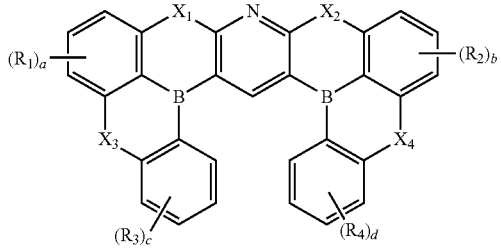

96

11. A polycyclic compound represented by Formula 1:

[Formula 1]

wherein in Formula 1,
$X_1$ to $X_4$ are each independently O, S, or $NR_a$,
a and b are each independently an integer of 0 to 3, and c and d are each independently an integer of 0 to 4, and
$R_1$ to $R_4$ and $R_a$ are each independently a hydrogen atom, a deuterium atom, a halogen atom, a cyano group, a substituted or unsubstituted silyl group, a substituted or unsubstituted amine group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, and/or are optionally combined with an adjacent group to form a ring.

12. The polycyclic compound of claim 11, wherein $R_1$ to $R_4$ are each independently a substituted or unsubstituted alkyl group having 1 to 10 carbon atoms, a substituted or unsubstituted arylamine group having 6 to 30 carbon atoms, or a substituted or unsubstituted heteroaryl group having 2 to 20 ring-forming carbon atoms.

13. The polycyclic compound of claim 11, wherein $R_a$ is a substituted or unsubstituted phenyl group.

14. The polycyclic compound of claim 11, wherein a to d are each independently 0 or 1.

15. The polycyclic compound of claim 11, wherein adjacent groups selected from among $R_1$ to $R_4$ and $R_a$ are bonded to each other to form a heterocycle having 2 to 10 ring-forming carbon atoms.

16. The polycyclic compound of claim 11, wherein $X_3$ and $R_3$, and/or $X_4$ and $R_4$ are bonded to each other to form an indole group.

17. The polycyclic compound of claim 11, wherein Formula 1 is represented by one of Formula 1-1 to Formula 1-5:

[Formula 1-1]

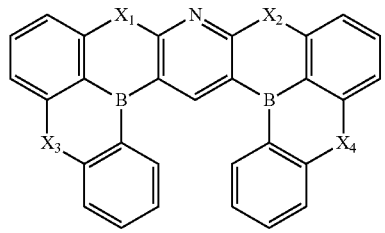

[Formula 1-2]

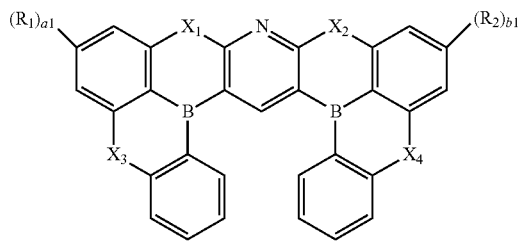

[Formula 1-3]

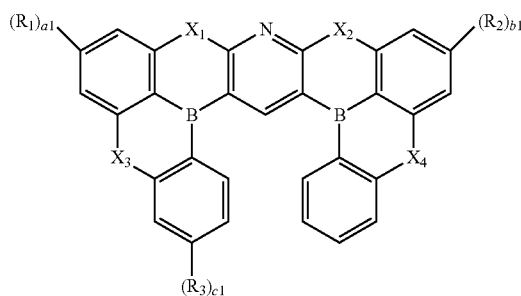

[Formula 1-4]

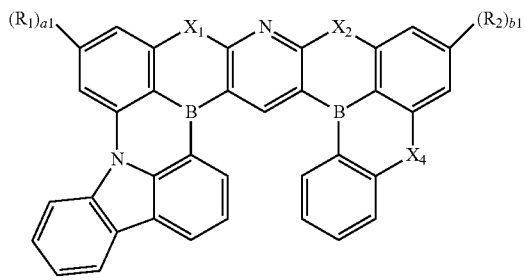

[Formula 1-5]

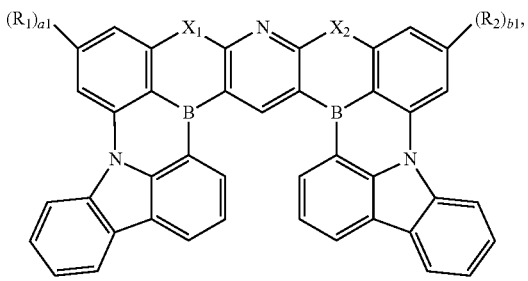

wherein in Formula 1-2 to Formula 1-5, a1, b1, and c1 are each independently 0 or 1, and wherein in Formula 1-1 to Formula, $X_1$ to $X_4$, $R_1$, $R_2$, and $R_3$ are each independently the same as defined in Formula 1.

18. The polycyclic compound of claim 11, wherein the polycyclic compound represented by Formula 1 is a blue dopant.

19. The polycyclic compound of claim 11, wherein the polycyclic compound represented by Formula 1 is a thermally activated delayed fluorescence emission material.

20. The polycyclic compound of claim 11, wherein the compound represented by Formula 1 is represented by at least one of the compounds of Compound Group 1:

[Compound Group 1]

1

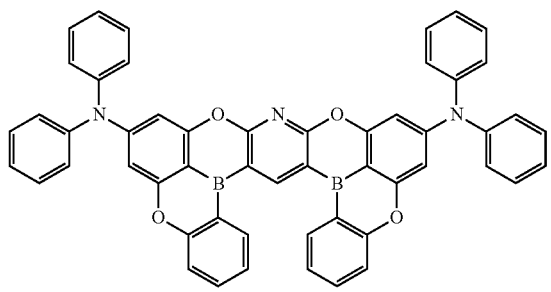

2
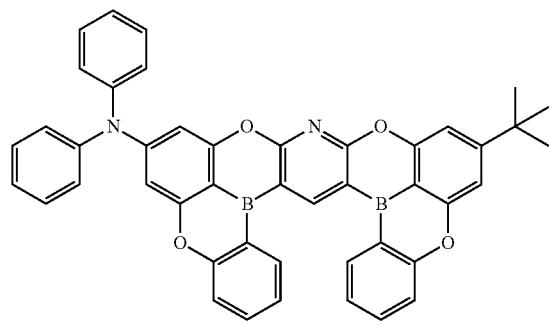
3
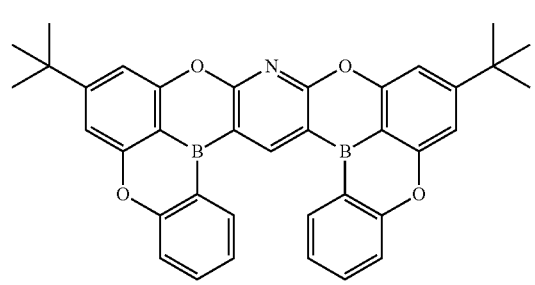
4
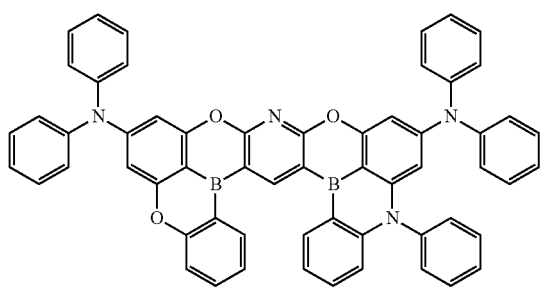
5
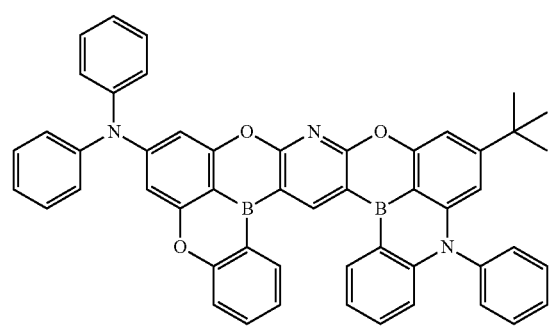
6
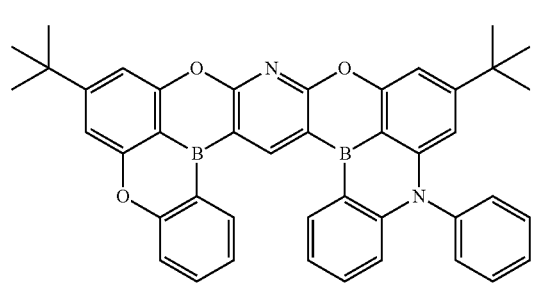
7
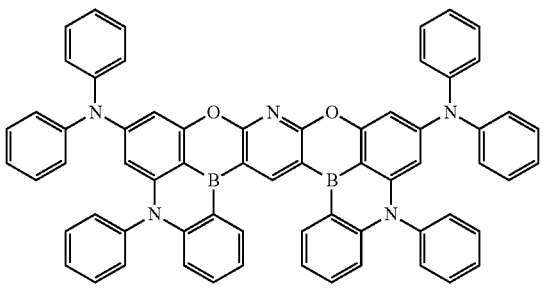
8
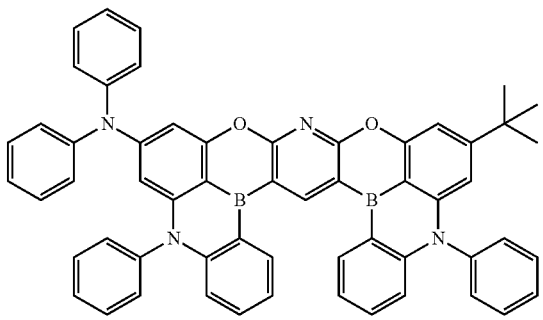
9
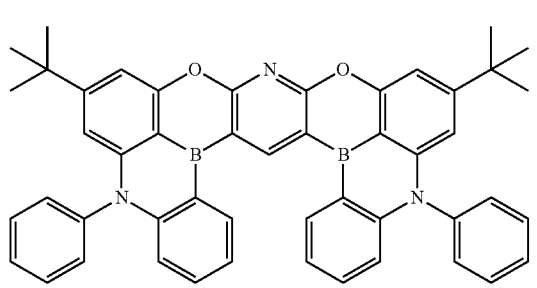
10
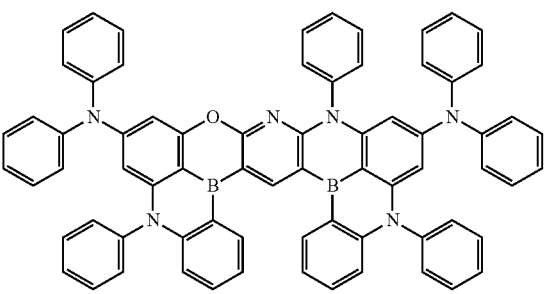
11
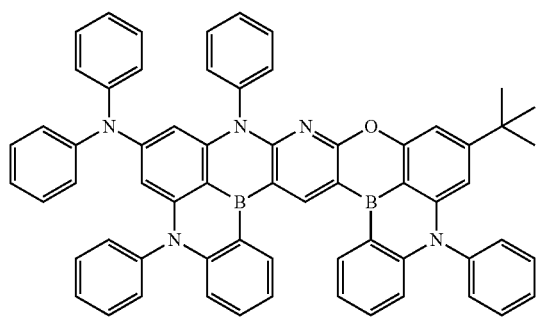

12
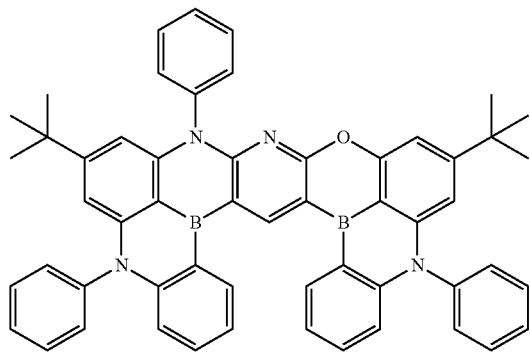
13
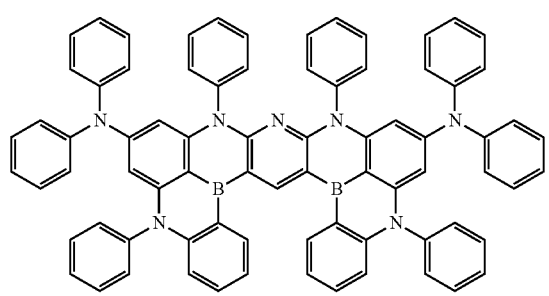
14
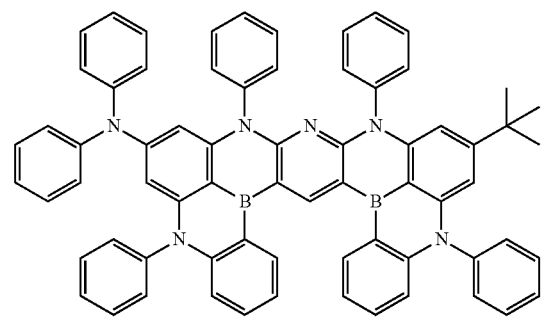
15
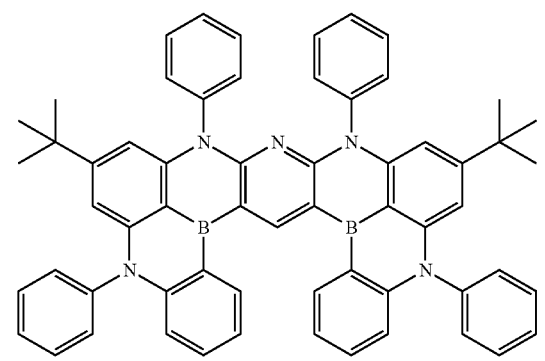
16
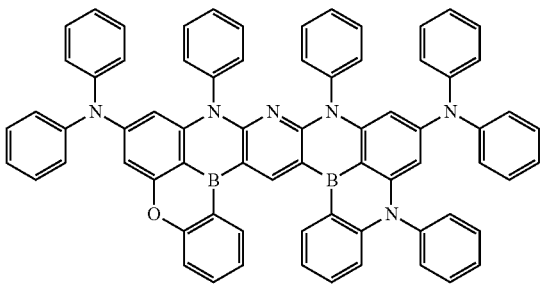
17
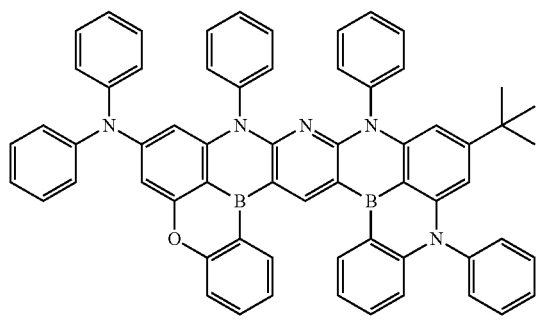
18
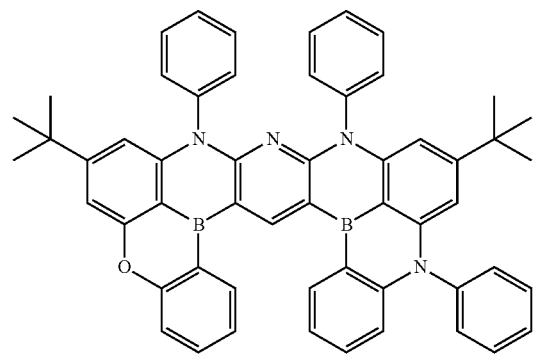
19
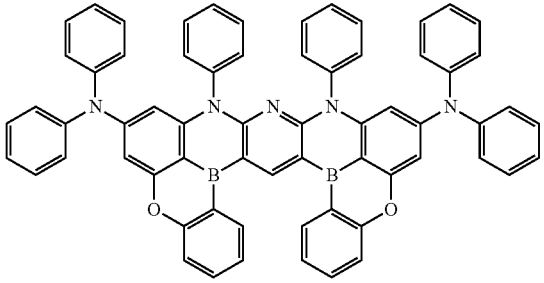

20
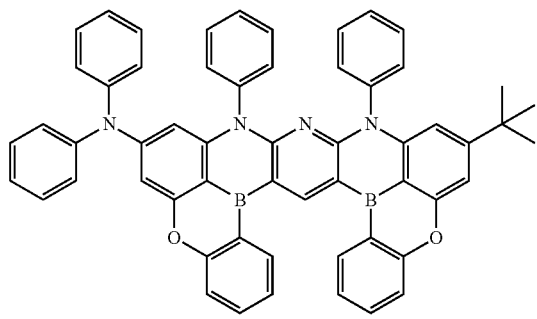
21
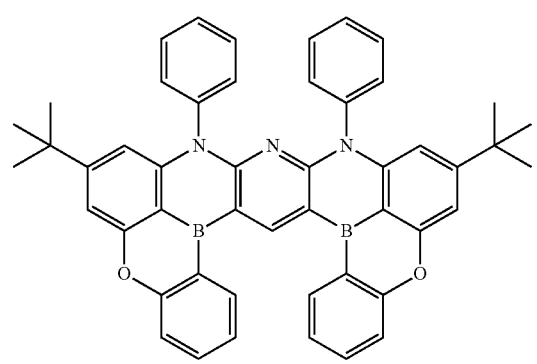
22
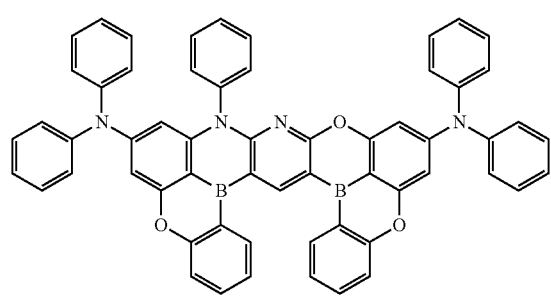
23
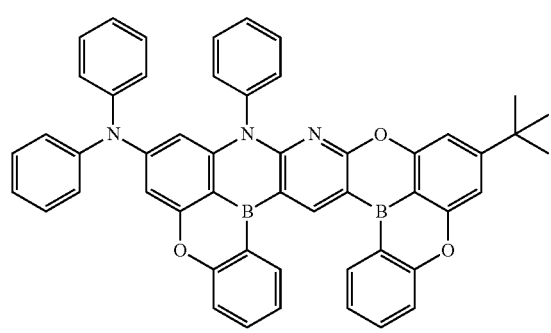
24
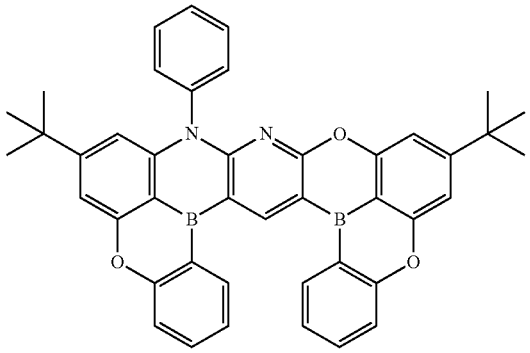
25
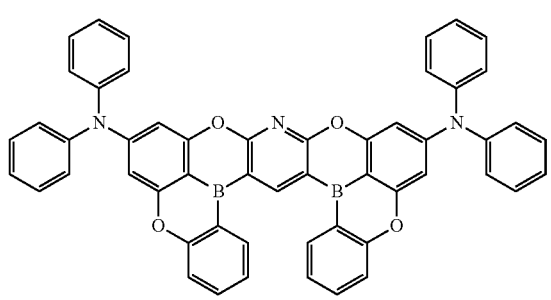
26
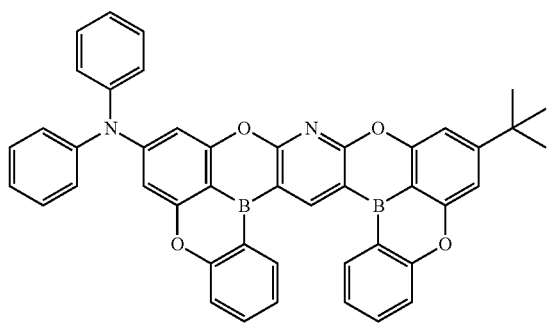
27
28
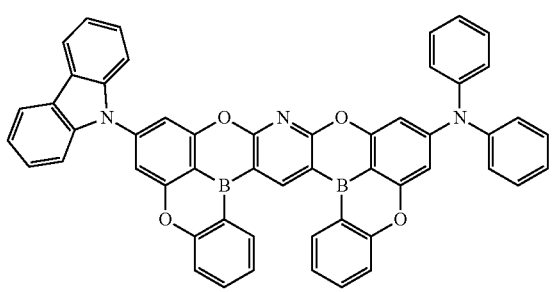

29
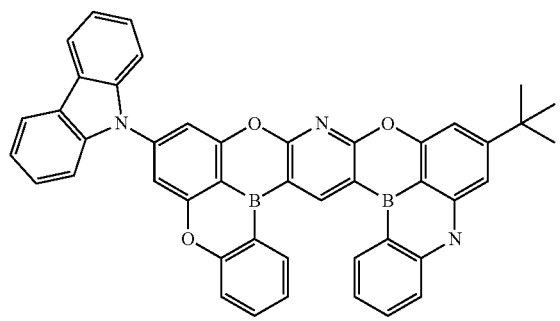
30
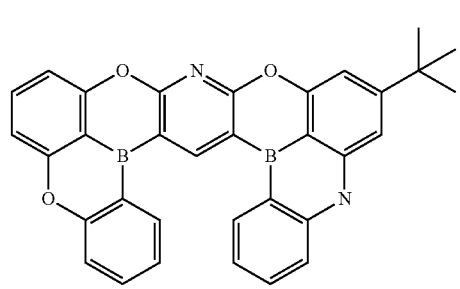
31
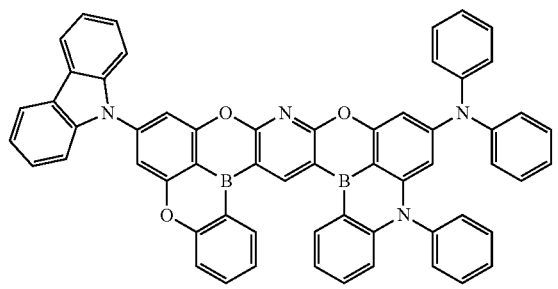
32
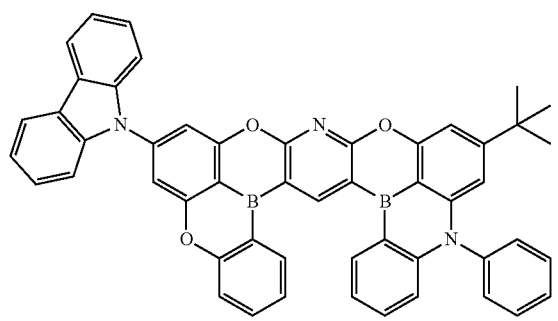
33
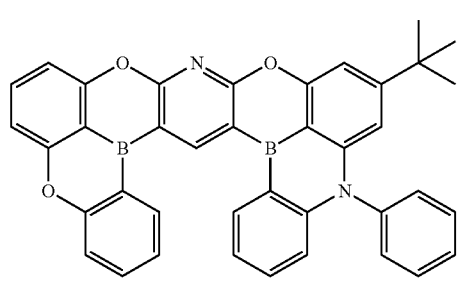
34
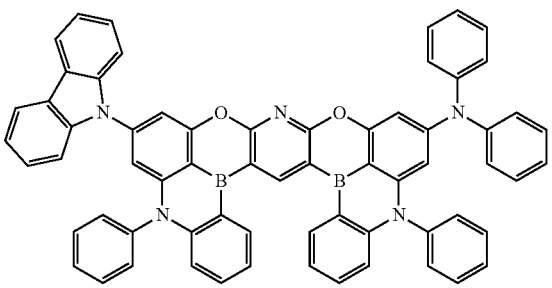
35
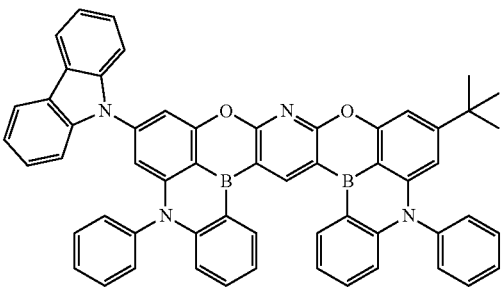
36
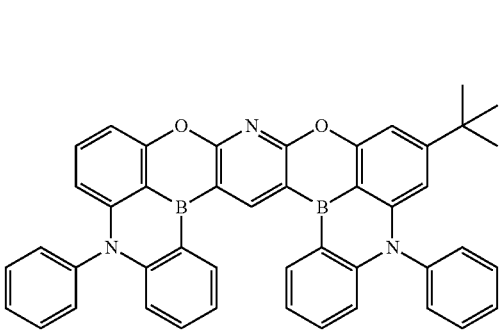
37
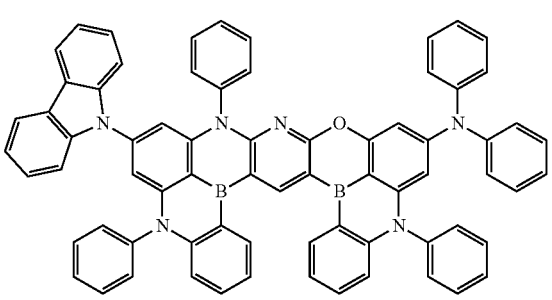
38
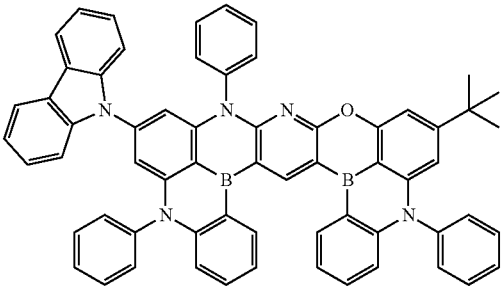

39
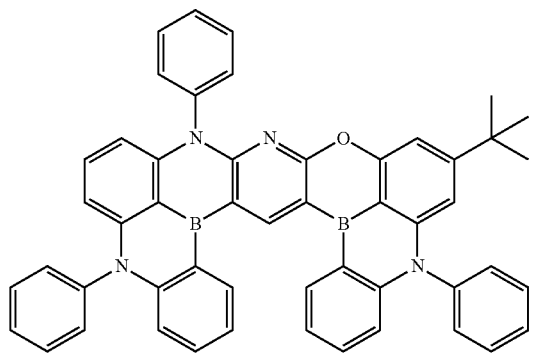
40
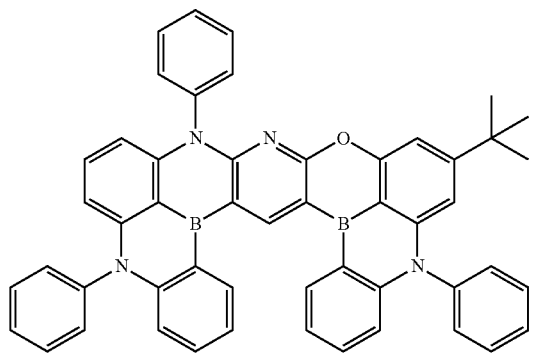
41
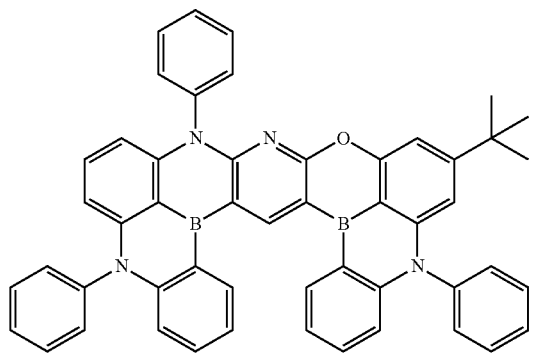
42
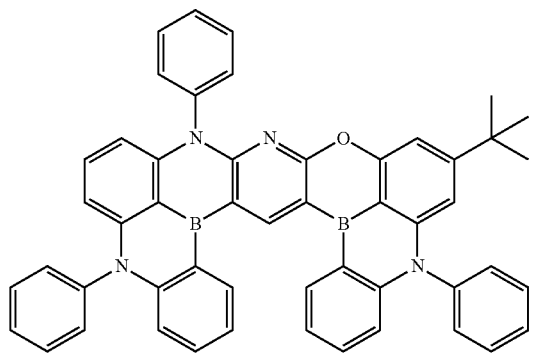
43
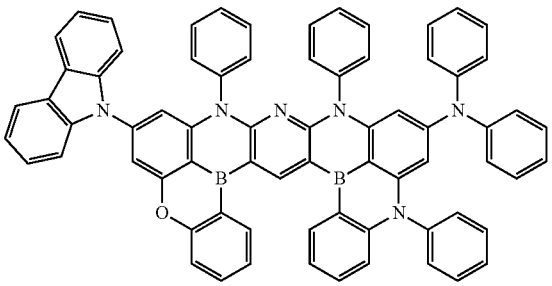
44
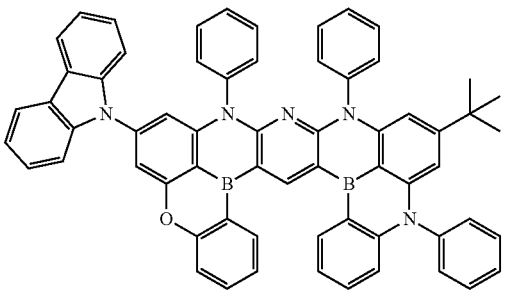
45
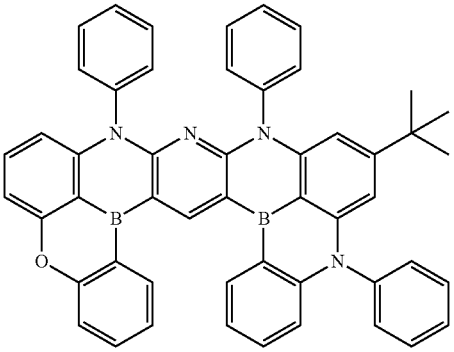
46
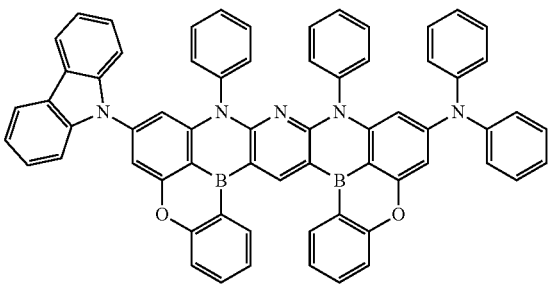
47
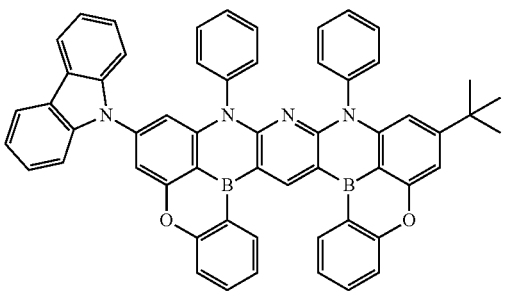

48
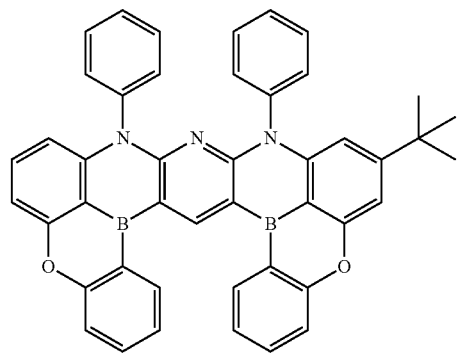
49
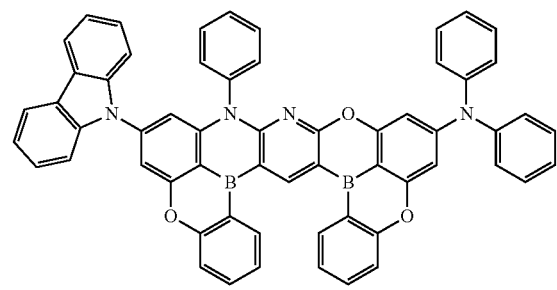
50
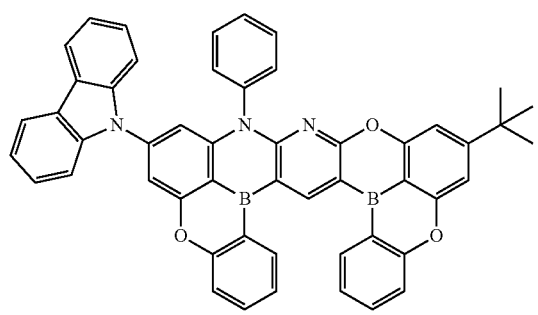
51
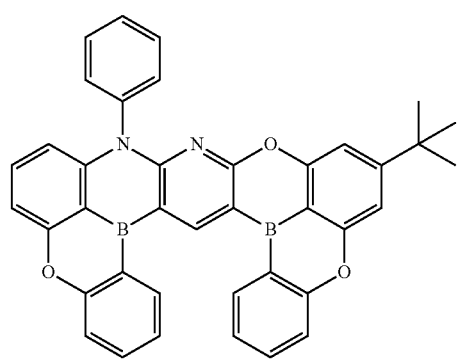
52
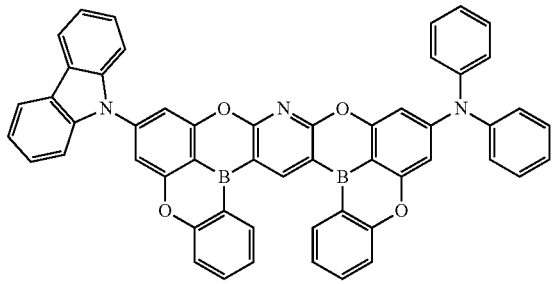
53
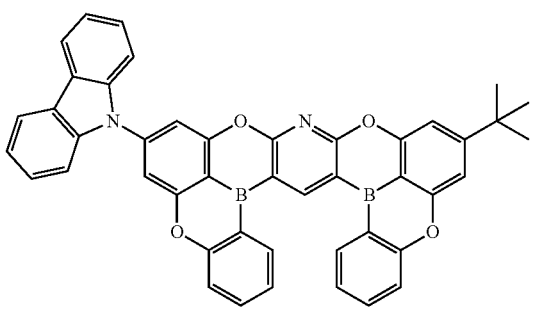
54
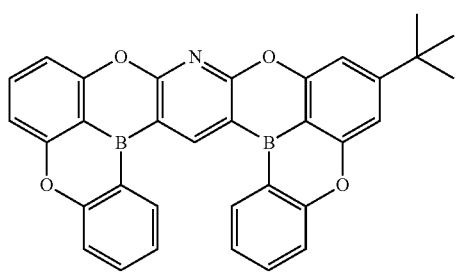
55
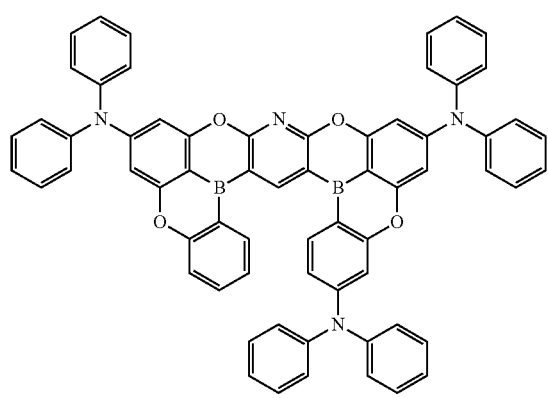

105
-continued
56
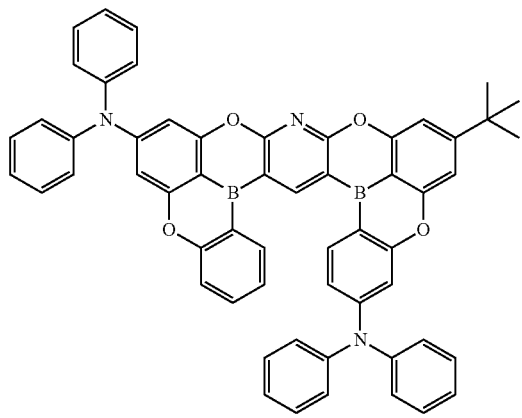
57
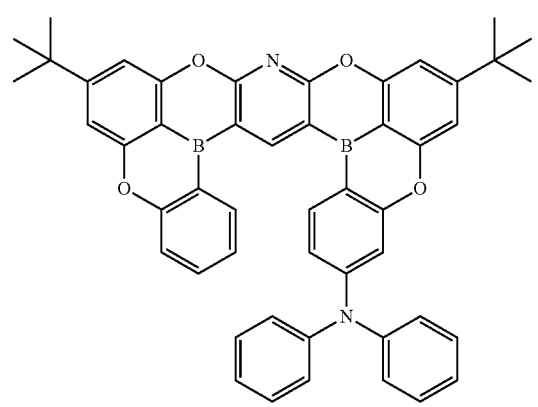
58
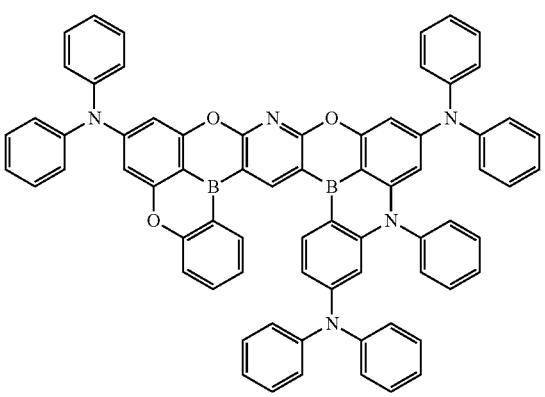
59
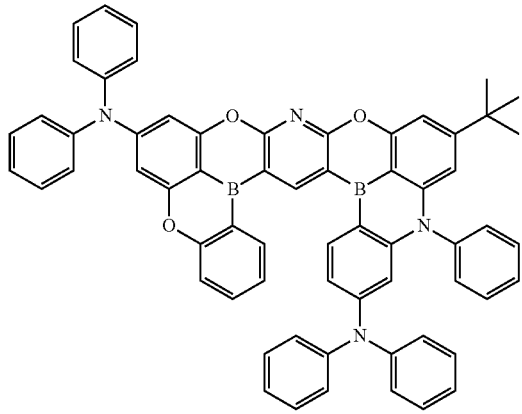
106
-continued
60
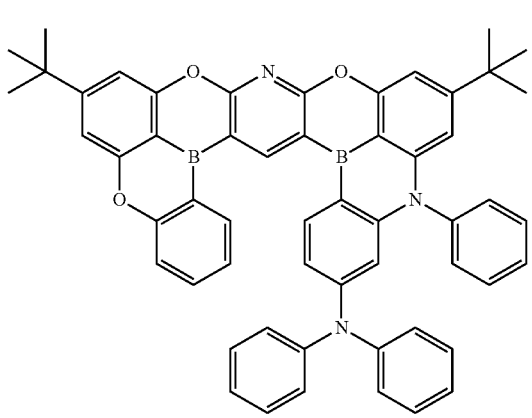
61
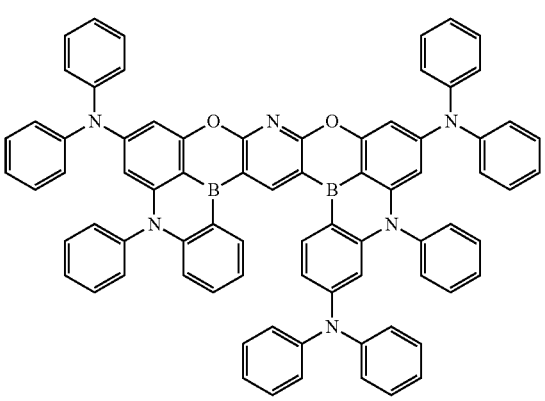
62
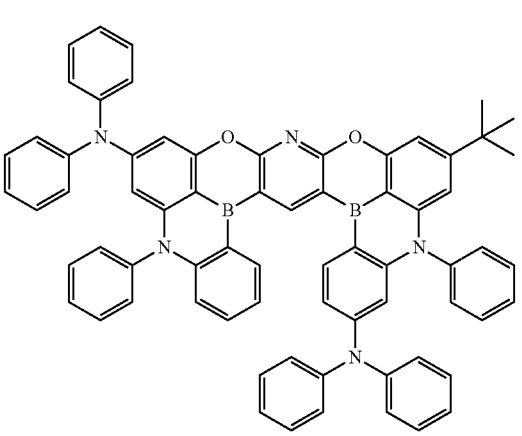
63
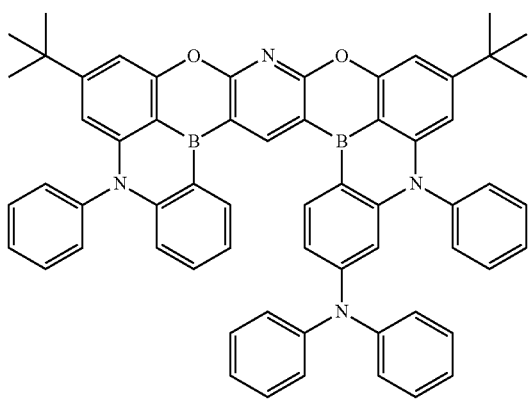

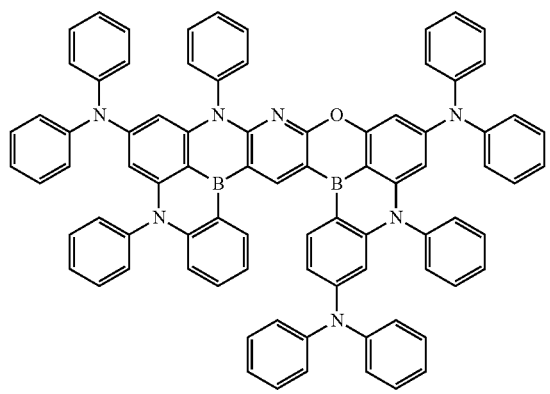
64
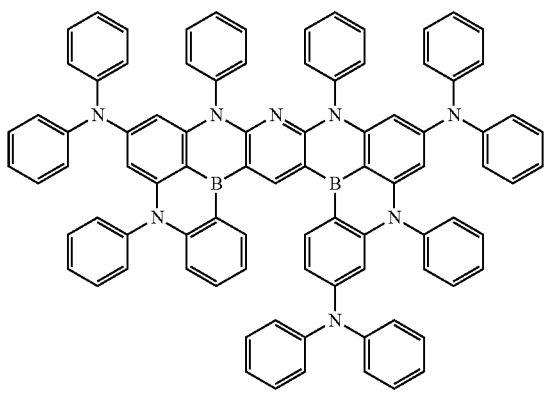
67
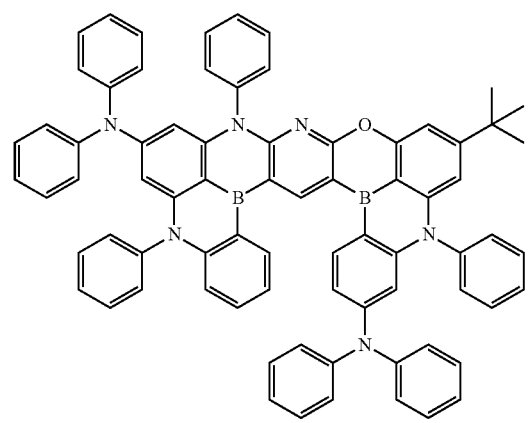
65
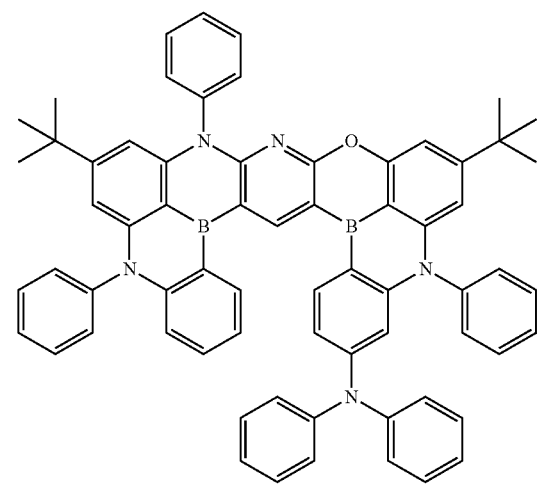
66
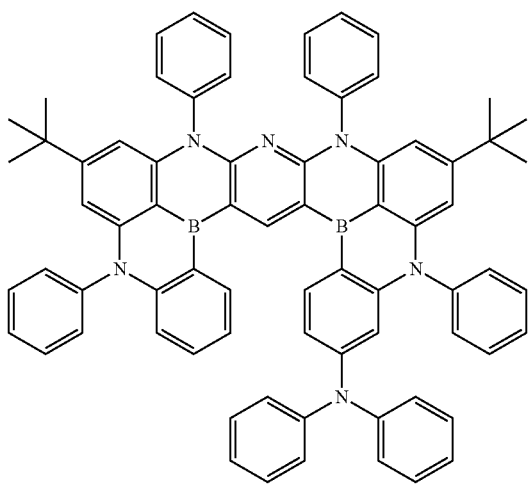
68
69

109
-continued
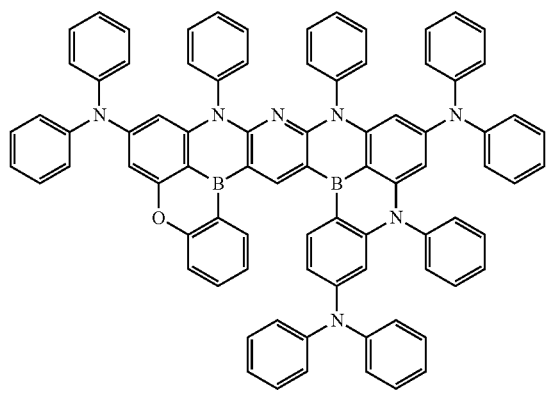
70
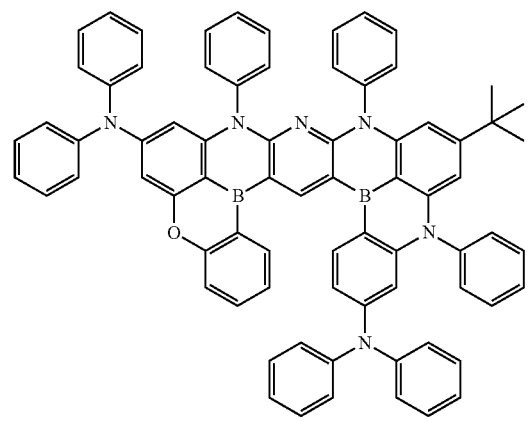
71
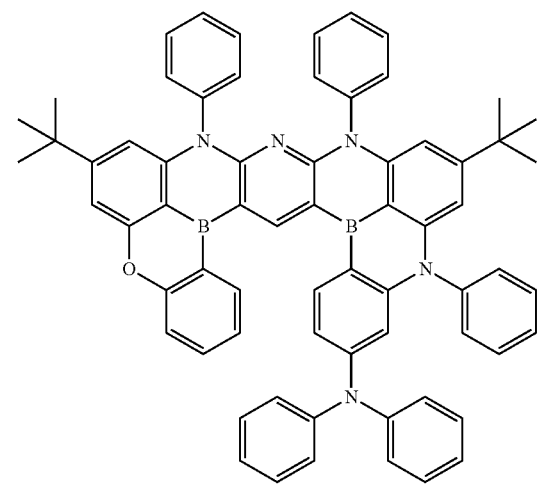
72
110
-continued
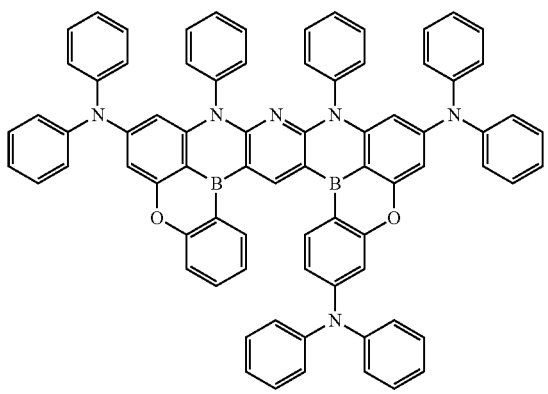
73
74
75
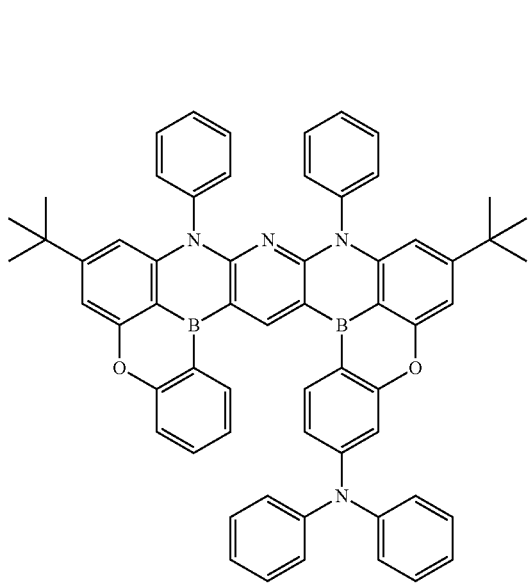

76
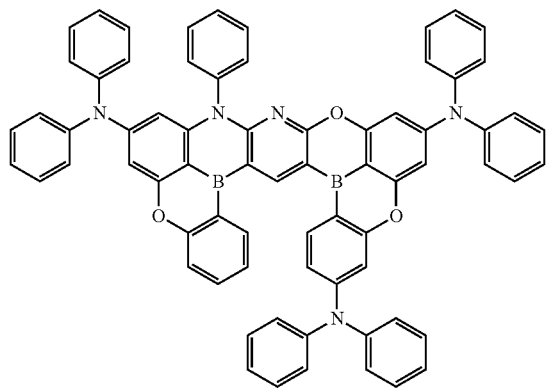
77
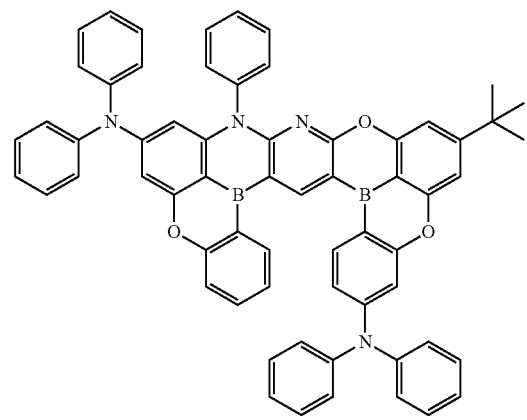
78
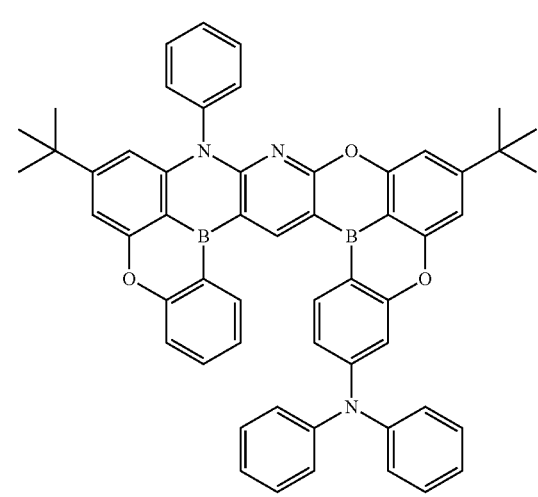
79
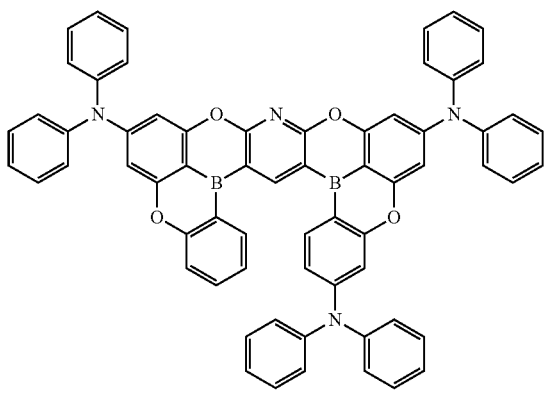
80
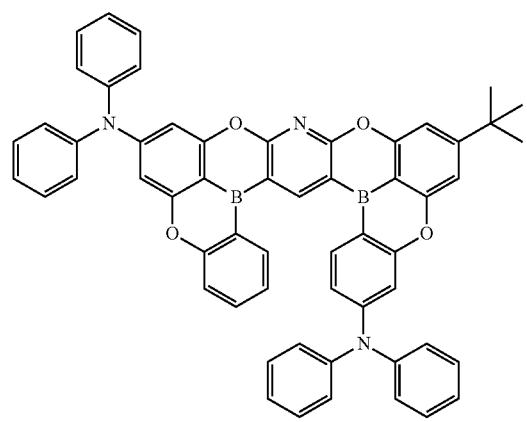
81
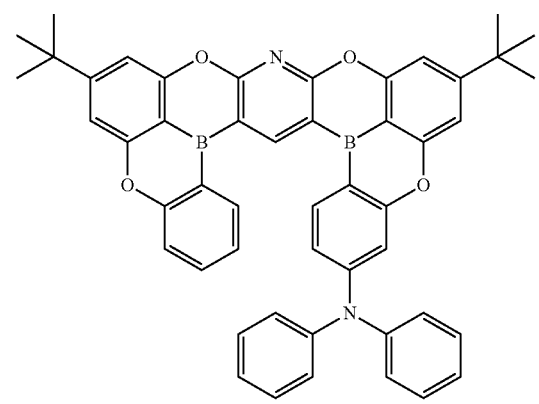
82
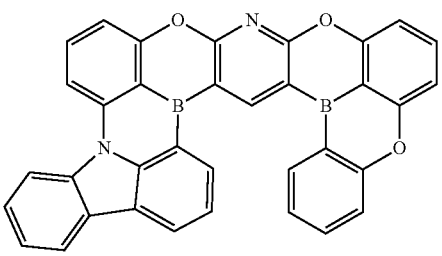

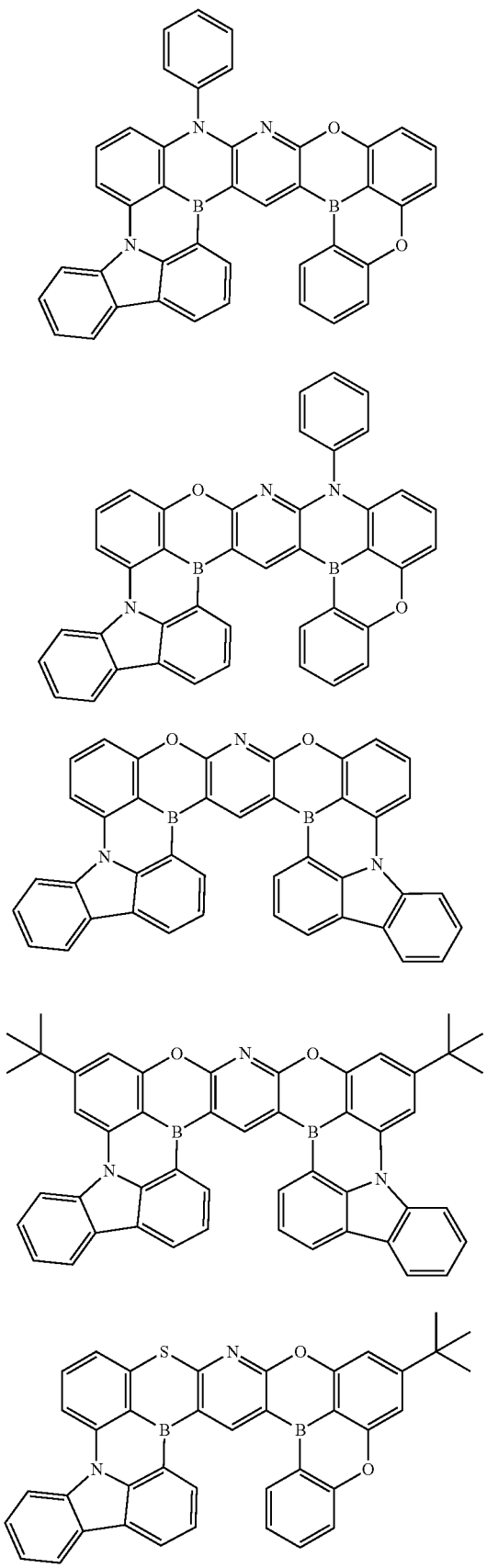
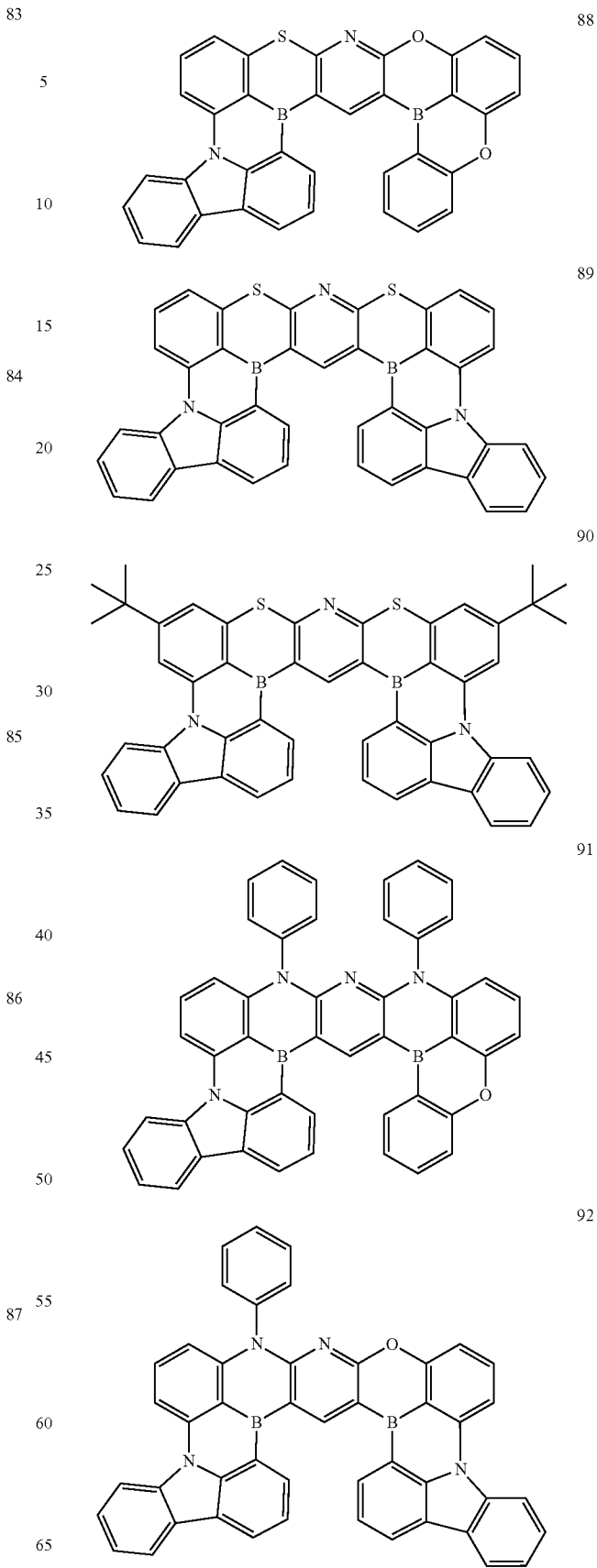

115
-continued
93
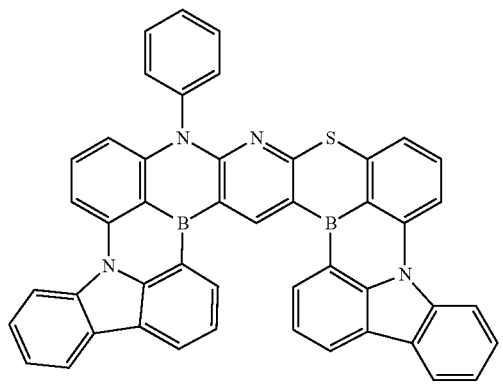
94
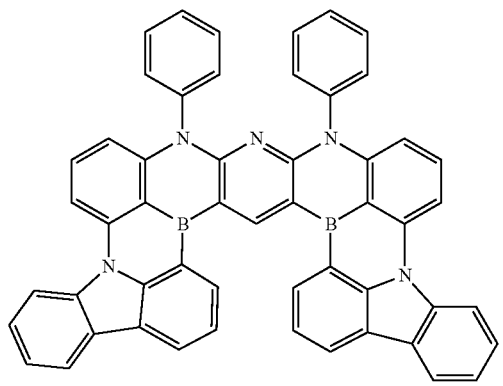
116
-continued
95
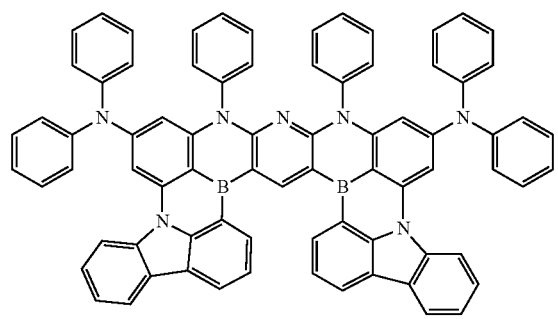
96
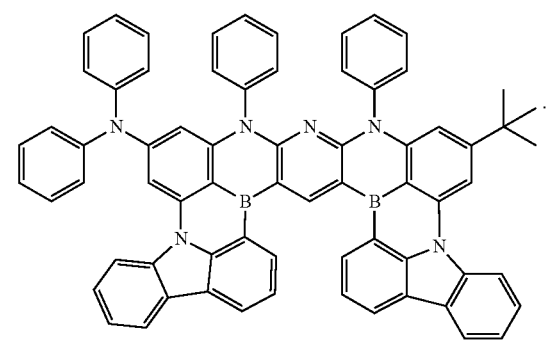
* * * * *